(12) United States Patent
Gaikwad

(10) Patent No.: US 8,194,808 B2
(45) Date of Patent: Jun. 5, 2012

(54) CARRIER SELECTION FOR MULTIPLE ANTENNAS

(75) Inventor: Rohit V. Gaikwad, San Diego, CA (US)

(73) Assignee: Broadcom Corporation, Irvine, CA (US)

( * ) Notice: Subject to any disclaimer, the term of this patent is extended or adjusted under 35 U.S.C. 154(b) by 908 days.

(21) Appl. No.: 12/213,172

(22) Filed: Jun. 16, 2008

(65) Prior Publication Data

US 2008/0310557 A1    Dec. 18, 2008

Related U.S. Application Data

(60) Provisional application No. 60/929,154, filed on Jun. 15, 2007, provisional application No. 60/929,155, filed on Jun. 15, 2007, provisional application No. 60/929,156, filed on Jun. 15, 2007, provisional application No. 60/960,706, filed on Oct. 10, 2007.

(51) Int. Cl.
*H04B 7/10* (2006.01)
(52) U.S. Cl. ........ 375/347; 375/260; 375/267; 375/316; 375/346; 375/349
(58) Field of Classification Search ................ 375/260, 375/267, 316, 346, 347, 349
See application file for complete search history.

(56) References Cited

U.S. PATENT DOCUMENTS

| 5,454,010 | A | 9/1995 | Leveque |
| 5,477,504 | A | 12/1995 | Hagerty |
| 5,740,526 | A * | 4/1998 | Bonta et al. ................ 455/277.2 |
| 5,822,373 | A | 10/1998 | Addy |
| 6,307,883 | B1 | 10/2001 | Kanada et al. |
| 6,587,513 | B1 | 7/2003 | Ichihara |
| 6,862,315 | B1 | 3/2005 | Garg et al. |
| 7,035,345 | B2 | 4/2006 | Jeckeln et al. |
| 7,095,994 | B1 | 8/2006 | Aytur et al. |
| 7,161,987 | B2 | 1/2007 | Webster et al. |
| 7,177,374 | B2 | 2/2007 | Gaikwad et al. |
| 7,183,847 | B2 | 2/2007 | Suzuki et al. |
| 7,233,773 | B2 | 6/2007 | Hansen et al. |

(Continued)

FOREIGN PATENT DOCUMENTS

CN    1647404    7/2005

(Continued)

OTHER PUBLICATIONS

Intensi-fi Product Brief: Draft-802.11n Product Family, Broadcom Corporation Intensi-fi-PB03-R, Jun. 27, 2008, 2 pages.

(Continued)

*Primary Examiner* — Siu Lee
(74) *Attorney, Agent, or Firm* — Sterne, Kessler, Goldstein & Fox P.L.L.C.

(57) ABSTRACT

A method and apparatus is disclosed to process a received single stream communication signal and/or a multiple stream communication. A communications receiver is configured to receive the received communication signal. A communications receiver determines whether the received communication signal includes a single stream communication signal or a multiple stream communication signal. The communications receiver determines whether a received communication signal complies with a known single stream communications standard. The communications receiver determines whether the received communication signal complies with a known multiple stream communications standard. The communications receiver decodes the received communication signal according to the known single stream communications standard upon determining the received communication includes the signal single stream communication signal. The communications receiver decodes the received communication signal according to the known multiple stream communications standard upon determining the received communication includes the multiple stream communication signal.

40 Claims, 25 Drawing Sheets

U.S. PATENT DOCUMENTS

| | | | |
|---|---|---|---|
| 7,259,630 B2 | 8/2007 | Bachman et al. | |
| 7,269,430 B2 | 9/2007 | Moorti et al. | |
| 7,279,972 B2 | 10/2007 | Smithson | |
| 7,321,264 B2 | 1/2008 | Kokkeler | |
| 7,340,265 B2 | 3/2008 | Husted et al. | |
| 7,386,063 B1 * | 6/2008 | Husted | 375/316 |
| 7,403,573 B2 | 7/2008 | DeBruyn et al. | |
| 7,414,470 B2 | 8/2008 | Okazaki | |
| 7,450,533 B2 | 11/2008 | Aoki et al. | |
| 7,480,234 B1 * | 1/2009 | Hart et al. | 370/208 |
| 7,483,802 B2 | 1/2009 | Wood | |
| 7,577,413 B2 | 8/2009 | He et al. | |
| 7,620,373 B2 | 11/2009 | Cole et al. | |
| 7,646,876 B2 | 1/2010 | Chu et al. | |
| 7,822,406 B2 | 10/2010 | Lee et al. | |
| 7,881,390 B2 | 2/2011 | Sadowsky et al. | |
| 7,881,402 B2 | 2/2011 | Gao et al. | |
| 7,890,061 B2 | 2/2011 | Kasher et al. | |
| 2003/0203743 A1 | 10/2003 | Sugar et al. | |
| 2004/0121753 A1 | 6/2004 | Sugar et al. | |
| 2004/0264600 A1 | 12/2004 | Kao et al. | |
| 2005/0064892 A1 | 3/2005 | Cavin | |
| 2005/0113120 A1 | 5/2005 | Rappaport et al. | |
| 2005/0117660 A1 | 6/2005 | Vialle et al. | |
| 2005/0243942 A1 | 11/2005 | Sawai | |
| 2006/0084402 A1 | 4/2006 | Oshima et al. | |
| 2006/0146869 A1 | 7/2006 | Zhang et al. | |
| 2006/0182074 A1 | 8/2006 | Kubler et al. | |
| 2006/0182168 A1 | 8/2006 | Wang et al. | |
| 2006/0198477 A1 | 9/2006 | Moorti et al. | |
| 2006/0223483 A1 | 10/2006 | Behazd | |
| 2006/0229029 A1 | 10/2006 | Waltho et al. | |
| 2006/0285478 A1 | 12/2006 | Gaikwad et al. | |
| 2007/0002878 A1 | 1/2007 | Moorti et al. | |
| 2007/0002963 A1 | 1/2007 | Pedersen et al. | |
| 2007/0002981 A1 | 1/2007 | Gaikwad et al. | |
| 2007/0004372 A1 | 1/2007 | Adams et al. | |
| 2007/0019749 A1 | 1/2007 | Gaikwad et al. | |
| 2007/0019750 A1 | 1/2007 | Gaikwad et al. | |
| 2007/0060162 A1 | 3/2007 | Xhafa et al. | |
| 2007/0064842 A1 * | 3/2007 | Ross et al. | 375/343 |
| 2007/0105587 A1 | 5/2007 | Lu | |
| 2007/0110197 A1 | 5/2007 | Bagchi et al. | |
| 2007/0202749 A1 | 8/2007 | Bhat et al. | |
| 2007/0218851 A1 | 9/2007 | Soe et al. | |
| 2007/0224935 A1 * | 9/2007 | Waxman | 455/41.2 |
| 2007/0230328 A1 | 10/2007 | Saitou | |
| 2008/0013654 A1 | 1/2008 | Rick et al. | |
| 2008/0095260 A1 | 4/2008 | Vaidyanathan | |
| 2008/0101495 A1 | 5/2008 | Gaikwad | |
| 2008/0101496 A1 | 5/2008 | Gaikwad | |
| 2008/0101497 A1 | 5/2008 | Gaikwad et al. | |
| 2008/0118013 A1 | 5/2008 | Vis et al. | |
| 2008/0139156 A1 | 6/2008 | Behzad et al. | |
| 2008/0159442 A1 | 7/2008 | Tanabe et al. | |
| 2008/0293368 A1 | 11/2008 | Desai et al. | |
| 2008/0309405 A1 | 12/2008 | Young | |
| 2008/0310336 A1 | 12/2008 | Gaikwad | |
| 2008/0310487 A1 | 12/2008 | Hammerschmidt | |
| 2008/0310558 A1 | 12/2008 | Gaikwad | |
| 2008/0310559 A1 | 12/2008 | Gaikwad | |
| 2009/0325507 A1 | 12/2009 | Trachewsky et al. | |
| 2010/0137024 A1 | 6/2010 | Maguire | |
| 2010/0208852 A1 | 8/2010 | Feher | |

FOREIGN PATENT DOCUMENTS

| | | |
|---|---|---|
| WO | WO/03/090370 | 10/2003 |

OTHER PUBLICATIONS

IEEE Standard 802.11 a-1999, part 11, IEEE, 1999, pp. 1-90.

English Language Abstract and Bibliographic Information for Chinese Patent Application Publication No. CN 1647404, Published on Jul. 27, 2005, 1 page.

* cited by examiner

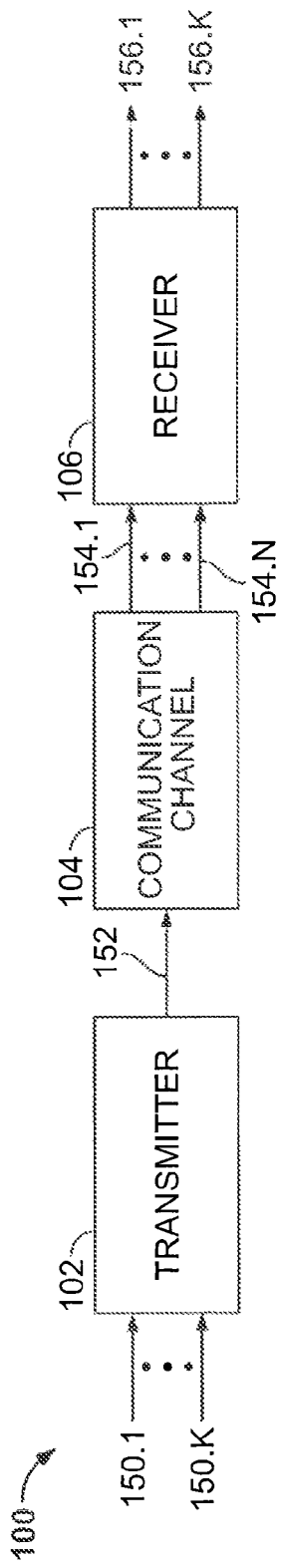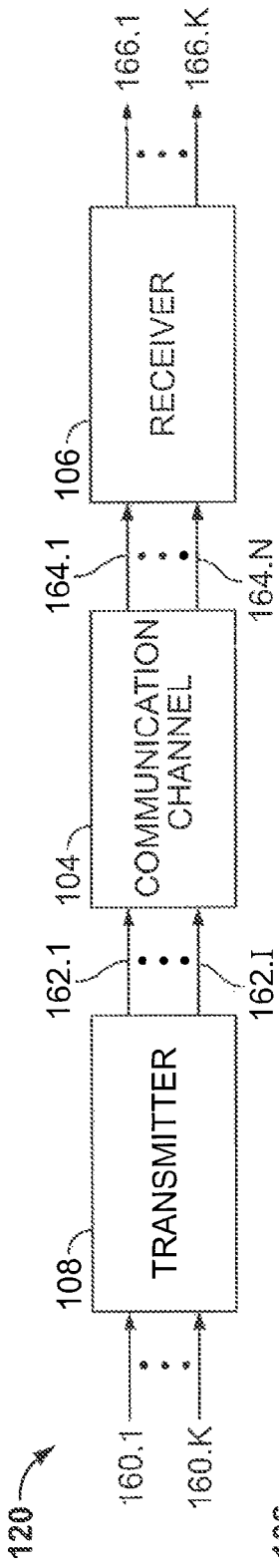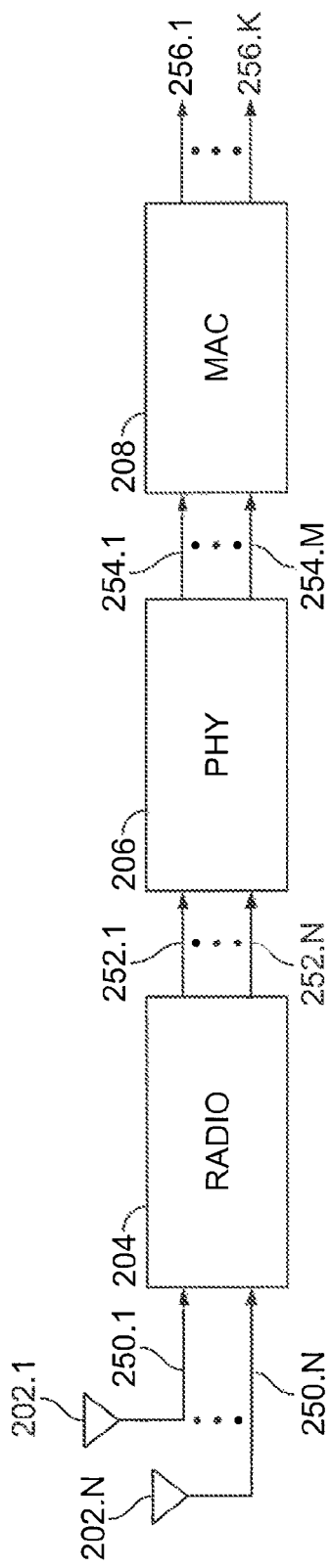

1400

| Channel | f_c | 40 | 41 | 42 | 43 | 44 | 45 | 46 | 47 | 48 | 49 | 50 |
|---|---|---|---|---|---|---|---|---|---|---|---|---|
| 1 | 2412 | | | | | | | | | | | |
| 2 | 2417 | | | | | | | | | | | |
| 3 | 2422 | | | | | | | | | | | |
| 4 | 2427 | | | | | | | | | | | |
| 5 | 2432 | | | | | | | | | | | |
| 6 | 2437 | | | | | | | | | | | |
| 7 | 2442 | | | | | | | | | | | |
| 8 | 2447 | | | | | | | | | | | |
| 9 | 2452 | | | | | | | | | | | |
| 10 | 2457 | | | | | | | | | | | |
| 11 | 2462 | | | | | | | | | | | |
| 12 | 2467 | | | | | | | | | | | |
| 13 | 2472 | | | | | | | | | | | |
| 14 | 2484 | | | | | | | | | | | |

| Channel | f_c | 80 | 82 | 84 | 86 | 88 | 90 | 92 | 94 | 96 | 98 | 100 |
|---|---|---|---|---|---|---|---|---|---|---|---|---|
| 1 | 2412 | | | | | | | | | | | |
| 2 | 2417 | | | | | | | | | | | |
| 3 | 2422 | | | | | | | | | | | |
| 4 | 2427 | | | | | | | | | | | |
| 5 | 2432 | | | | | | | | | | | |
| 6 | 2437 | | | | | | | | | | | |
| 7 | 2442 | | | | | | | | | | | |
| 8 | 2447 | | | | | | | | | | | |
| 9 | 2452 | | | | | | | | | | | |
| 10 | 2457 | | | | | | | | | | | |
| 11 | 2462 | | | | | | | | | | | |
| 12 | 2467 | | | | | | | | | | | |
| 13 | 2472 | | | | | | | | | | | |
| 14 | 2484 | | | | | | | | | | | |

FIG. 14B

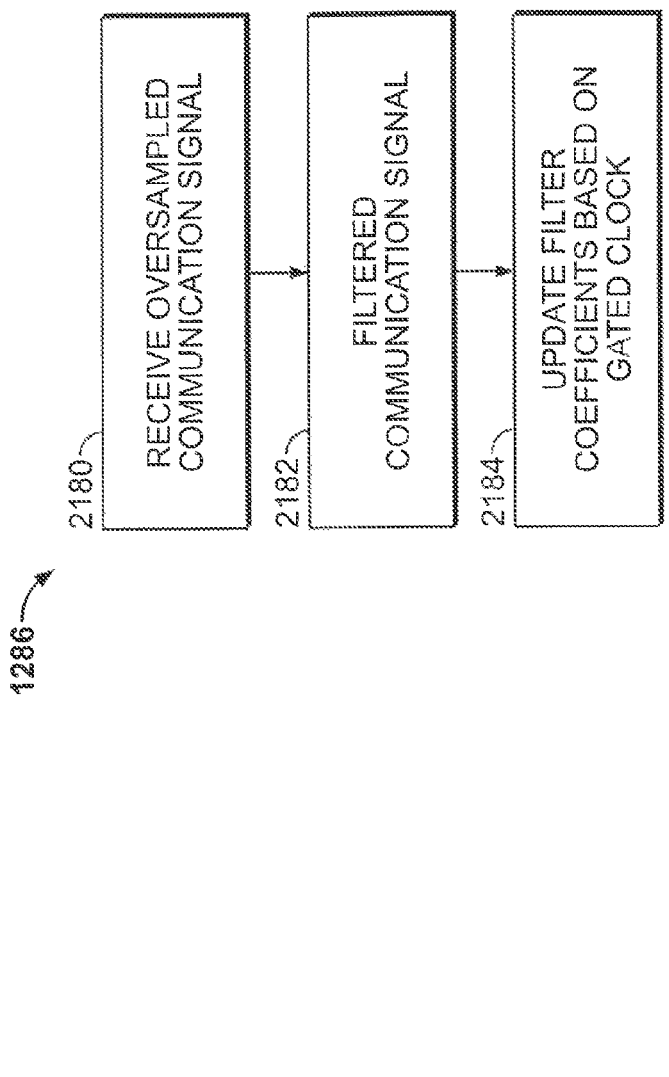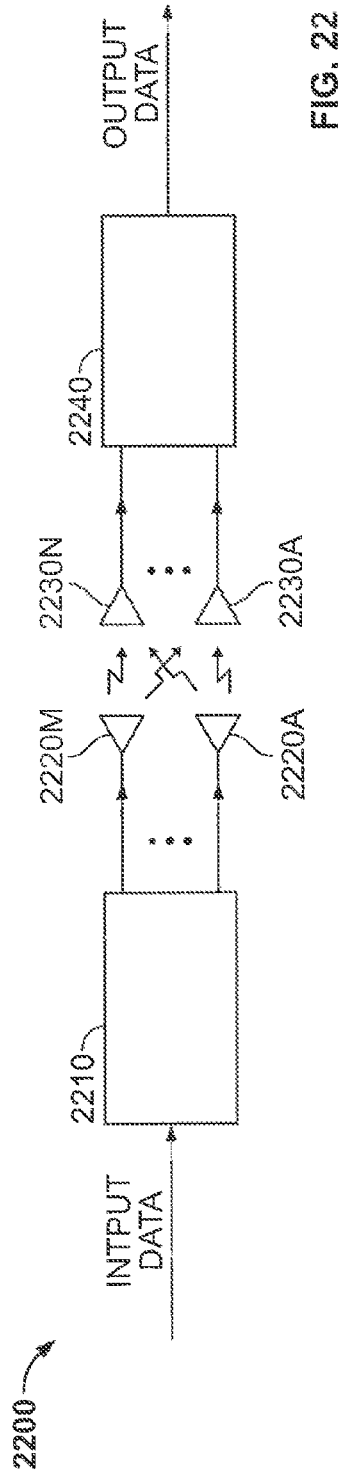

CARRIER SELECTION FOR MULTIPLE ANTENNAS

CROSS-REFERENCE TO RELATED APPLICATIONS

The present application claims the benefit of: U.S. Provisional Patent Appl. No. 60/929,154, filed Jun. 15, 2007, U.S. Provisional Patent Appl. No. 60/929,155, filed Jun. 15, 2007, U.S. Provisional Patent Appl. No. 60/929,156, filed Jun. 15, 2007, and U.S. Provisional Patent Appl. No. 60/960,706, filed Oct. 10, 2007, each of which is incorporated by reference herein in its entirety.

The present application is related to: U.S. Provisional Patent Appl. No. 60/929,157, filed Jun. 15, 2007, U.S. Provisional Patent Appl. No. 60/929,159, filed Jun. 15, 2007, U.S. Provisional Patent Appl. No. 60/929,158, filed Jun. 15, 2007, U.S. Provisional Patent Appl. No. 60/929,149, filed Jun. 15, 2007, U.S. Provisional Patent Appl. No. 60/960,384, filed Sep. 27, 2007, U.S. patent application Ser. No. 12/004,406, filed Dec. 21, 2007, U.S. patent application Ser. No. 12/213,176, filed Jun. 16, 2008, U.S. patent application Ser. No. 12/139,634, filed Jun. 16, 2008, U.S. patent application Ser. No. 12/213,179, filed Jun. 16, 2008, and U.S. patent application Ser. No. 12/213,175, filed Jun. 16, 2008, each of which is incorporated by reference herein in its entirety.

BACKGROUND OF THE INVENTION

1. Field of the Invention

The present invention relates generally to a communications receiver configured to receive both a multiple stream communication signal and a single stream communication signal.

2. Related Art

A communication system typically involves transmitting an information signal as a communications signal from a communications transmitter to a communications receiver over a communication channel. The communications transmitter may include a single transmit antenna to produce a single stream communications signal or multiple transmit antennas to produce a multiple stream communications signal.

The communication receiver may include multiple receive antennas to receive the communications signal as it traverses through the communication channel. Commonly, the communication receiver may process the received communication signal according to a known single stream communications standard, such as, but not limited to, the Institute of Electrical and Electronics Engineers (IEEE) 802.11a™ standard, the IEEE 802.11b™ standard, the IEEE 802.11g™ standard, or a known multiple stream communications standard, such as, but not limited to, the IEEE 802.11n™ standard, but not both. The IEEE 802.11a™ standard, the IEEE 802.11b™ standard, the IEEE 802.11g™, and the 802.11n™ standard are incorporated by reference herein in their entirety. A communications receiver processing the received communication signal using the known single stream communication standard is unable recover the information signal from the multiple stream communication signal. Likewise, a communications receiver processing the received communication signal using the known multiple stream communication standard is unable recover the information signal from the single stream communication signal.

Therefore, what is needed is a communications receiver that is capable of recovering an information signal from both a single stream communications signal using a known single stream communication standard and a multiple stream communications signal using a known multiple stream communication standard.

BRIEF DESCRIPTION OF THE DRAWINGS/FIGURES

The accompanying drawings illustrate the present invention and, together with the description, further serve to explain the principles of the invention and to enable one skilled in the pertinent art to make and use the invention.

FIG. 1A illustrates a block diagram of a communications environment according to an exemplary embodiment of the present invention.

FIG. 1B illustrates a block diagram of another communications environment according to another exemplary embodiment of the present invention.

FIG. 2 illustrates a block diagram of a communications receiver according to an exemplary embodiment of the present invention.

FIG. 14A is a table illustrating at-risk channels in a multi-channel communication signal transmitted and/or received in a 20 MHz mode according to IEEE 802.11n™ standard according to an exemplary embodiment of the present invention.

FIG. 14B is a table illustrating at-risk channels in a multi-channel communication signal transmitted and/or received in a 40 MHz mode according to IEEE 802.11n™ standard according to an exemplary embodiment of the present invention.

FIG. 21B is a flowchart of exemplary operational steps of a resampler module according to an aspect of the present invention.

FIG. 22 is a block diagram of a conventional MIMO communications system.

Figure 3:
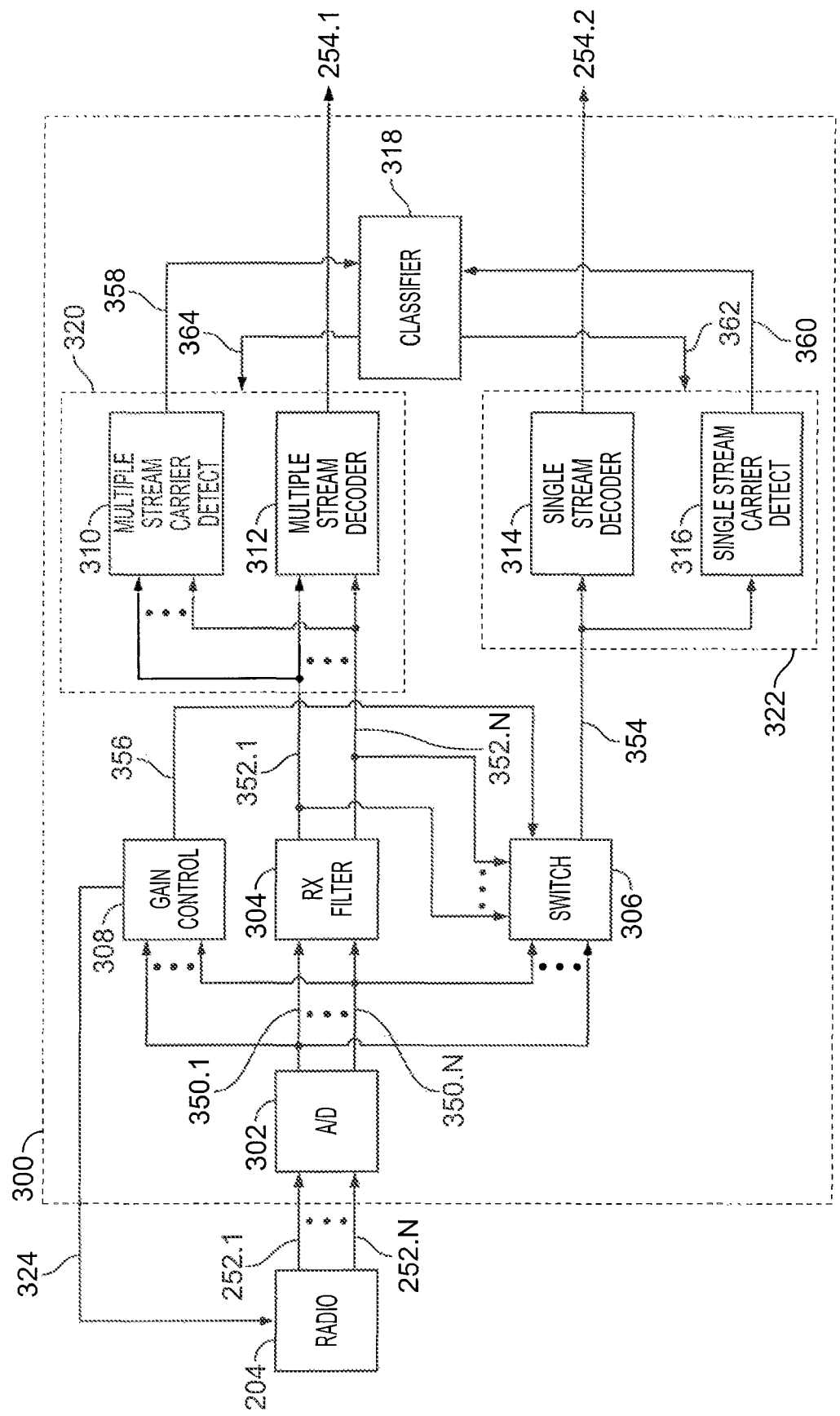
FIG. 3 illustrates a block diagram of a physical layer interface (PHY) according to a first exemplary embodiment of the present invention.

The present invention will now be described with reference to the accompanying drawings. In the drawings, like reference numbers generally indicate identical, functionally similar, and/or structurally similar elements. The drawing in which an element first appears is indicated by the leftmost digit(s) in the reference number.

DETAILED DESCRIPTION OF THE INVENTION

The following detailed description of the present invention refers to the accompanying drawings that illustrate exemplary embodiments consistent with this invention. Other embodiments are possible, and modifications may be made to the embodiments within the spirit and scope of the invention. Therefore, the detailed description is not meant to limit the invention. Rather, the scope of the invention is defined by the appended claims.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

Furthermore, it should be understood that spatial descriptions (e.g., "above," "below," "up," "left," "right," "down," "top," "bottom," "vertical," "horizontal," etc.) used herein are for purposes of illustration only, and that practical implementations of the structures described herein may be spatially arranged in any orientation or manner. Likewise, particular bit values of "0" or "1" (and representative voltage values) are used in illustrative examples provided herein to represent information for purposes of illustration only. Information described herein may be represented by either bit value (and by alternative voltage values), and embodiments described herein may be configured to operate on either bit value (and any representative voltage value), as would be understood by persons skilled in the relevant art(s).

The example embodiments described herein are provided for illustrative purposes, and are not limiting. Further structural and operational embodiments, including modifications/alterations, will become apparent to persons skilled in the relevant art(s) from the teachings herein.

Exemplary Communications Environments

FIG. 1A illustrates a block diagram of a communications environment according to an exemplary embodiment of the present invention. A communications environment 100 is an exemplary representation of a single-input and multiple-output (SIMO) communications environment that includes the use of a single transmit antenna at a communications transmitter 102 and multiple receive antennas at a communications receiver 106. The communications environment 100 includes the communications transmitter 102 to transmit one or more information signals as received from one or more transmitter user devices, denoted as information signals 150.1 through 150.K, to the communications receiver 106 via a communication channel 104. The transmitter user devices may include, but are not limited to, personal computers, data terminal equipment, telephony devices, broadband media players, personal digital assistants, software applications, or any other medium capable of transmitting or receiving data. However, those skilled in the relevant art(s) will recognize that the information signals 150.1 through 150.K may include a single information signal, such as the information signal 150.1 to provide an example, without departing from the spirit and scope of the present invention.

The communications transmitter 102 produces a transmitted communication signal 152 by encoding the information signals 150.1 through 150.K according to a known single stream communications standard, such as, but not limited to, the Institute of Electrical and Electronics Engineers (IEEE) 802.11a™ standard, the IEEE 802.11b™ standard, the IEEE 802.11g™ standard, and/or any other suitable single stream communications standard. The IEEE 802.11a™ standard, the IEEE 802.11b™ standard, and the IEEE 802.11g™ standard are incorporated herein by reference in their entirety. As shown in FIG. 1A, the transmitted communication signal 152 represents a single stream communication signal. In other words, the communications transmitter 102 may encode the information signals 150.1 through 150.K to produce the transmitted communication signal 152.

The transmitted communication signal 152 passes through the communication channel 104 to produce received communication signals 154.1 through 154.N. The communication channel 104 may include, but is not limited to, a microwave radio link, a satellite channel, a fiber optic cable, a hybrid fiber optic cable system, or a copper cable to provide some examples. The communication channel 104 contains a propagation medium that the transmitted communication signal 152 passes through before reception by the communications receiver 106. The propagation medium of the communication channel 104 introduces interference and/or distortion into the transmitted communication signal 152 to produce received communication signals 154.1 through 154.N. For example, noise such as, but not limited to, thermal noise, burst noise, impulse noise, interference, signal strength variations known as fading, phase shift variations, to provide some examples, may introduce interference and/or distortion into the transmitted communication signal 152. In addition, the propagation medium of the communication channel 104 may cause the transmitted communication signal 152 to reach the communications receiver 106 by multiple communication paths, reflecting from different objects, surface areas, surface boundaries, and interfaces in the communications environment 100. Potential causes of multipath propagation may include, but are not limited to atmospheric ducting, ionospheric reflection and/or refraction, and/or reflection from terrestrial objects such as mountains and/or buildings to provide some examples.

The communications receiver 106 may include one or more receiving antennas to capture the received communication signals 154.1 through 154.N. In an exemplary embodiment, the communications receiver 106 includes two receiving antenna to capture the received communication signals 154.1 through 154.2. The received communication signals 154.1 through 154.N represent the multiple communication paths traversed by the transmitted communication signal 152 resulting from the multipath propagation introduced by the communication channel 104. For example, the received communication signal 154.1 represents the transmitted communication signal 152 as it traverses through a first communication path of the communication channel 104. Likewise, the received communication signal 154.N represents the transmitted communication signal 152 as it traverses through an $N^{th}$ communication path of the communication channel 104.

The communications receiver 106 may recover the one or more information signals from the one or more transmitter user devices to produce one or more recovered information signals, denoted as recovered information signals 156.1 through 156.K, for one or more receiver user devices by operating upon the received communication signals 154.1 through 154.N according to the known single stream communications standard. The receiver user devices may include, but are not limited to, personal computers, data terminal equipment, telephony devices, broadband media players, personal digital assistants, software applications, or any other medium capable of transmitting or receiving data. However, those skilled in the relevant art(s) will recognize that the recovered information signals 156.1 through 156.K may include a single recovered information signal, such as the recovered information signal 156.1 to provide an example, without departing from the spirit and scope of the present invention.

FIG. 1B illustrates a block diagram of another communications environment according to another exemplary embodiment of the present invention. A communications environment 120 is an exemplary representation of a multiple-input and multiple-output (MIMO) communications environment that includes the use of multiple transmit antennas at a communications transmitter 108 and multiple receive antennas at the communications receiver 106. The communications environment 120 includes the communications transmitter 108 to transmit one or more information signals as received from one or more transmitter user devices, denoted as information signals 160.1 through 160.K, to the communications receiver 106 via a communication channel 104. The transmitter user devices may include, but are not limited to, personal computers, data terminal equipment, telephony devices, broadband media players, personal digital assistants, software applications, or any other medium capable of transmitting or receiving data. However, those skilled in the relevant art(s) will recognize that the information signals 160.1 through 160.K may include a single information signal, such as the information signal 160.1, without departing from the spirit and scope of the present invention.

The communications transmitter 108 produces transmitted communication signals 162.1 through 162.I by encoding the information signals 160.1 through 160.K according to a known multiple stream communications standard such as, but not limited to, the IEEE 802.11n™ standard, and/or any other suitable multiple stream communications standard. The IEEE 802.11n™ standard is incorporated herein by reference in its entirety. As shown in FIG. 1B, the transmitted communication signals 162.1 through 162.I together represent a multiple stream communication signal. The communications transmitter 108 may encode at least one of the information signals 160.1 through 160.K to produce the transmitted communication signals 162.1 through 162.I. For example, the communications transmitter 108 may encode the information signal 160.1 to produce the transmitted communication signal 162.1. Alternatively, the communications transmitter 108 may encode more than one of information signals 160.1 through 160.K to produce one or more of the transmitted communication signals 162.1 through 162.I. For example, the communications transmitter 108 may encode the information signal 160.1 and the information signal 160.2 to produce the transmitted communication signal 162.1.

The transmitted communication signals 162.1 through 162.I pass through the communication channel 104 to produce received communication signals 164.1 through 164.N. The transmitted communication signals 162.1 through 162.I may include a similar or a dissimilar number of communication signals as the received communication signals 164.1 through 164.N. The propagation medium of the communication channel 104 introduces interference and/or distortion into the transmitted communication signals 162.1 through 162.I to produce the received communication signals 164.1 through 164.N. For example, noise such as, but not limited to, thermal noise, burst noise, impulse noise, interference, signal strength variations known as fading, phase shift variations, to provide some examples, may introduce interference and/or distortion into the transmitted communication signals 162.1 through 162.I. In addition, the propagation medium of the communication channel 104 may cause each of transmitted communication signals 162.1 through 162.I to reach the communications receiver 106 by multiple communication paths, reflecting from different objects, surface areas, surface boundaries, and interfaces in the communications environment 120. Potential causes of multipath propagation may include, without limitation, atmospheric ducting, ionospheric reflection and/or refraction, and/or reflection from terrestrial objects such as mountains and/or buildings to provide some examples.

Referring back to FIG. 1B, the communications receiver 106 includes multiple receiving antenna to capture the received communication signals 164.1 through 164.N. In an exemplary embodiment, the communications receiver 106 includes two receiving antennas to capture the received communication signals 164.1 through 164.2. The received communication signals 164.1 through 164.N represent the multiple communication paths traversed by each of the transmitted communication signals 162.1 through 162.I resulting from the multipath propagation introduced by the communication channel 104. For example, the received communication signal 164.1 represents the transmitted communication signals 162.1 through 162.I as they traverse through a first communication path of the communication channel 104. Likewise, the received communication signal 164.N represents the transmitted communication signals 162.1 through 162.I as they traverse through an $N^{th}$ communication path of the communication channel 104.

The communications receiver 106 may recover the one or more information signals from the one or more transmitter user devices to produce one or more recovered information signals, denoted as recovered information signals 166.1 through 166.K, for one or more receiver user devices by operating upon the received communication signals 164.1 through 164.N according to the known multiple stream communications standard. The receiver user devices may include, but are not limited to, personal computers, data terminal equipment, telephony devices, broadband media players, personal digital assistants, software applications, or any other medium capable of transmitting or receiving data. However, those skilled in the relevant art(s) will recognize that the recovered information signals 166.1 through 166.K may include a single recovered information signal, such as the recovered information signal 166.1 to provide an example, without departing from the spirit and scope of the present invention.

As shown in FIG. 1A and FIG. 1B, the communications receiver 106 may, according to the invention, operate in the SIMO communications environment represented by the communications environment 100 and/or the MIMO communications environment represented by the communications environment 120. However, this example is not limiting, the communications receiver 106 may operate in any suitable communications environment that will be apparent to one skilled in the relevant art(s) without departing from the spirit and scope of the present invention.

Exemplary Communications Receiver

FIG. 2 illustrates a block diagram of a communications receiver according to an exemplary embodiment of the present invention. More specifically, FIG. 2 illustrates a block diagram of an exemplary embodiment of the communications receiver 106 as shown in FIG. 1A and FIG. 1B. As will be understood by persons skilled in the relevant art(s) from the teachings provided herein, the communications receiver 106 may be readily implemented in hardware, software, or a combination of hardware and software. For example, based on the teachings provided herein, a person skilled in the relevant art(s) could implement the communications receiver 106 via a combination of at least one application specific integrated circuit and a processor core for implementing software commands stored in at least one attached memory. However, this example is not limiting, and other implementations are within the scope and spirit of the present invention.

As shown in FIG. 2, the communications receiver 106 includes receiving antennas 202.1 through 202.N, a radio receiver 204, a physical layer interface (PHY) 206, and a media access controller (MAC) 208. The receiving antennas 202.1 through 202.N capture the received communications signals 154.1 through 154.N, the received communications signals 164.1 through 164.N, and/or any suitable combination thereof as shown in FIG. 1A through FIG. 1B. The receiving antennas 202.1 through 202.N convert either the received communications signals 154.1 through 154.N, the received communications signals 164.1 through 164.N, and/or the suitable combination thereof from electromagnetic waves to modulated radio frequency (RF) currents, denoted as received communications signals 250.1 through 250.N in FIG. 2. For example, the receiving antenna 202.1 may produce the received communications signal 250.1 by converting the received communications signal 154.1 from an electromagnetic wave to a modulated RF current. In an exemplary embodiment, the communications receiver 106 includes the receiving antennas 202.1 through 202.N. However, this example is not limiting, the receiving antenna 202 may include any suitable number of antenna without departing the scope and spirit of the present invention.

The radio receiver 204 operates on the received communications signals 250.1 through 250.N to produce downconverted communications signals 252.1 through 252.N. For example, the radio receiver 204 may downconvert the received communications signals 250.1 through 250.N to baseband or any suitable intermediate frequency (IF) to produce the downconverted communications signals 252.1 through 252.N. The radio receiver 204 may additionally perform functions such as, but not limited to, filtering, and/or automatic gain control (AGC).

The PHY 206 provides an interface between the radio receiver 204 and the MAC 208. However, those skilled in the relevant art(s) will recognize that the PHY 206 may directly receive a baseband or near baseband communications signal, such as Asymmetric Digital Subscriber Line (ADSL) to provide an example, from the communication channel 104 without departing from the spirit and scope of the present invention. In other words, herein the radio receiver 204 is optional, the PHY 206 may receive a communications signal, such as the received communications signals 154.1 through 154.N and/or the received communications signals 164.1 through 164.N, directly from the communication channel 104 via the receiving antennas 202.1 through 202.N. The PHY 206 processes the downconverted communications signals 252.1 through 252.N to produce decoded communications signals 254.1 through 254.M. More specifically, the PHY 206 decodes the downconverted communications signals 252.1 through 252.N to produce the decoded communications signal 254 according to the known single stream communications standard and/or the known multiple stream communications standard. In an exemplary embodiment, the PHY 206 produces the decoded communications signal 254.1 and the decoded communications signal 254.2, wherein the decoded communications signal 254.1 corresponds to the received communications signals 164.1 through 164.N in the communications environment 120 as shown in FIG. 1B and the decoded communications signal 254.2 corresponds to the received communications signals 154.1 through 154.N in the communications environment 100 as shown in FIG. 1A. However, this example is not limiting, the decoded communications signals 254.1 through 254.M may include any suitable number of decoded communications signals without departing the scope and spirit of the present invention.

The MAC 208 may produce at least one recovered information signal, denoted as recovered information signals 256.1 through 256.K, for at least one receiver user device by operating upon the decoded communications signals 254.1 through 254.M according to the known single stream communications standard and/or the known multiple stream communications standard. The recovered information signals 256.1 through 256.K may represent the recovered information signals 156.1 through 156.K as discussed in the communications environment 100 of FIG. 1A, the recovered information signals 166.1 through 166.K as discussed in the communications environment 120 of FIG. 1B, and/or any suitable combination thereof. The MAC 208 may process at least one decoded communications signal 254.1 through 254.M according to the known single stream communications standard and/or the known multiple stream communications standard to produce at least one recovered information signal 256.1 through 256.K. For example, the MAC 208 may process decoded communications signals 254.1 through 254.4 according to the known single stream communications standard and/or the known multiple stream communications standard to produce the recovered information signal 256.1. Alternatively, the MAC 208 may process the decoded communications signal 254.1 according to the known single stream communications standard and/or the known multiple stream communications standard to produce the recovered information signals 256.1 and 256.2. The MAC 208 may additionally, without limitation, provide addressing and channel access control mechanisms that make it possible for multiple terminals or network nodes to communicate within the multipoint network, typically a local area network (LAN), metropolitan area network (MAN), or a wide area network (WAN).

Exemplary Physical Layer Interfaces

FIG. 3 illustrates a block diagram of a physical layer interface (PHY) according to a first exemplary embodiment of the present invention. A PHY 300 provides an interface between a media access controller, such as the MAC 208, and a communication channel, such as the communication channel 104, according to the known single stream communications standard and/or the known multiple stream communications standard. The PHY 300 may represent an exemplary embodiment of the PHY 206 as shown in FIG. 2.

As shown in FIG. 3, the PHY 300 includes an analog to digital converter (ADC) 302, a gain control module 308, a receive filter 304, a switching module 306, a stream classifier module 318, a multiple stream processing module 320, and a single stream processing module 322. The ADC 302 produces digital communication signals 350.1 through 350.N based on the downconverted communication signals 252.1 through 252.N. More specifically, the ADC 302 converts the downconverted communication signals 252.1 through 252.N from an analog representation to a digital representation to produce the digital communication signals 350.1 through 350.N. The ADC 302 may convert the downconverted communication signals 252.1 through 252.N separately or individually using N independent analog to digital converters.

The receive filter 304 produces encoded multiple stream communication signals 352.1 through 352.N based on the digital communication signals 350.1 through 350.N. More specifically, the receive filter 304 filters out of band noise and/or interference from the digital communication signals 350.1 through 350.N. The out of band noise and/or interference may result from, without limitation, noise and/or interference resulting from the communication channel 104, noise and/or interference resulting from the radio receiver 204 and/or the ADC 302, and/or noise and/or interference resulting from one or more adjacent channels in the received communication signals 154.1 through 154.N and/or the received communication signals 164.1 through 164.N to provide some examples. The receive filter 304 may filter the digital communication signals 350.1 through 350.N separately or individually using N independent digital filters.

A communications transmitter, such as the communications transmitter 102 and/or the communications transmitter 108, may transmit a transmitted communication signal, such as the transmitted communications signal 152 and/or the transmitted communications signals 162.1 through 162.1, in one or more frames. Each one of the one or more frames include at least one single stream signal field such as, but not limited to, a single stream preamble, a single stream signal field, and/or a single stream single stream information payload in accordance with the known single stream communications standard and/or at least one multiple stream signal field such as, but not limited to, a multiple stream preamble, a multiple stream signal field, and/or a multiple stream multiple stream information payload in accordance with the known multiple stream communications standard. The receiver filter 304 may select among one or more receiver filter bandwidths to filter the at least one single stream signal field and/or the at least one multiple stream signal field. For example, the receiver filter 304 may select at least one of a training sequence bandwidth to filter the single stream preamble and/or the multiple stream preamble, a single stream information payload bandwidth to filter the single stream information payload, and/or a multiple stream information payload bandwidth to filter the multiple stream information payload. Further discussion of the receiver filter 304 is disclosed in U.S. patent application Ser. No. 12/213,176, filed on Jun. 16, 2008, which is incorporated by reference in its entirety.

The switching module 306 selects an encoded single stream communication signal 354 from the digital communication signals 350.1 through 350.N and/or the encoded multiple stream communication signals 352.1 through 352.N based on a single stream selection signal 356. More specifically, the known single stream communications standard and/or the known multiple stream communications standard may operate in one or more modes of operation. For example, the PHY 300 may receive the downconverted communication signals 252.1 through 252.N in a 20 MHz mode of operation and/or a 40 MHz mode of operation according to IEEE 802.11n™ standard. The switching module 306 may select the encoded single stream communication signal 354 from the digital communication signals 350.1 through 350.N for a first mode of operation or the encoded multiple stream communication signals 352.1 through 352.N for a second mode of operation based on the single stream selection signal 356. For example, the switching module 306 may select the encoded single stream communication signal 354 from the digital communication signals 350.1 through 350.N for the 20 MHz mode of operation or the encoded multiple stream communication signals 352.1 through 352.N for the 40 MHz mode of operation based on the single stream selection signal 356. However, this example is not limiting, those skilled in the relevant art(s) will recognize that if the known single stream communications standard and/or the known multiple stream communications standard operate in a single mode of operation, such as the 20 MHz mode of operation, the switching module 306 may select from either the digital communication signals 350.1 through 350.N or the encoded multiple stream communication signals 352.1 through 352.N for a second mode of operation without departing from the spirit and scope of the present invention.

The gain control module 308 produces the stream selection signal 356 and a receiver gain adjustment signal 324 based on the digital communication signals 350.1 through 350.N. More specifically, the gain control module 308 measures a power level of each of the digital communication signals 350.1 through 350.N. The gain control module 308 may measure the power level of each of the digital communication signals 350.1 through 350.N continuously, at a regular interval in time, such as every 10 μs, and/or at any other suitable instant in time as will be apparent to one skilled in the relevant art(s).

The gain control module 308 produces the stream selection signal 356 based on the power level of each of the digital communication signals 350.1 through 350.N. In an exemplary embodiment, the stream selection signal 356 may indicate to the switch module 306 to select or switch the encoded single stream communication signal 354 to a corresponding digital communication signal 350.1 through 350.N having a largest or greatest power level. For example, if the gain control module 308 determines that the digital communication signals 350.1 has the greatest power level, the stream selection signal 356 may indicate to the switch module 306 to switch the encoded single stream communication signal 354 to the digital communication signals 350.1. In another exemplary embodiment, the gain control module 308 may additionally provide hysteresis. Hysteresis prevents the switch module 306 from constantly switching between one or more of the digitized communication signals 350.1 through 350.N when the power level of the one or more of the digital communication signals 350.1 through 350.N are relatively close in magnitude. In this exemplary embodiment, the stream selection signal 356 may indicate to the switch module 306 to switch the encoded single stream communication signal 354 to a corresponding digital communication signals 350.1 through 350.N only if a measured digital communication signals 350.1 through 350.N exceeds a power level of a currently selected digital communication signals 350.1 through 350.N by a predetermined amount. In a further exemplary embodiment, the stream selection signal 356 may indicate to the switch module 306 to switch the encoded single stream communication signal 354 if a measured digital communication signals 350.1 through 350.N exceeds a predetermined amount regardless of the power level of the currently selected digital communication signals 350.1 through 350.N.

In addition, the gain control module 308 produces the receiver gain adjustment signal 324 based on the power level of each of the digital communication signals 350.1 through 350.N. The receiver gain adjustment signal 324 indicates to the radio receiver 204 to increase and/or decrease the power levels of the downconverted communication signals 252.1 through 252.N. For example, the radio receiver 204 may decrease the power levels of downconverted communication signals 252.1 through 252.N to prevent the downconverted communication signals 252.1 through 252.N from overdriving or saturating the PHY 300. Likewise, the radio receiver 204 may increase the power levels of the digital communication signals 350.1 through 350.N to prevent the downconverted communication signals 252.1 through 252.N from underdriving the PHY 300.

The multiple stream processing module 320 processes the encoded multiple stream communication signals 352.1 through 352.N according to the known multiple stream communications standard to produce the decoded communication signal 254.1. The multiple stream processing module 320 includes a multiple stream carrier detection module 310 and a multiple stream decoder module 312.

The multiple stream carrier detection module 310 detects a presence and/or absence of the multiple stream communication signal embedded within the encoded multiple stream communication signals 352.1 through 352.N. From the discussion above, the encoded multiple stream communication signals 352.1 through 352.N may include a single stream communication signal as shown in FIG. 1A and/or a multiple stream communication signal, such as shown in FIG. 1B. The multiple stream carrier detection module 310 detects the presence and/or absence of the multiple stream communication signal in the encoded multiple stream communication signals 352.1 through 352.N according to the known multiple stream communications standard. The multiple stream carrier detection module 310 may indicate the presence and/or absence of the multiple stream communication signal embedded within the encoded multiple stream communication signals 352.1 through 352.N to the stream classifier module 318 via a multiple stream indication signal 358. The multiple stream carrier detection module 310 may additionally detect for adjacent channel interference (ACI), U.S. Provisional Patent Appl. No. 60/929,156, filed Jun. 15, 2007, which is incorporated by reference herein in its entirety.

The multiple stream decoder module 312 decodes the encoded multiple stream communication signals 352.1 through 352.N according to the known multiple stream communications standard to produce the decoded communication signal 254.1.

The single stream processing module 322 processes the encoded single stream communication signal 354 according to the known single stream communications standard to produce the decoded communication signal 254.2. The single stream processing module 322 includes a single stream decoder module 314 and a single stream carrier detection module 316.

The single stream carrier detection module 316 detects a presence and/or absence of the single stream communication signal embedded within the encoded single stream communication signal 354. From the discussion above, the encoded single stream communication signal 354 may include a single stream communication signal as shown in FIG. 1A and/or a component of a multiple stream communication signal, such as shown in FIG. 1B. The single stream carrier detection module 316 detects the presence and/or absence of the single stream communication signal in the encoded single stream communication signal 354 according to the known single stream communications standard. The single stream carrier detection module 316 may indicate the presence and/or absence of the single stream communication signal embedded within the encoded single stream communication signal 354 to the stream classifier module 318 via a single stream indication signal 360.

The single stream decoder module 314 decodes the encoded single stream communication signal 354 according to the known single stream communications standard to produce the decoded communication signal 254.2.

The stream classifier module 318 determines whether the digital communication signals 350.1 through 350.N include a single stream communication signal as shown in FIG. 1A and/or a multiple stream communication signal, such as shown in FIG. 1B based on the multiple stream indication signal 358 and/or the single stream indication signal 360. When the multiple stream indication signal 358 indicates the presence of the multiple stream communication signal in the digital communication signals 350.1 through 350.N by means of the encoded multiple stream communication signals 352.1 through 352.N, the stream classifier module 318 disables the single stream processing module 322 or operates the single stream processing module 322 in a low power mode via single stream disable signal 362. Likewise, when the single stream indication signal 360 indicates the presence of the single stream communication signal in the digital communication signals 350.1 through 350.N by means of the encoded single stream communication signal 354, the stream classifier module 318 disables the receive filter 304 and/or the multiple stream processing module 320 or operates receive filter 304 and/or the multiple stream processing module 320 in a low power mode via multiple stream disable signal 364. However, if both the multiple stream indication signal 358 indicates the presence of the multiple stream communication signal and the single stream indication signal 360 indicates the presence of the single stream communication signal, the stream classifier module 318 may default to either the multiple stream processing module 320 or the single stream processing module 322.

Figure 4:
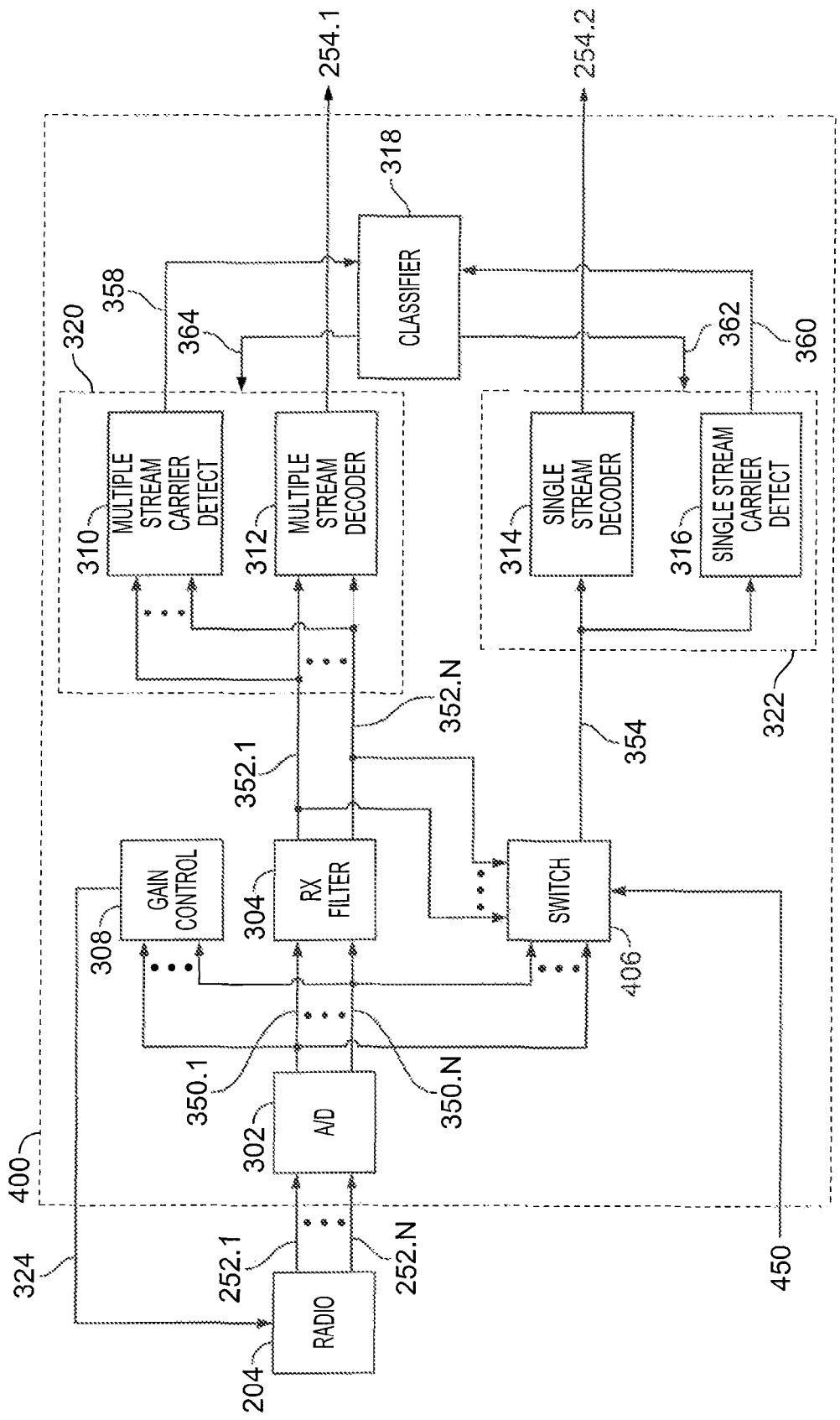
FIG. 4 illustrates a block diagram of a physical layer interface (PHY) according to a second exemplary embodiment of the present invention.

FIG. 4 illustrates a block diagram of a physical layer interface (PHY) according to a second exemplary embodiment of the present invention. A PHY 400 provides an interface between a media access controller, such as the MAC 208, and a communication channel, such as the communication channel 104, according to the known single stream communications standard and/or the known multiple stream communications standard. The PHY 400 may represent an exemplary embodiment of the PHY 206 as shown in FIG. 2 and operates in a substantially similar manner as the PHY 300 as shown in FIG. 3. As such, only the differences between the PHY 300 and the PHY 400 are discussed in further detail.

The switching module 406 selects the encoded single stream communication signal 354 from the digital communication signals 350.1 through 350.N and/or the encoded multiple stream communication signals 352.1 through 352.N based on a single stream selection signal 450. The selection signal 450 is received from an external source, such as, but not limited to, the one or more receiver user devices or a higher networking layer such as a MAC layer or an application layer to provide some examples. The selection signal 450 allows the external source to gather or to calculate statistical information regarding the decoded communication signals 254.1 and 254.2. The external source allows the selection of the encoded single stream communication signal 354 based on advanced or computation intensive statistics regarding the decoded communication signals 254.1 and 254.2.

The switching module 406 selects the encoded single stream communication signal 354 from the digital communication signals 350.1 through 350.N and/or the encoded multiple stream communication signals 352.1 through 352.N based on the statistical information. For example, the statistical information may determine that a signal to noise ratio of the decoded communication signal 254.2 for a corresponding digital communication signal 350.1 through 350.N is always greater than a signal to noise ratio for all other digital communication signals 350.1 through 350.N. Alternatively, the statistical information may determine that a number of messages successfully delivered per unit time, or throughput, of the decoded communication signal 254.2 for a corresponding digital communication signal 350.1 through 350.N is always greater than a throughput for all other digital communication signals 350.1 through 350.N. However, these examples are not limiting, those skilled in the relevant art(s) will recognize that any other suitable statistical information may be used to select the encoded single stream communication signal 354 without departing from the spirit and scope of the present invention. The external source may communicate the statistical information regarding the corresponding digital communication signal 350.1 through 350.N to the switching module 406 via the single stream selection signal 450 to allow the switching module 406 to select the corresponding digital communication signal 350.1 through 350.N as the encoded single stream communication signal 354.

Figure 5:
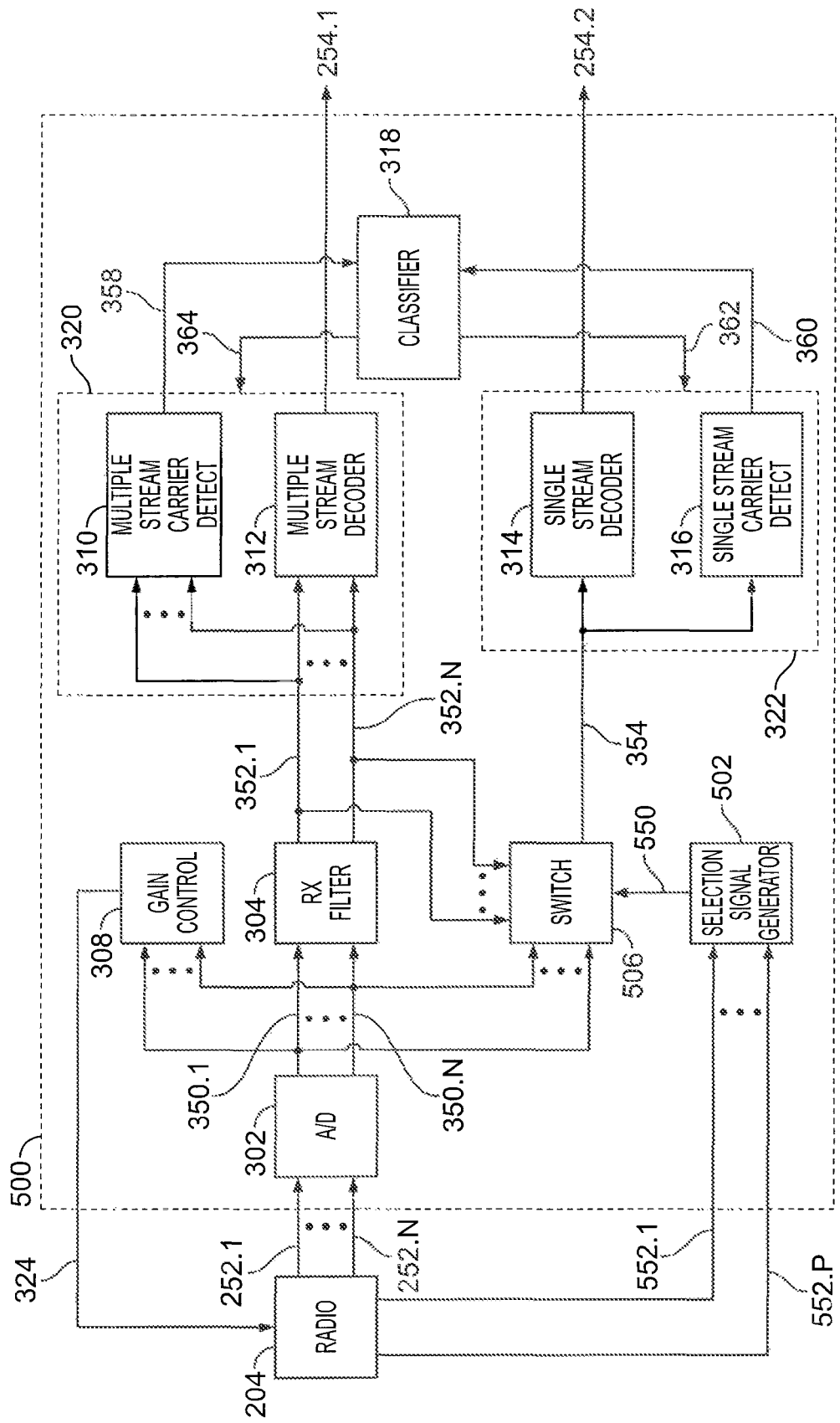
FIG. 5 illustrates a block diagram of a physical layer interface (PHY) according to a third exemplary embodiment of the present invention.

FIG. 5 illustrates a block diagram of a physical layer interface (PHY) according to a third exemplary embodiment of the present invention. A PHY 500 provides an interface between a media access controller, such as the MAC 208, and a communication channel, such as the communication channel 104, according to the known single stream communications standard and/or the known multiple stream communications standard. The PHY 500 may represent an exemplary embodiment of the PHY 206 as shown in FIG. 2 and operates in a substantially similar manner as the PHY 300 as shown in FIG. 3. As such, only the differences between the PHY 300 and the PHY 500 are discussed in further detail.

The radio receiver 204 may calculate one or more signal metrics, such as but not limited to, the mean of, the total energy of, the average power of, the mean square of, the instantaneous power of, the root mean square of, the variance of, the norm of, and/or any other suitable signal metric to provide some examples, of the received communication signals 250.1 through 250.N, downconverted communication signals 252.1 through 252.N, and/or any intermediate communication signal used to produce the downconverted communication signals 252.1 through 252.N from the received communication signals 250.1 through 250.N, herein referred to as wide band statistical information. For example, the radio receiver 204 may calculate one or more receive signal strength indicators (RSSI) of the received communication signals 250.1 through 250.N, downconverted communication signals 252.1 through 252.N, and/or any intermediate communication signal used to produce the downconverted communication signals 252.1 through 252.N from the received communication signals 250.1 through 250.N, herein referred to as radio RSSI statistical information. The radio receiver 204 calculates the wide band statistical information prior to the receive filter 304. The wide band statistical information may be gathered or calculated on the received communication signals 250.1 through 250.N in its entirety before filtering by the receive filter 304. As such, the radio receiver 204 may calculate the wide band statistical information based on characteristics of one or more adjacent channels included within each of the received communication signals 250.1 through 250.N.

The radio receiver 204 may communicate the wide band statistical information to a single stream selection signal generator 502 using wide band statistical information signals 552.1 through 552.P. In an exemplary embodiment, the wide band statistical information signals 552.1 through 552.P may represent analog and/or digital wide band statistical information signals. As such, the single stream selection signal generator 502 may include an analog to digital converter to convert an analog representation of the wide band statistical information signals 552.1 through 552.P to a digital representation. The single stream selection signal generator 502 processes the wide band statistical information signals 552.1 through 552.P to produce a stream selection signal 550 to indicate to a switch module 506 to select the encoded single stream communication signal 354 from the digital communication signals 350.1 through 350.N and/or the encoded multiple stream communication signals 352.1 through 352.N.

In an exemplary embodiment, the stream selection signal 550 may indicate to the switch module 506 to switch the encoded single stream communication signal 354 to the digital communication signals 350.1 through 350.N and/or the encoded multiple stream communication signals 352.1 through 352.N corresponding to a downconverted communication signal 252.1 through 252.N having a largest or greatest power level based upon statistical RSSI information from the radio receiver 204 via the wide band statistical information signals 552.1 through 552.P. For example, if the single stream selection signal generator 502 determines that the downconverted communication signal 252.1 has the greatest power level, the stream selection signal 550 may indicate to the switch module 306 to switch the encoded single stream communication signal 354 to the digital communication signal 350.1 and/or the encoded multiple stream communication signal 352.1. In another exemplary embodiment, the single stream selection signal generator 502 may additionally provide hysteresis. Hysteresis prevents the switch module 506 from constantly switching between one or more of the digital communication signals 350.1 through 350.N and/or one or more of the encoded multiple stream communication signals 352.1 through 352.N when the wide band statistical information among the received communication signals 250.1 through 250.N, downconverted communication signals 252.1 through 252.N, and/or any intermediate communication signal used to produce the downconverted communication signals 252.1 through 252.N from the received communication signals 250.1 through 250.N are relatively close. In other words, the stream selection signal 550 may indicate to the switch module 506 to switch the encoded single stream communication signal 354 to a corresponding digital communication signal 350.1 through 350.N and/or a corresponding encoded multiple stream communication signal 352.1 through 352.N only if the wide band statistical information exceeds a previously calculated wide band statistical information by a predetermined amount. For example, the stream selection signal 550 may indicate to the switch module 506 to switch the encoded single stream communication signal 354 to a corresponding digital communication signal 350.1 through 350.N and/or a corresponding encoded multiple stream communication signal 352.1 through 352.N only if statistical RSSI information for a corresponding received communication signal 250.1 through 250.N, a corresponding downconverted communication signal 252.1 through 252.N, and/or a corresponding intermediate communication signal used to produce the downconverted communication signals 252.1 through 252.N from the received communication signals 250.1 through 250.N exceeds a previously measured statistical RSSI information by a predetermined amount. In a further exemplary embodiment, the stream selection signal 550 may indicate to the switch module 506 to switch the encoded single stream communication signal 354 if the wide band statistical information exceeds a predetermined amount regardless of the wide band statistical information of the previously calculated wide band statistical information. In another further exemplary embodiment, at least some of the functionality of the single stream selection signal generator 502 as described above may be included in the switch module 506.

Figure 6:
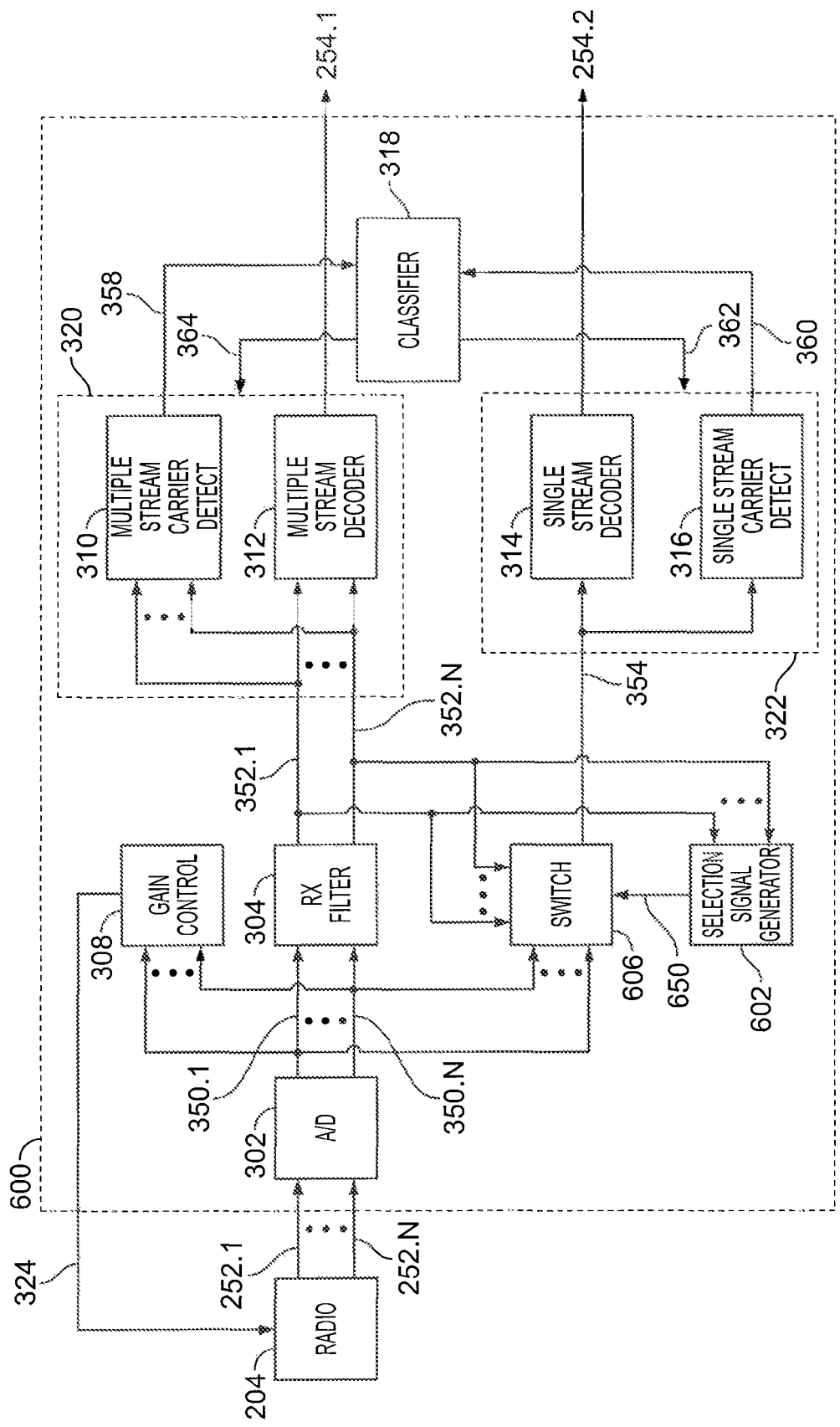
FIG. 6 illustrates a block diagram of a physical layer interface (PHY) according to a fourth exemplary embodiment of the present invention.

FIG. 6 illustrates a block diagram of a physical layer interface (PHY) according to a fourth exemplary embodiment of the present invention. A PHY 600 provides an interface between a media access controller, such as the MAC 208, and a communication channel, such as the communication channel 104, according to the known single stream communications standard and/or the known multiple stream communications standard. The PHY 600 may represent an exemplary embodiment of the PHY 206 as shown in FIG. 2 and operates in a substantially similar manner as the PHY 300 as shown in FIG. 3. As such, only the differences between the PHY 300 and the PHY 600 are discussed in further detail.

A single stream selection signal generator 602 may calculate one or more signal metrics, such as but not limited to the mean of, the total energy of, the average power of, the mean square of, the instantaneous power of, the root mean square of, the variance of, the norm of, or any other suitable signal metric to provide some examples, of the encoded multiple stream communication signal 352.1 through 352.N, herein referred to as narrow band statistical information. For example, the single stream selection signal generator 602 may calculate the statistics of the communication channel 104. The single stream selection signal generator 602 calculates the narrow band statistical information after to the receive filter 304. The single stream selection signal generator 602 may calculate the narrow band statistical information based on characteristics of one or more desired channels included within each of the encoded multiple stream communication signal 352.1 through 352.N.

The single stream selection signal generator 602 processes the narrow band statistical information to produce a stream selection signal 650 to indicate to a switch module 606 to select the encoded single stream communication signal 354 from the digital communication signals 350.1 through 350.N and/or the encoded multiple stream communication signals 352.1 through 352.N. In an exemplary embodiment, the single stream selection signal generator 602 may additionally provide hysteresis. Hysteresis prevents the switch module 606 from constantly switching between one or more of the digital communication signals 350.1 through 350.N and/or one or more of the encoded multiple stream communication signals 352.1 through 352.N when the narrow band statistical information among the encoded multiple stream communication signals 352.1 through 352.N are relatively close. In other words, the stream selection signal 650 may indicate to the switch module 606 to switch the encoded single stream communication signal 354 to a corresponding digital communication signal 350.1 through 350.N and/or a corresponding encoded multiple stream communication signal 352.1 through 352.N only if the narrow band statistical information exceeds a previously calculated narrow band statistical information by a predetermined amount. In a further exemplary embodiment, the stream selection signal 650 may indicate to the switch module 606 to switch the encoded single stream communication signal 354 if the narrow band statistical information exceeds a predetermined amount regardless of the narrow band statistical information of the previously calculated narrow band statistical information. In another further exemplary embodiment, at least some of the functionality of the single stream selection signal generator 602 as described above may be included in the switch module 606.

Exemplary Operation of the Communications Environments

Figure 7:
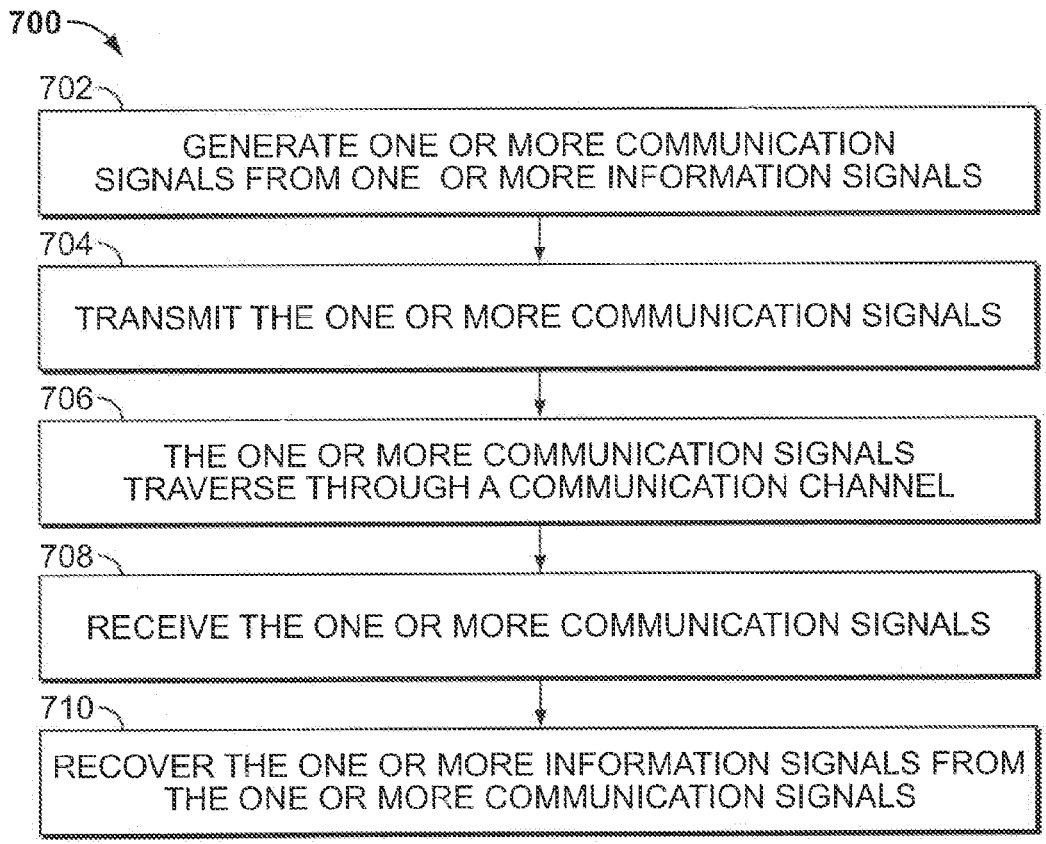
FIG. 7 is a flowchart of exemplary operational steps of a communications environment according to an aspect of the present invention.

FIG. 7 is a flowchart 700 of exemplary operational steps of a communications environment according to an aspect of the present invention. The invention is not limited to this operational description. Rather, it will be apparent to persons skilled in the relevant art(s) from the teachings herein that other operational control flows are within the scope and spirit of the present invention. The following discussion describes the steps in FIG. 7.

At step 702, one or more communication signals, such as the transmitted communication signal 152 and/or the transmitted communication signal 162.1 through 162.I, is generated from one or more information signals as received from one or more transmitter user devices, such as the information signals 150.1 through 150.K and/or the information signals 160.1 through 160.K, by a communications transmitter, such as the communications transmitter 102 or the communication transmitter 108. The transmitter user devices may include, but are not limited to, personal computers, data terminal equipment, telephony devices, broadband media players, personal digital assistants, software applications, or any other medium capable of transmitting or receiving data. The communications transmitter encodes the one or more information signals according to a known single stream communications standard, such as, but not limited to, the IEEE 802.11a™ standard, the IEEE 802.11b™ standard, the IEEE 802.11g™ standard, and/or any other suitable single stream communications standard and/or a known multiple stream communications standard, such as, but not limited to, the IEEE 802.11n™ standard, and/or any other suitable multiple stream communications standard to produce the one or more communication signals.

At step 704, the one or more communication signals from step 702 are transmitted by the communications transmitter to a communications receiver, such as the communications receiver 106. The communications transmitter may include a single transmit antenna to transmit the communication signal from step 702 as a single stream communication signal. In other words, the communications transmitter encode the one or more information signals according to the known single stream communications standard to produce the one or more communication signals from step 702 followed by transmitting the communication signal as the single stream communication signal using the single transmit antenna. Alternatively, the communication transmitter may include multiple transmit antennas to transmit one or more communication signals from step 702 as a multiple stream communication signal. In other words, the communications transmitter may encode the one or more information signals according to the known multiple stream communications standard to produce the communication signal followed by transmitting the communication signal as the multiple stream communication signal using the multiple transmit antennas.

At step 706, the one or more communication signals from step 704 traverse through a communication channel, such as the communication channel 104. The communication channel may include, but is not limited to, a microwave radio link, a satellite channel, a fiber optic cable, a hybrid fiber optic cable system, or a copper cable to provide some examples. The communication channel contains a propagation medium that the one or more communication signals from step 704 pass through before reception by the communications receiver. The propagation medium of the communication channel introduces interference and/or distortion into the communication signal. For example, noise such as, but not limited to, thermal noise, burst noise, impulse noise, interference, signal strength variations known as fading, phase shift variations, to provide some examples, may introduce interference and/or distortion into the communication signal. In addition, the propagation medium of the communication channel may cause the one or more communication signals from step 704 to reach the communications receiver by multiple communication paths, reflecting from different objects, surface areas, surface boundaries, and interfaces in the communications environment. Potential causes of multipath propagation may include, but are not limited, to atmospheric ducting, ionospheric reflection and/or refraction, and/or reflection from terrestrial objects such as mountains and/or buildings to provide some examples.

At step 708, the one or more communication signals from step 706 are received by the communications receiver. The communications receiver includes multiple receive antennas to receive the communication signal as either a single stream communication signal and/or a multiple stream communication signal. In an exemplary embodiment, the communications receiver includes two receiving antenna to capture the one or more communication signals from step 706. The communication receiver may receive multiple communication paths traversed by the one or more communication signals from step 706 resulting from the multipath propagation introduced by the communication channel. For example, the communication receiver may receive the multiple communication paths of the one or more communication signals from step 706 transmitted as a single stream communication signal as it traverses through the communication channel. Likewise, the communication receiver may receive the multiple communication paths of the one or more communication signals from step 706 transmitted as a multiple stream communication signal as it traverses through the communication channel.

At step 710, one or more information signals are recovered from the one or more communication signals from step 708 by the communications receiver to produce one or more recovered information signals for one or more receiver user devices. The receiver user devices may include, but are not limited to, personal computers, data terminal equipment, telephony devices, broadband media players, personal digital assistants, software applications, or any other medium capable of transmitting or receiving data. The communications receiver operates upon the one or more communication signals from step 708 according to the known single stream communications standard and/or the known multiple stream communications standard to recover the one or more information signals.

Exemplary Operation of the Communications Receiver

Figure 8:
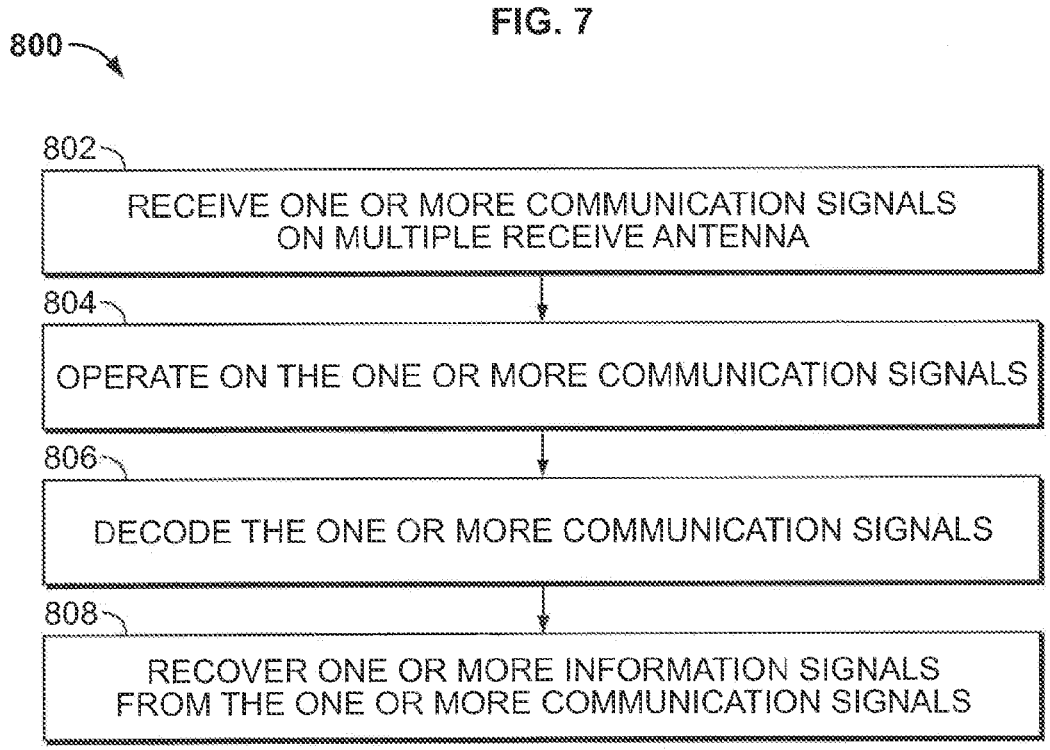
FIG. 8 is a flowchart of exemplary operational steps of a communications receiver according to an aspect of the present invention.

FIG. 8 is a flowchart 800 of exemplary operational steps of a communications receiver according to an aspect of the present invention. In other words, FIG. 8 further defines steps 708 and 710 as shown in FIG. 7. The invention is not limited to this operational description. Rather, it will be apparent to persons skilled in the relevant art(s) from the teachings herein that other operational control flows are within the scope and spirit of the present invention. The following discussion describes the steps in FIG. 8.

At step 802, one or more communication signals, such the received communication signals 154.1 through 154.N and/or the received communication signals 164.1 through 164.N to provide some examples, are received on multiple receive antennas, such as the receive antenna 202.1 through 202.N to provide some examples, to produce one or more received communication signals, such as the received communication signals 250.1 through 250.N to provide some examples. More specifically, the communication signal is received by the multiple receive antennas as it traverses through a communication channel, such as the communication channel 104. The communication signal may include one or more single stream communication signals, one or more multiple stream communication signals, and/or any combination thereof. In an exemplary embodiment, the communications receiver includes two receive antennas. However, this example is not limiting, the receive antenna may include any suitable number of receive antenna without departing the scope and spirit of the present invention.

At step 804, the one or more communication signals from step 802 are operated on by a radio receiver, such as the radio receiver 204 to provide an example, to produce one or more downconverted communication signals, such as the downconverted communication signals 252.1 through 252.N to provide an example. For example, the radio receiver may downconvert the one or more communication signals from step 802 to baseband or any suitable intermediate frequency (IF) to produce the downconverted communication signals. The radio receiver may additionally perform functions such as, but not limited to, filtering, and/or automatic gain control (AGC). However, those skilled in the relevant art(s) will recognize that step 804 is optional, the operational control may flow directly from step 802 to step 806 for a baseband and/or a near baseband communication.

At step 806, the one or more communication signals from step 804 are decoded to produce one or more decoded communication signals, such as the decoded communication signals 254.1 through 254.M to provide an example. Alternatively, the one or more communication signals from step 802 may be directly decoded to produce the one or more decoded communication signals. The one or more communication signals from step 802 and/or from step 804 may be decoded using a physical layer interface (PHY), such as the PHY 206. More specifically, the PHY decodes the one or more communication signals from step 802 and/or from step 804 to produce the decoded communication signal according to the known single stream communications standard and/or the known multiple stream communications standard. The PHY determines whether the one or more communication signals from step 802 and/or from step 804 includes a single stream communication signal or a multiple stream communication signal. If the one or more communication signals from step 802 and/or from step 804 includes the single stream communication signal, the PHY operates upon the communication signal according to the known single stream communications standard. If the one or more communication signals from step 802 and/or from step 804 includes the multiple stream communication signal, the PHY operates upon the communication signal according to the known multiple stream communications standard.

At step 808, one or more information signals for one or more receiver user devices, such as the recovered information signals 256.1 through 256.K, are recovered by operating on the communication signal from step 806 according to the known single stream communications standard and/or the known multiple stream communications standard. The one or more information signals may be recovered from the one or more communication signals from step 806 using a media access controller (MAC), such as the MAC 208 to provide an example. The MAC may process the one or more communication signals from step 806 according to the known single stream communications standard and/or the known multiple stream communications standard to produce one or more recovered information signal. The MAC may additionally, without limitation, provide addressing and channel access control mechanisms that make it possible for multiple terminals or network nodes to communicate within the multipoint network, typically a local area network (LAN), metropolitan area network (MAN), or a wide area network (WAN).

Exemplary Operation of the Physical Layer Interfaces

Figure 9:
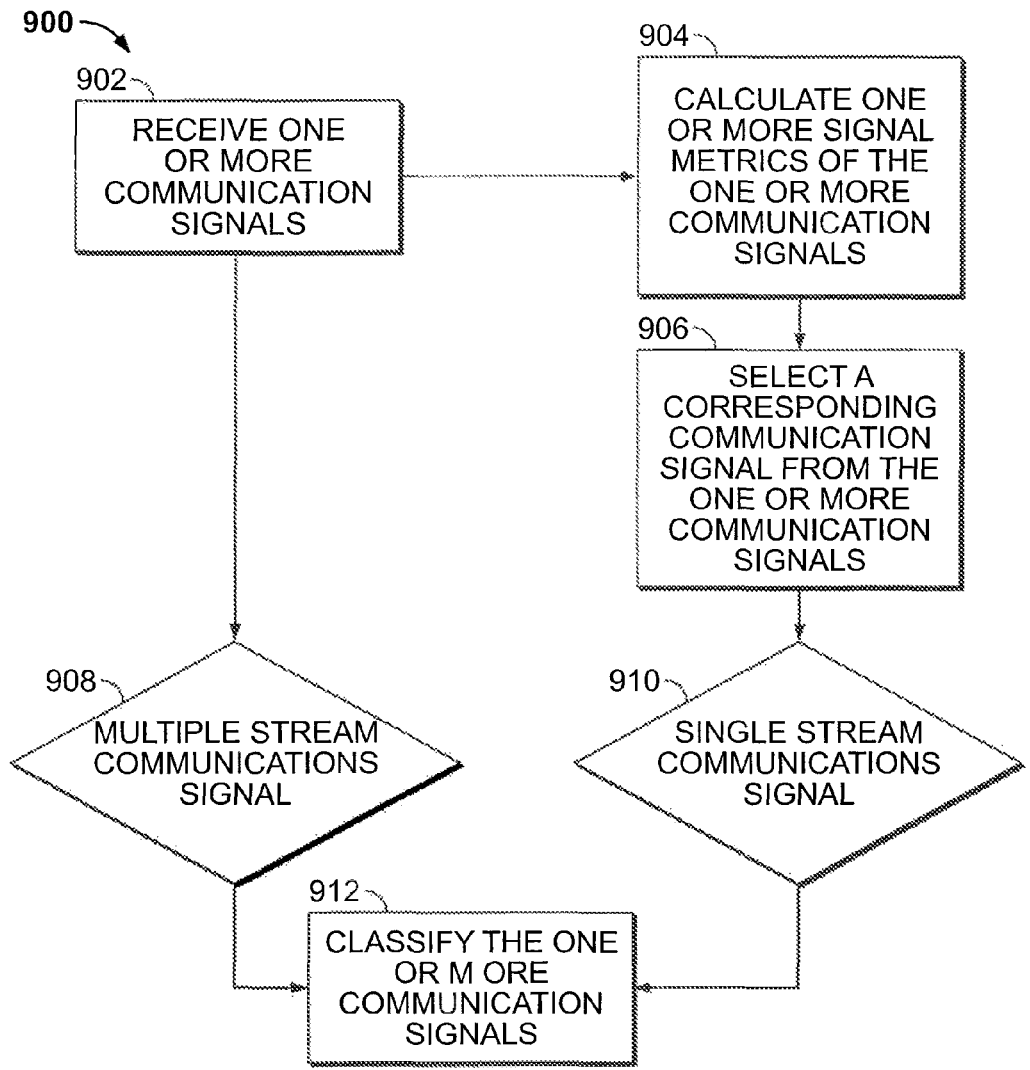
FIG. 9 is a flowchart of exemplary operational steps of a physical layer interface (PHY) according to an aspect of the present invention.

FIG. 9 is a flowchart 900 of exemplary operational steps of a physical layer interface (PHY) according to an aspect of the present invention. In other words, FIG. 9 further defines step 806 as shown in FIG. 8. The invention is not limited to this operational description. The invention is not limited to this operational description. Rather, it will be apparent to persons skilled in the relevant art(s) from the teachings herein that other operational control flows are within the scope and spirit of the present invention. The following discussion describes the steps in FIG. 9.

At step 902, one or more communication signals, such as the downconverted communication signals 252.1 through 252.N, is received by a PHY, such as the PHY 206 to provide an example. The one or more communication signals may include one or more single stream communication signals that have been transmitted according to a known single stream communications standard, one or more multiple stream communication signals that have been transmitted according to a known multiple stream communications standard, and/or any combination thereof. In an exemplary embodiment, the one or more communication signals are transmitted at baseband or near baseband by a communications transmitter, such as the communications transmitter 102 and/or the communications transmitter 108 to provide some examples. Alternatively, the one or more communication signals may be downconverted to an intermediate frequency or baseband by a radio receiver, such as the radio receiver 204 to provide an example, before being received by the PHY.

At step 904, statistical information, such as, but not limited to, power level, wide band statistical information and/or narrow-band statistical information to provide some examples, may be gathered or calculated on the one or more communication signals from step 902. For example, a power level of the one or more communication signals from step 902 may be determined by a gain control module, such as the gain control module 308 to provide an example. Likewise, the radio receiver may calculate one or more signal metrics, such as but not limited to, the mean of, the total energy of, the average power of, the mean square of, the instantaneous power of, the root mean square of, the variance of, the norm of, and/or any other suitable signal metric to provide some examples, of the one or more communication signals from step 902. Similarly, a single stream selection signal generator, such as the single stream selection signal generator 602 to provide an example, may calculate one or more signal metrics, such as but not limited to the mean of, the total energy of, the average power of, the mean square of, the instantaneous power of, the root mean square of, the variance of, the norm of, or any other suitable signal metric to provide some examples, of the one or more communication signals from step 902. Likewise, one or more external sources such as, but not limited to, one or more receiver user devices or a higher networking layer such as a MAC layer or an application layer to provide some examples, may gather or calculate statistical information regarding the one or more communication signals from step 902.

At step 906, a corresponding communication signal from the one or more communication signals from step 902 is selected based upon the statistical information from step 904. A switch, such as the switching module 304, the switching module 406, the switching module 506, and/or the switching module 606 to provide some examples, may select the corresponding communication signal from the one or more communication signals from step 902.

At step 908, a determination is made whether the one or more communication signals from step 902 includes the multiple stream communication signal. A multiple stream carrier detection module, such as the multiple stream carrier detection module 310 to provide an example, detects a presence and/or absence of the multiple stream communication signal embedded within the communications signal.

At step 910, a determination is made whether the one or more communication signals from step 902 includes the single stream communication signal. A single stream carrier detection module, such as the single stream carrier detection module 316 to provide an example, detects a presence and/or absence of the single stream communication signal embedded within the communications signal.

At step 912, a classification of the one or more communication signals from step 902 is determined based upon the determination of step 908 and the determination of step 910. A stream classifier module, such as the stream classifier module 318 to provide an example, determines whether the one or more communication signals from step 902 include a single stream communication signal and/or a multiple stream communication signal based upon the determination of step 908 and the determination of step 910. If the determination of step 908 indicates the presence of the multiple stream communication signal in the one or more communication signals from step 902. A multiple stream decoder module, such as the multiple stream decoder module 312, decodes the one or more communication signals from step 902 according to a known multiple stream communications standard to produce one or more decoded communication signals, such as the decoded communication signal 254.1 to provide an example. If the determination of step 910 indicates the presence of the single stream communication signal in the one or more communication signals from step 902. A single stream decoder module, such as the single stream decoder module 314 to provide an example, may decode the corresponding communication signal from step 906 according to the known single stream communications standard to produce one or more decoded communication signals, such as the decoded communication signal 254.2 to provide an example. If the determination of step 908 indicates the presence of the multiple stream communication signal in the one or more communication signals from step 902 and the determination of step 910 indicates the presence of the single stream communication signal in the one or more communication signals from step 902. The stream classifier module may default to either the multiple stream processing module or the single stream processing module.

Spur Avoidance Via Static Changes to PHY Clock Frequency

Figure 10:
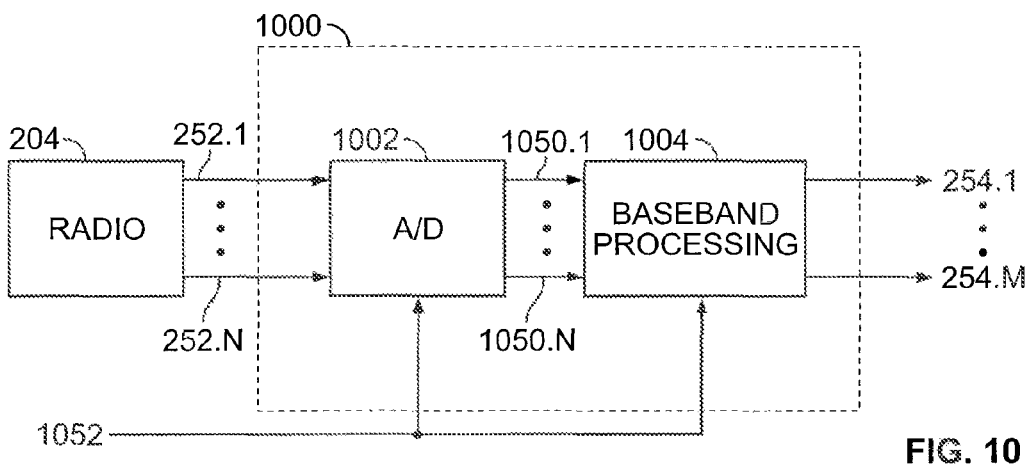
FIG. 10 illustrates a block diagram of another physical layer interface (PHY) according to an exemplary embodiment of the present invention.

FIG. 10 illustrates a block diagram of another physical layer interface (PHY) according to an exemplary embodiment of the present invention. A PHY 1000 provides an interface between a media access controller, such as the MAC 208, and a communication channel, such as the communication channel 104, in accordance with the known single stream communications standard and/or the known multiple stream communications standard. The PHY 1000 may represent an exemplary embodiment of the PHY 206 as shown in FIG. 2.

As shown in FIG. 10, the PHY 1000 includes an analog to digital converter (ADC) 1002 and a baseband processing module 1004. The ADC 1002 converts the downconverted communication signals 252.1 through 252.N from an analog representation to a digital representation to produce digital communication signals 1050.1 through 1050.N based on a nominal PHY clock 1052 operating at a frequency of $f_{nom}$. In an exemplary embodiment, the nominal PHY clock 1052 has an operating frequency of 40 MHz. More specifically, the ADC 1002 samples the downconverted communication signals 252.1 through 252.N at a rate of $f_{nom}$ samples per second to produce the digital communication signals 1050.1 through 1050.N.

The baseband processing module 1004 produces the decoded communication signals 254.1 through 254.M based on the digital communication signals 1050.1 through 1050.N. More specifically, the baseband processing module 1004 processes the digital communication signals 1050.1 through 1050.N according to the known single stream communications standard and/or the known multiple stream communications standard using the nominal PHY clock 1052. In other words, the known single stream communications standard and/or the known multiple stream communications standard allows the baseband processing module 1004 to process the digital communication signals 1050.1 through 1050.N at a rate of $f_{nom}$ samples per second. The functionality of the baseband processing module 1004 may include, without limitation, filtering of, adjusting the magnitude of, detecting the presence of, demodulating of, and/or decoding of the digital communication signals 1050.1 through 1050.N.

Figure 11A:
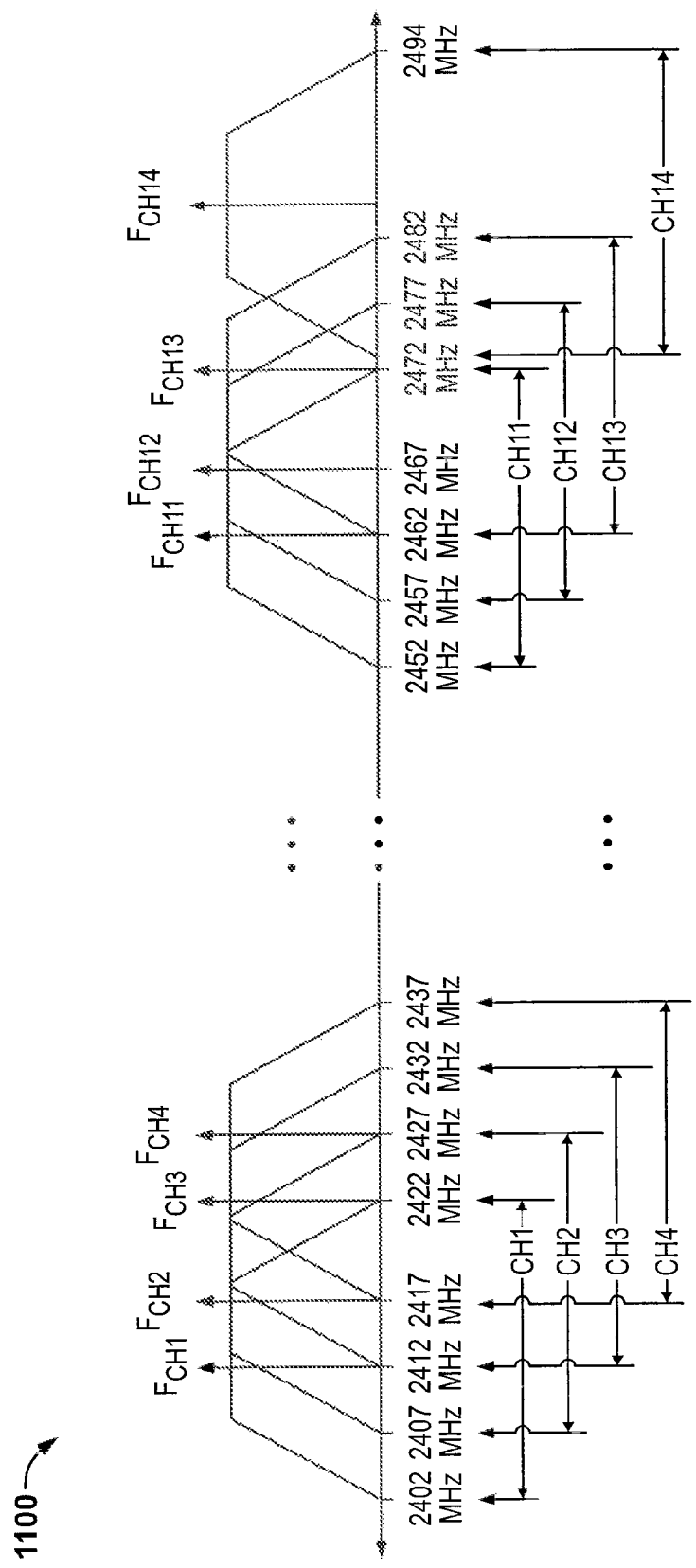
FIG. 11A illustrates a multi-channel communication signal according to an exemplary embodiment of the present invention.

FIG. 11A illustrates a multi-channel communication signal according to an exemplary embodiment of the present invention. A multi-channel communication signal 1100 may represent an exemplary embodiment of at least one of the received communication signals 250.1 through 250.N. The multi-channel communication signal 1100 may be received by a communications receiver, such as the communications receiver 106 to provide an example, and processed in accordance with the known single stream communications standard and/or the known multiple stream communications standard.

For demonstrative purposes only, the multi-channel communication signal 1100 may be represented as an IEEE 802.11n™ standard communication signal. However, this example is not limiting, those skilled in the relevant art(s) will recognize that the multi-channel communication signal 1100 may be represented as any suitable communication signal having one or more communication channels without departing from the spirit and scope of the present invention. For example, those skilled in the relevant art(s) may represent the multi-channel communication signal 1100 according to the 802.11a™ standard, the IEEE 802.11b™ standard, and/or the IEEE 802.11g™ standard differently in accordance with the teachings herein without departing from the spirit and scope of the present invention.

The multi-channel communication signal 1100 includes multiple communication channels, denoted as CH1 through CH14. Each communication channel may include one or more spatial streams, such as the transmitted communication signal 152 and/or the transmitted communication signals 162.1 through 162.N, carrying one or more information signals, such as the information signals 150.1 through 150.K and/or the information signals 160.1 through 160.K. For example, the IEEE 802.11n™ standard permits up to four spatial streams per communication channel. The communications receiver receives each communication channel on a corresponding carrier frequency, denoted as $FCH_1$ through $FCH_{14}$. For example, the communications receiver receives the communication channel CH1 on a carrier frequency of 2412 MHz. In this exemplary embodiment, the communications receiver receives multi-channel communication signal 1100 in a 20 MHz mode of operation according to IEEE 802.11n™ standard. However, this example is not limiting, those skilled in the relevant art(s) will recognize that the communications receiver may receive the multi-channel communication signal 1100 in any mode according to the single stream communications standard, the multiple stream communications standard, or any combination thereof-without departing from the spirit and scope of the present invention. For example, the communications receiver receives multi-channel communication signal 1100 in a 40 MHz mode of operation according to IEEE 802.11n™ standard. In the 20 MHz mode of operation, the IEEE 802.11n™ standard allocates each communication channel a bandwidth of 20 MHz. For example, the IEEE 802.11n™ standard allocates the frequency spectrum from 21102 MHz to 2422 MHz to the communication channel CH1. The IEEE 802.11n™ standard carrier frequency and the IEEE 802.11n™ standard spectrum allocation for each communication channel, CH1 through CH14, in the multi-channel communication signal 1100 is shown below:

| CHANNEL | LOWER BOUND (MHz) | CARRIER FREQUENCY (MHz) | UPPER BOUND (MHz) |
|---|---|---|---|
| CH1 | 2402 | 2412 | 2422 |
| CH2 | 2407 | 2417 | 2427 |
| CH3 | 2412 | 2422 | 2432 |
| CH4 | 2422 | 2427 | 2437 |
| CH5 | 2427 | 2432 | 2442 |
| CH6 | 2432 | 2437 | 2447 |
| CH7 | 2437 | 2442 | 2452 |
| CH8 | 2442 | 2447 | 2457 |
| CH9 | 2447 | 2452 | 2462 |
| CH10 | 2452 | 2457 | 2467 |
| CH11 | 2457 | 2462 | 2472 |
| CH12 | 2462 | 2467 | 2477 |
| CH13 | 2467 | 2472 | 2482 |
| CH14 | 2474 | 2484 | 2494 |

A bandwidth of each communication channel may be represented as the difference between the upper bound and the lower bound.

Figure 11B:
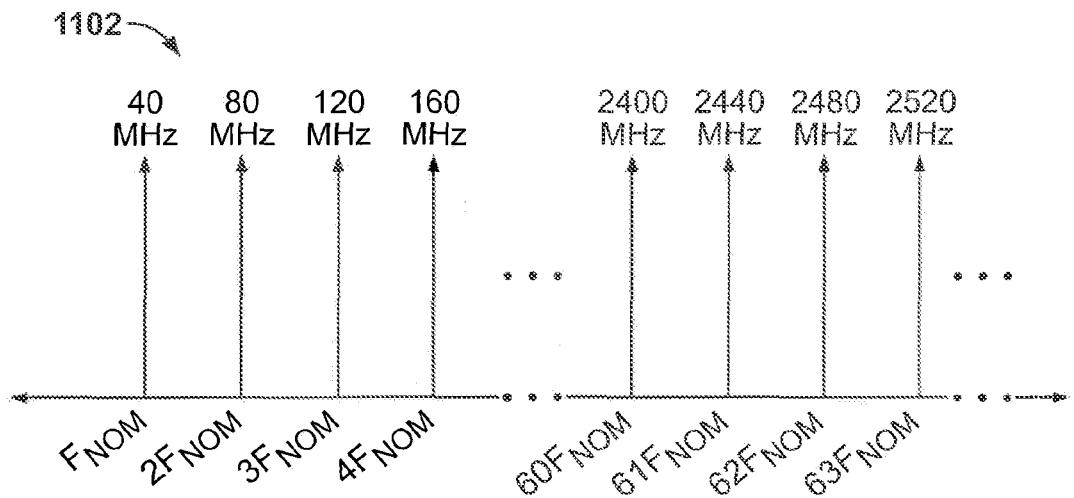
FIG. 11B illustrates a clocking signal used in a physical layer interface (PHY) according to an exemplary embodiment of the present invention.

FIG. 11B illustrates a clocking signal used in a physical layer interface (PHY) according to an exemplary embodiment of the present invention. A PHY clock 1102 may represent an exemplary embodiment of the nominal PHY clock 1052 operating at the frequency of $f_{nom}$. A PHY, such as the PHY 1000, may utilize the PHY clock 1102 to sample a multi-channel communication signal, such as the downconverted communication signals 252.1 through 252.N, using an analog to digital converter (ADC), such as the ADC 1002, and/or to decode a sampled multi-channel communication signal, such as the digital communication signals 1050.1 through 1050.N, using a baseband processing module, such as the baseband processing module 1004.

For demonstrative purposes only, the PHY clock 1102 may operate at a frequency $f_{nom}$ of 40 MHz. However, this example is not limiting, those skilled in the relevant art(s) will recognize that the PHY clock 1102 may have any suitable operating frequency without departing from the spirit and scope of the present invention. For example, those skilled in the relevant art(s) may implement a fast PHY clock having a frequency $f_{nom}$ of 80 MHz according to the 802.11n™ standard differently in accordance with the teachings herein without departing from the spirit and scope of the present invention.

As shown in FIG. 11B, the PHY clock 1102 includes the frequency $f_{nom}$ and one or more integer multiples of the frequency $f_{nom}$ referred to as harmonic frequencies. For example, the PHY clock 1102 includes the $60^{th}$ harmonic frequency of the PHY clock 1102, denoted as 60 $f_{nom}$, having a frequency of 2400 MHz, the $61^{st}$ harmonic frequency of the PHY clock 1102, denoted as 61 $f_{nom}$, having a frequency of 2440 MHz, the $62^{nd}$ harmonic frequency of the PHY clock 1102, denoted as 62 $f_{nom}$ having a frequency of 2480 MHz, and the $63^{rd}$ harmonic frequency of the PHY clock 1102, denoted as 63 $f_{nom}$, having a frequency of 2520 MHz. However, this example is not limiting, those skilled in the relevant art(s) will recognize that the PHY clock 1102 may include a greater or a lesser number of harmonic frequencies without departing from the spirit and scope of the present invention.

Figure 11C:
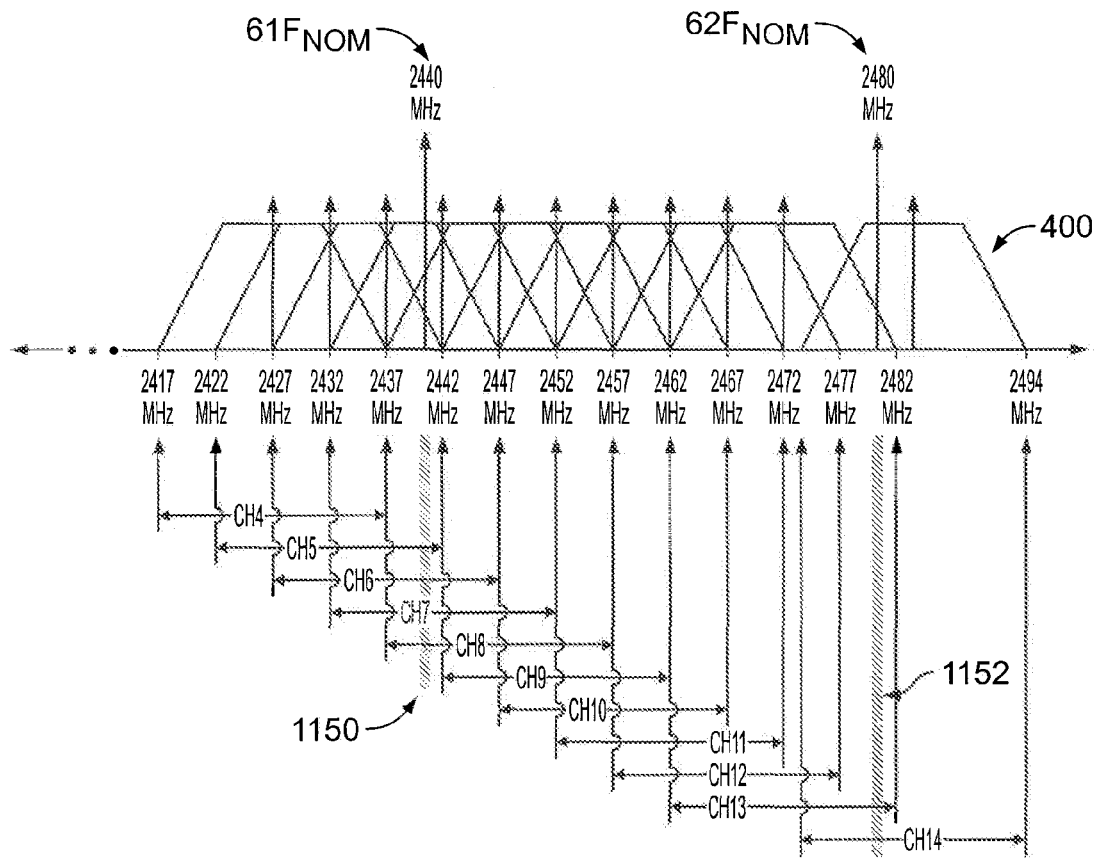
FIG. 11C illustrates an effect of spurious clocking signals resulting from the clocking signal of the physical layer interface (PHY) according to an exemplary embodiment of the present invention.

FIG. 11C illustrates an effect of spurious clocking signals resulting from the clocking signal of the physical layer interface (PHY) according to an exemplary embodiment of the present invention. A communications receiver, such as the communications receiver 106 to provide an example, receives a multi-channel communication signal, such as the multi-channel communication signal 1100, and processes the multi-channel communication signal in accordance with the known single stream communications standard and/or the known multiple stream communications standard using a PHY clock, such as the PHY clock 1102, operating at a frequency $f_{nom}$ of 40 MHz. However, this example is not limiting, those skilled in the relevant art(s) will recognize that the PHY clock 1102 may have any suitable operating frequency without departing from the spirit and scope of the present invention. For example, those skilled in the relevant art(s) may implement a fast PHY clock having a frequency $f_{nom}$ of 80 MHz according to the 802.11n™ standard differently in accordance with the teachings herein without departing from the spirit and scope of the present invention.

As shown in FIG. 11C, the $61^{st}$ harmonic frequency of the PHY clock 1102, denoted as 61 $f_{nom}$, having a frequency of 2440 MHz may be embedded into the multi-channel communication signal 1100. As shown by at risk region 450, the $61^{st}$ harmonic frequency of the PHY clock 1102 is embedded onto the communication channels CH5 through CH8. As a result, the $61^{st}$ harmonic frequency may substantially degrade performance of the PHY when recovering the one or more spatial streams from communication channels CH5 through CH8. Likewise, the $62^{nd}$ harmonic frequency of the PHY clock 1102, denoted as 62 $f_{nom}$, having a frequency of 2480 MHz may be embedded into the multi-channel communication signal 1100. As shown by at risk region 452, the $62^{nd}$ harmonic frequency of the PHY clock 1102 is embedded onto the communication channels CH13 and CH14. As a result, the $62^{nd}$ harmonic frequency may substantially degrade performance of the PHY when recovering the one or more spatial streams from communication channels CH13 through CH14. Therefore, the $61^{st}$ harmonic frequency of the PHY clock 1102 and/or the $62^{nd}$ harmonic frequency of the PHY clock 1102 may substantially degrade performance of the PHY when recovering the one or more spatial streams from communication channels CH5 through CH8 and/or CH13 through CH14. The $61^{st}$ harmonic frequency of the PHY clock 1102 and/or the $62^{nd}$ harmonic frequency of the PHY clock 1102 does not degrade performance of the PHY when recovering the one or more spatial streams from communication channels CH1 through CH4 and/or CH9 through CH12.

Figure 12A:
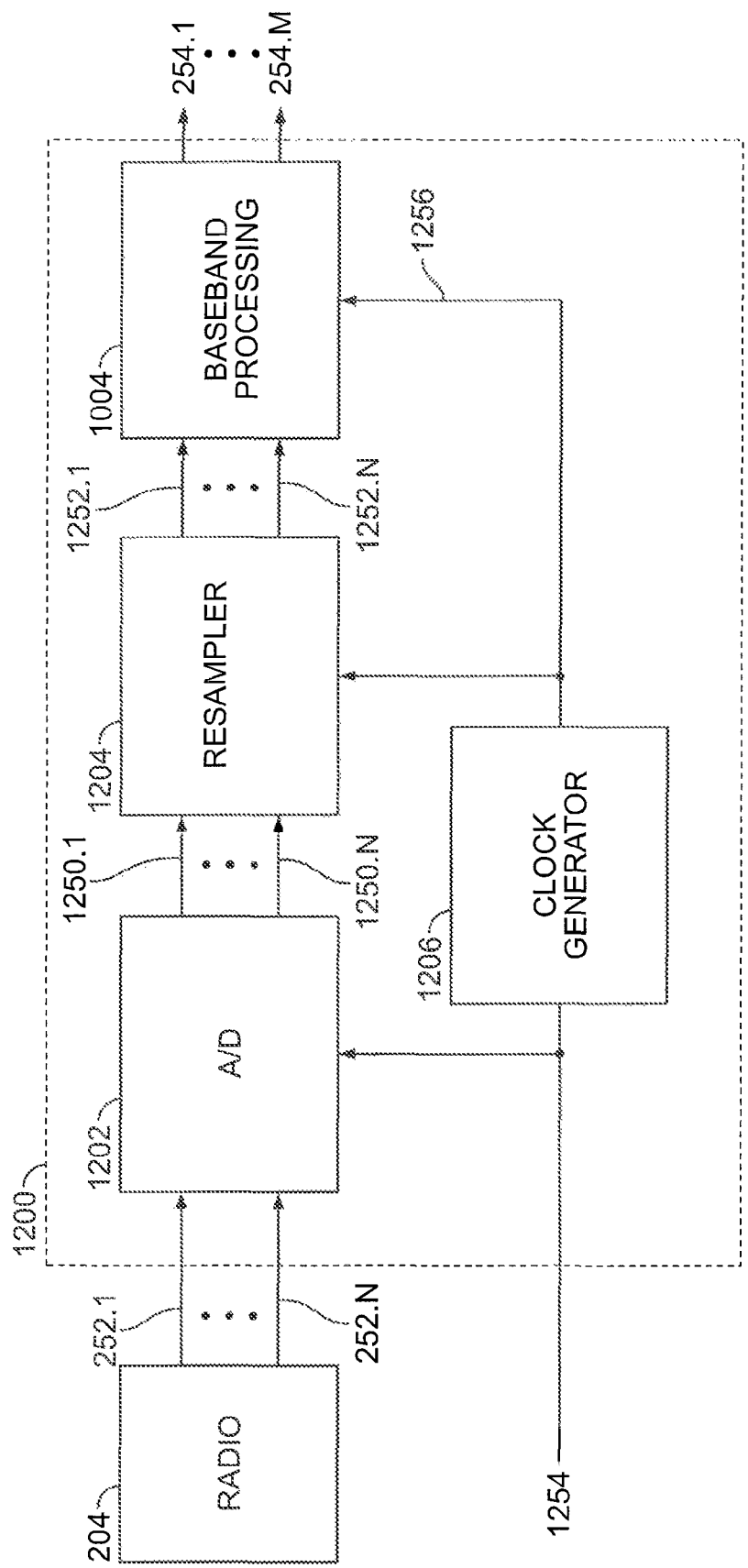
FIG. 12A illustrates a block diagram of a physical layer interface (PHY) according to a further exemplary embodiment of the present invention.

FIG. 12A illustrates a block diagram of a physical layer interface (PHY) according to a further exemplary embodiment of the present invention. A PHY 1200 provides an interface between a media access controller, such as the MAC 208, and a communication channel, such as the communication channel 104, according to the known single stream communications standard and/or the known multiple stream communications standard. The PHY 1200 may represent an exemplary embodiment of the PHY 206 as shown in FIG. 2.

As shown in FIG. 12A, the PHY 1200 includes an analog to digital converter (ADC) 1202, a resampler module 1204, a clock generator module 1206, and the baseband processing module 1004. The ADC 1202 converts the downconverted communication signals 252.1 through 252.N from an analog representation to a digital representation to produce oversampled digital communication signals 1250.1 through 1250.N based on a new PHY clock 1254 operating at a frequency of $f_{new}$. More specifically, the ADC 1202 samples the downconverted communication signals 252.1 through 252.N at a frequency of $f_{new}$ to produce the oversampled digital communication signals 1250.1 through 1250.N based on a new PHY clock 1254.

The resampler module 1204 resamples the oversampled digital communication signals 1250.1 through 1250.N to produce the resampled digital communication signals 1252.1 through 1252.N. More specifically, the resampler module 1204 reduces or decreases a number of samples of the oversampled digital communication signals 1250.1 through 1250.N to produce the resampled digital communication signals 1252.1 through 1252.N using a gated PHY clock 1256. For example, the resampler module decreases the number of samples of each oversampled digital communication signal 1250.1 through 1250.N from $f_{new}$ samples per second to produce each resampled digital communication signal 1252.1 through 1252.N having $f_{nom}$ samples per second. In an exemplary embodiment, the resampler module 1204 resamples the oversampled digital communication signals 1250.1 through 1250.N, wherein each oversampled digital communication signal includes 41 samples per microsecond, to produce the resampled digital communication signals 1252.1 through 1252.N, wherein each resampled digital communication signal includes 40 samples per microsecond. In another exemplary embodiment, the resampler module 1204 processes a first group of samples per second and ignores or holds one or more samples per second from a second group of samples for each oversampled digital communication signal 1250.1 through 1250.N to produce each resampled digital communication signal 1252.1 through 1252.N. In a further exemplary embodiment, each oversampled digital communication signal 1250.1 through 1250.N includes 41 samples per microsecond. For this exemplary embodiment, the resampler module 1204 processes samples 1 through 40 and ignores or holds sample 41 for each oversampled digital communication signal 1250.1 through 1250.N per microsecond.

A clock generator module 1206 produces the gated PHY clock 1256 based on the new PHY clock 1254. More specifically, the clock generator module 1206 produces the gated PHY clock 1256 using a gating function. The gating function allows the resampler module 1204 to resample the oversampled digital communication signals 1250.1 through 1250.N to produce the resampled digital communication signals 1252.1 through 1252.N. More specifically, the gating function produces the gated PHY clock 1256 having a first state whereby the resampler module 1204 processes the first group of samples per second and a second state whereby the resampler module 1204 ignores or holds the second group of samples per second for each resampled digital communication signal 1252.1 through 1252.N to produce each resampled digital communication signal 1252.1 through 1252.N.

The baseband processing module 1004 produces the decoded communication signals 254.1 through 254.M based on the resampled digital communication signals 1252.1 through 1252.N. More specifically, the baseband processing module 1004 processes the resampled digital communication signals 1252.1 through 1252.N according to the known single stream communications standard and/or the known multiple stream communications standard using the gated PHY clock 1256. The baseband processing module 1004 produces the decoded communication signals 254.1 through 254.M throughout the first state of the gated PHY clock 1256 only. The baseband processing module 1004 is inactive or deactivated during the second state of the gated PHY clock 1256.

Figure 12B:
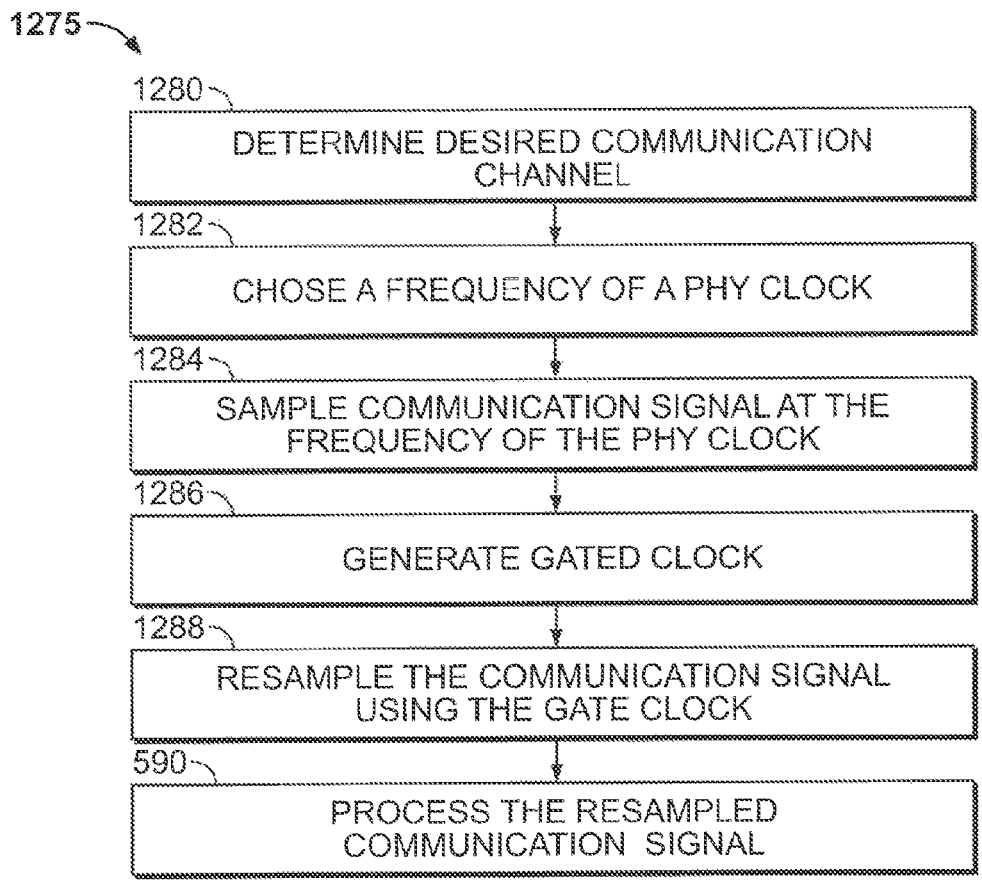
FIG. 12B is a flowchart of exemplary operational steps of the physical layer interface (PHY) according to an aspect of the present invention.

FIG. 12B is a flowchart 1275 of exemplary operational steps of the PHY according to an aspect of the present invention. The invention is not limited to this operational description. Rather, it will be apparent to persons skilled in the relevant art(s) from the teachings herein that other operational control flows are within the scope and spirit of the present invention. The following discussion describes the steps in FIG. 12B.

At step 1280, a multi-channel communication signal, such as the received communication signals 250.1 through 250.N, are received by a radio receiver 204, such as the radio receiver 204. A desired communication channel, such as the communication channel CH1, from the multi-channel communication signal is determined.

At step 1282, a frequency of a PHY clock, such as the new PHY clock 1254, is chosen to substantially minimized noise and/or interference embedded onto the desired communication channel. For example, the frequency of the PHY clock may be chosen as 41 MHz when the desired communication channel corresponds to the communication channel CH1 in accordance with table 1400 as to be discussed in FIG. 14A for a 20 MHz mode of operation according to IEEE 802.11n™ standard and/or 82 MHz when the desired communication channel corresponds to the communication channel CH1 in accordance with table 1450 as to be discussed in FIG. 14B for a 40 MHz mode of operation according to IEEE 802.11n™ standard. However, this example is not limiting, those skilled in the relevant art(s) will recognize that the frequency of the PHY clock may be chosen differently to minimize noise and/or interference embedded onto the desired communication channel of the multi-channel communication signal differently for different known single stream communications standards and/or known multiple stream communications standards in accordance with the teachings herein.

At step 1284, a multi-channel communication signal, such as the downconverted communication signals 252.1 through 252.N to provide an example, is converted from an analog representation to a digital representation to produce an oversampled communication signal, such as the oversampled digital communication signals 1250.1 through 1250.N to provide an example, based on the PHY clock from step 1282. More specifically, an analog to digital converter (ADC), such as the ADC 1202, may sample the multi-channel communication signal to produce the oversampled communication signal according to the PHY clock from step 1282.

At step 1286, a gated PHY clock, such as the gated PHY clock 1256, is generated based on the PHY clock from step 1282. More specifically, a clock generator module, such as the clock generator module 1206, produces the gated PHY clock using a gating function. The gating function allows a resampler module, such as the resampler module 1204, to resample the oversampled communication signal to produce a resampled communication signal. More specifically, the gating function produces the gated PHY clock having a first state whereby the resampler module processes a first group of samples from the oversampled communication signal and a second state whereby the resampler module ignores a second group of samples from the oversampled communication signal and/or holds one or more samples from the first group of samples of the resampled communication signal to produce the resampled communication signal.

At step 1288, the oversampled communication signal from step 1284 is resampled in accordance with the gated PHY clock. The resampler module reduces or decreases a number of samples of the oversampled communication signal to produce the resampled communication signal using the gated PHY clock. For example, the resampler module decreases the number of samples of the oversampled communication signal from $f_{new}$ samples per second to produce the resampled communication signal having $f_{nom}$ samples per second. In an exemplary embodiment, the resampler module resamples the oversampled communication signal, wherein the oversampled communication signal includes 41 samples per microsecond, to produce the resampled communication signal, wherein the resampled communication signal includes 40 samples per microsecond. In another exemplary embodiment, the resampler module processes a first group of samples from the oversampled communication signal from step 1284 during the first state of the gated PHY clock from step 1286 and ignores a second group of samples from the oversampled communication signal from step 1284 and/or holds one or more samples from the first group of samples of the resampled communication signal to produce the resampled communication signal. For this exemplary embodiment, the resampler module processes samples 1 through 40 and ignores sample 41 of the oversampled communication signal or holds sample 40 of the resampled communication signal.

At step 1290, the resampled communication signal from step 1288 is processed according to the known single stream communications standard and/or the known multiple stream communications standard to recover the desired communication channel. The baseband processing module decodes the resampled communication signal from step 1288 according to the known single stream communications standard and/or the known multiple stream communications standard using the gated PHY clock from step 1286. In an exemplary embodiment, the baseband processing module decodes the resampled communication signal from step 1288 throughout the first state of the gated PHY clock from step 1286 while the baseband processing module is inactive or deactivated during the second state of the gated PHY clock from step 1286.

Figure 13A:
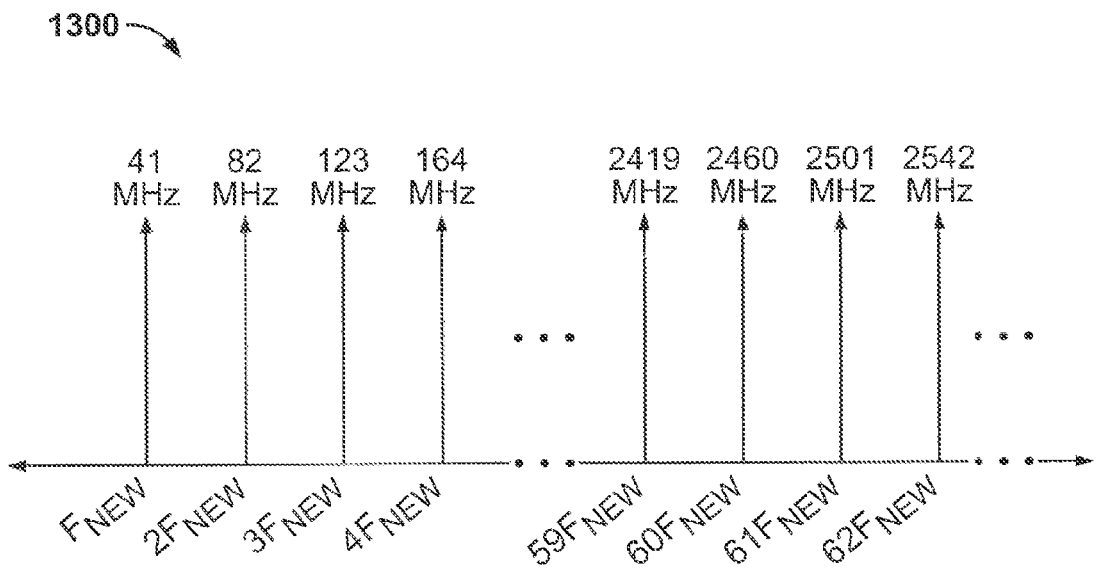
FIG. 13A illustrates a new clock signal used in a physical layer interface (PHY) according to another exemplary embodiment of the present invention.

FIG. 13A illustrates a new clock signal used in a physical layer interface (PHY) according to another exemplary embodiment of the present invention. A clock 1300 may represent an exemplary embodiment of the new PHY clock 1254 operating at the frequency of $f_{new}$. A PHY, such as the PHY 1200, may utilize the clock 1300 to, but not limited to, sample a multi-channel communication signal, such as the multi-channel communication signal 1100, using an analog to digital converter (ADC), such as the ADC 1202, to resample the multi-channel communication signal using a resampler module, such as the resampler module 1204, and/or to decode the multi-channel communication signal using a baseband processing module, such as the baseband processing module 1004.

For demonstrative purposes only, the PHY may utilize a clock 1300 having a fundamental frequency, denoted as $f_{new}$, of 41 MHz. However, this example is not limiting, those skilled in the relevant art(s) will recognize that the clock 1300 may have any suitable fundamental frequency without departing from the spirit and scope of the present invention. For example, those skilled in the relevant art(s) may implement a fast PHY clock having a fundamental frequency of 82 MHz according to the 802.11n™ standard differently in accordance with the teachings herein without departing from the spirit and scope of the present invention.

As shown in FIG. 13A, the clock 1300 includes the frequency $f_{new}$ and one or more integer multiples of the frequency $f_{new}$, referred to as harmonic frequencies. For example, the clock 1300 includes, in part, the 59$^{th}$ harmonic frequency of the clock 1300, denoted as 59 $f_{new}$, having a frequency of 2419 MHz, the 60$^{th}$ harmonic frequency of the clock 1300, denoted as 60 $f_{new}$, having a frequency of 2460 MHz, the 61$^{st}$ harmonic frequency of the clock 1300, denoted as 61 $f_{new}$, having a frequency of 2501 MHz, and the 62$^{nd}$ harmonic frequency of the clock 1300, denoted as 62 $f_{new}$, having a frequency of 2542 MHz. However, this example is not limiting, those skilled in the relevant art(s) will recognize that the clock 1300 may include a greater or a lesser number of harmonic frequencies without departing from the spirit and scope of the present invention.

One or more of the harmonic frequencies of the clock 1300 may be embedded within one or more communication channels of the multi-channel communication signal during sampling, resampling, and/or decoding.

Figure 13B:
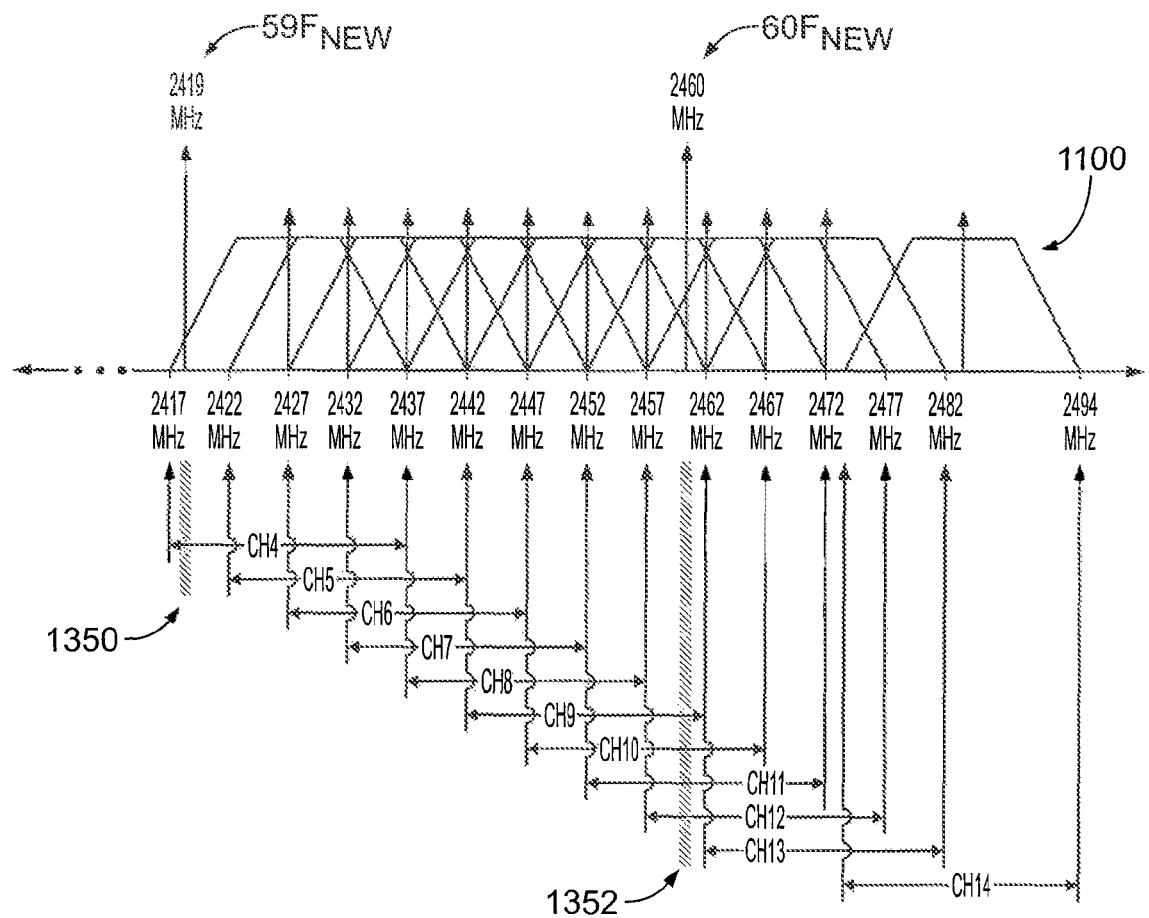
FIG. 13B illustrates an effect of spurious clocking signals resulting from the clocking signal used in the physical layer interface (PHY) according to another exemplary embodiment of the present invention.

FIG. 13B illustrates an effect of spurious clocking signals resulting from the clocking signal used in the physical layer interface (PHY) according to another exemplary embodiment of the present invention. The sampling of, re-sampling of, and/or decoding of the multi-channel communication signal 1100 may embed the 59$^{th}$ harmonic frequency of the clock 1300, denoted as 59 $f_{new}$, having a frequency of 2419 MHz into the multi-channel communication signal 1100. As shown by at risk region 1350, the 59$^{th}$ harmonic frequency of the clock 1300 is embedded the communication channels CH1 through CH4. As a result, the 59$^{th}$ harmonic frequency may substantially degrade performance of the PHY when recovering the one or more spatial streams from communication channels CH1 through CH4. Likewise, sampling of, re-sampling of, and/or decoding of the multi-channel communication signal 1100 may embed the 60$^{th}$ harmonic frequency of the clock 1300, denoted as 60 $f_{new}$, having a frequency of 2460 MHz into the multi-channel communication signal 1100. As shown by at risk region 1352, the 60$^{th}$ harmonic frequency of the clock 1300 is embedded the communication channels CH9 through CH12. As a result, the 60$^{th}$ harmonic frequency may substantially degrade performance of the PHY when recovering the one or more spatial streams from communication channels CH9 through CH12. Therefore, the 59$^{th}$ harmonic frequency of the clock 1300 and/or the 60$^{th}$ harmonic frequency of the clock 1300 may substantially degrade performance of the PHY when recovering the one or more spatial streams from communication channels CH1 through CH4 and/or CH9 through CH12. The 59$^{th}$ harmonic frequency of the clock 1300 and/or the 60$^{th}$ harmonic frequency of the clock 1300 do not degrade performance of the PHY when recovering the one or more spatial streams from communication channels CH5 through CH8 and/or CH13 through CH14.

From the discussion of FIGS. 11A and 4C above, the 61$^{st}$ harmonic frequency of the PHY clock 1102 and/or the 62$^{nd}$ harmonic frequency of the PHY clock 1102 may substantially degrade performance of the PHY when recovering the one or more spatial streams from communication channels CH5 through CH8 and/or CH13 through CH14. Whereas, the 59$^{th}$ harmonic frequency of the clock 1300 and/or the 60$^{th}$ harmonic frequency of the clock 1300 may substantially degrade performance of the PHY when recovering the one or more spatial streams from communication channels CH1 through CH4 and/or CH9 through CH12.

FIG. 14A is a table 1400 illustrating at-risk channels in a multi-channel communication signal transmitted and/or received in a 20 MHz mode according to IEEE 802.11n™ standard according to an exemplary embodiment of the present invention. From the discussion above, a multi-channel communication signal, such as the multi-channel communication signal 1100 includes multiple communication channels, denoted as CH1 through CH14. In this exemplary embodiment, the multi-channel communication signal is transmitted and/or received in the 20 MHz mode according to IEEE 802.11n™ standard.

The operating frequency $f_{new}$ of the new PHY clock 1254 may be chosen such that the one or more harmonic frequencies of the new PHY clock 1254 do not degrade performance of the PHY when recovering the one or more spatial streams from a corresponding communication channel. Those channels at risk for degradation of performance caused by the one or more harmonics of the new PHY clock 1254 for a corresponding operating frequency $f_{new}$ are indicated by a black square. While those channels not at risk for degradation of performance caused by the one or more harmonics of the new PHY clock 1254 for a corresponding operating frequency $f_{new}$ are indicated by a white square.

For example, a frequency of 40 MHz may be chosen for the operating frequency $f_{new}$ of the new PHY clock 1254 to avoid degradation of performance of the PHY when recovering the one or more spatial streams from communication channels CH5 through CH8 and CH13 through CH14 as discussed in FIG. 11A through FIG. 11C. As another example, a frequency of 41 MHz may be chosen for the operating frequency $f_{new}$ of the new PHY clock 1254 to avoid degradation of performance of the PHY when recovering the one or more spatial streams from communication channels CH1 through CH4 and CH9 through CH12 as discussed in FIG. 8A through 8B. Similarly, a frequency of 42 MHz may be chosen for the operating frequency $f_{new}$ of the new PHY clock 1254 to avoid degradation of performance of the PHY when recovering the one or more spatial streams from communication channels CH4 through CH7 and CH13 through CH14.

The operating frequencies $f_{new}$ of the new PHY clock 1254, denoted as 40 MHz through 50 MHz, as shown in table 1400 are for demonstrative purposes only. Those skilled in the relevant art(s) will recognize that the new PHY clock 1254 may operate at frequencies $f_{new}$ that are greater than 50 MHz or less than 40 MHz in accordance with the teachings herein without departing from the spirit and scope of the present invention.

FIG. 14B is a table 1450 illustrating at-risk channels in a multi-channel communication signal transmitted and/or received in a 40 MHz mode according to IEEE 802.11n™ standard according to an exemplary embodiment of the present invention. From the discussion above, a multi-channel communication signal, such as the multi-channel communication signal 1100 includes multiple communication channels, denoted as CH1 through CH14. In this exemplary embodiment, the multi-channel communication signal is transmitted and/or received in the 40 MHz mode according to IEEE 802.11n™ standard.

The operating frequency $f_{new}$ of the new PHY clock 1254 may be chosen such that the one or more harmonic frequencies of the new PHY clock 1254 do not degrade performance of the PHY when recovering the one or more spatial streams from a corresponding communication channel. Those channels at risk for degradation of performance caused by the one or more harmonics of the new PHY clock 1254 for a corresponding operating frequency $f_{new}$ are indicated by a black square. While those channels not at risk for degradation of performance caused by the one or more harmonics of the new PHY clock 1254 for a corresponding operating frequency $f_{new}$ are indicated by a white square.

For example, a frequency of 80 MHz may be chosen for the operating frequency $f_{new}$ of the new PHY clock 1254 to avoid degradation of performance of the PHY when recovering the one or more spatial streams from communication channels CH3 through CH10. As another example, a frequency of 82 MHz may be chosen for the operating frequency $f_{new}$ of the new PHY clock 1254 to avoid degradation of performance of the PHY when recovering the one or more spatial streams from communication channels CH1 through CH6 and CH14

The operating frequencies $f_{new}$ of the new PHY clock 1254, denoted as 80 MHz through 100 MHz, as shown in table 1450 are for demonstrative purposes only. Those skilled in the relevant art(s) will recognize that the new PHY clock 1254 may operate at frequencies $f_{new}$ that are greater than 100 MHz or less than 80 MHz in accordance with the teachings herein without departing from the spirit and scope of the present invention.

Figure 15A:
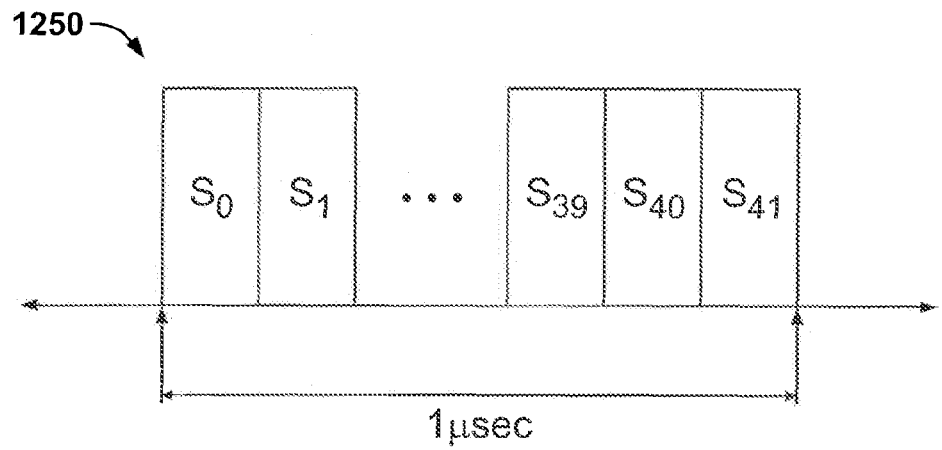
FIG. 15A illustrates a time domain representation of an oversampled digital communication signal according to another exemplary embodiment of the present invention.

FIG. 15A illustrates a time domain representation of an oversampled digital communication signal according to another exemplary embodiment of the present invention. From the discussion above, the resampler module resamples the number of samples of each oversampled digital communication signal 1250.1 through 1250.N from $f_{new}$ samples per second to produce each resampled digital communication signal 1252.1 through 1252.N having $f_{nom}$ samples per second.

For demonstrative purposes only, a corresponding oversampled digital communication signal 1250.1 through 1250.N may include 41 samples per microsecond, denoted as $S_0$ through $S_{41}$, corresponding to a sampling rate of 41 MHz. However, this example is not limiting, those skilled in the relevant art(s) will recognize that the corresponding oversampled digital communication signal 1250.1 through 1250.N may include any suitable number of samples without departing from the spirit and scope of the present invention. For example, those skilled in the relevant art(s) the oversampled digital communication signal may be produced using a sampling rate of 42 MHz, corresponding to 42 samples per microsecond, differently in accordance with the teachings herein without departing from the spirit and scope of the present invention.

Figure 15B:
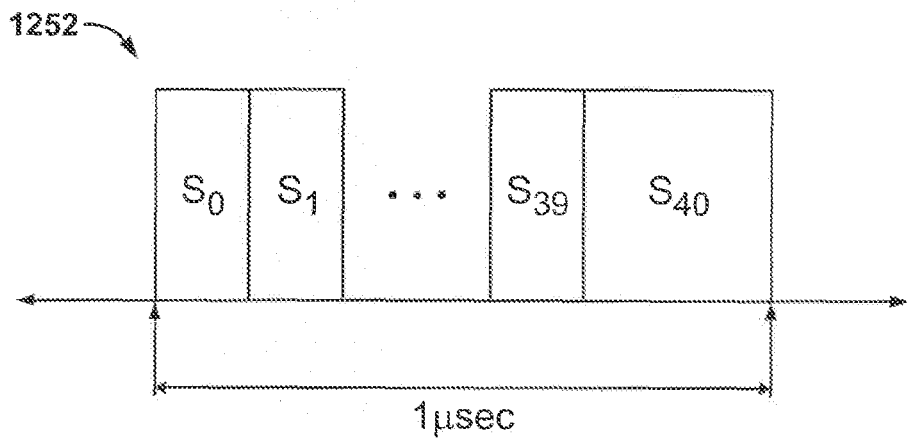
FIG. 15B illustrates a resampled digital communication signal according to an exemplary embodiment of the present invention.

FIG. 15B illustrates a resampled digital communication signal according to an exemplary embodiment of the present invention. The resampler module 1204 resamples the corresponding oversampled digital communication signal 1250.1 through 1250.N, to produce a corresponding resampled digital communication signal 1252.1 through 1252.N, wherein the corresponding resampled digital communication signal 1252.1 through 1252.N includes $f_{nom}$ samples per second. For demonstrative purposes only, the corresponding resampled digital communication signal 1252.1 through 1252.N includes 40 samples per microsecond, denoted as $S_0$ through $S_{40}$, corresponding to a sampling rate of 40 MHz. However, this example is not limiting, those skilled in the relevant art(s) will recognize that the corresponding resampled digital communication signal 1252.1 through 1252.N may include any suitable number of samples without departing from the spirit and scope of the present invention.

The corresponding resampled digital communication signal 1252.1 through 1252.N may not be equally distributed among the samples $S_0$ through $S_{40}$. For example, during the first state of a gated PHY clock, such as the gated PHY clock 1256, the resampler module 1204 produces sample $S_0$ of the corresponding resampled digital communication signal 1252.1 through 1252.N based on sample $S_0$ of the corresponding oversampled digital communication signal 1250.1 through 1250.N. Likewise, the resampler module 1204 produces sample $S_1$ of the corresponding resampled digital communication signal 1252.1 through 1252.N based on sample $S_1$ of the corresponding oversampled digital communication signal 1250.1 through 1250.N. Similarly, the resampler module 1204 produces sample $S_{39}$ of the corresponding resampled digital communication signal 1252.1 through 1252.N based on sample $S_{39}$ of the corresponding oversampled digital communication signal 1250.1 through 1250.N. The resampler module 1204 produces sample $S_{40}$ of the corresponding resampled digital communication signal 1252.1 through 1252.N based on sample $S_{40}$ of the corresponding oversampled digital communication signal 1250.1 through 1250.N. During the second state of the gated PHY clock, the resampler module 1204 holds sample $S_{40}$ of the corresponding oversampled digital communication signal 1250.1 through 1250.N for a duration of sample $S_{41}$ of the corresponding oversampled digital communication signal 1250.1 through 1250.N to produce the corresponding resampled digital communication signal 1252.1 through 1252.N having 40 samples per microsecond corresponding to a rate of 40 MHz. However, this example is not limiting, those skilled in the relevant art(s) will recognize that the resampler module 1204 may hold any sample of the corresponding resampled digital communication signal 1252.1 through 1252.N without departing from the spirit and scope of the present invention. For example, the resampler module 1204 may hold sample $S_0$ of the corresponding resampled digital communication signal 1252.1 through 1252.N for a duration of sample $S_1$ of the corresponding oversampled digital communication signal 1250.1 through 1250.N to produce the corresponding resampled digital communication signal 1252.1 through 1252.N having 40 samples per microsecond. Those skilled in the relevant art(s) will recognize that the resampler module 1204 may hold more than one sample of the corresponding resampled digital communication signal 1252.1 through 1252.N to reduce the corresponding resampled digital communication signal 1252.1 through 1252.N. For example, the corresponding oversampled digital communication signal 1250.1 through 1250.N may be sampled at a sampling rate of 42 MHz, corresponding to 42 samples per microsecond, denoted as $S_0$ through $S_{42}$. In this example, the resampler module 1204 may hold $S_{40}$ of the corresponding resampled digital communication signal 1252.1 through 1252.N for a duration of sample $S_{41}$ of the corresponding oversampled digital communication signal 1250.1 through 1250.N and a duration of sample $S_{42}$ of the corresponding oversampled digital communication signal 1250.1 through 1250.N or the resampler module 1204 may hold $S_0$ of the corresponding resampled digital communication signal 1252.1 through 1252.N for a duration of sample $S_1$ of the corresponding oversampled digital communication signal 1250.1 through 1250.N and hold $S_{40}$ of the corresponding resampled digital communication signal 1252.1 through 1252.N for a duration of sample $S4_1$ of the corresponding oversampled digital communication signal 1250.1 through 1250.N to produce a corresponding the corresponding resampled digital communication signal 1252.1 through 1252.N having 40 samples per microsecond.

Figure 16:
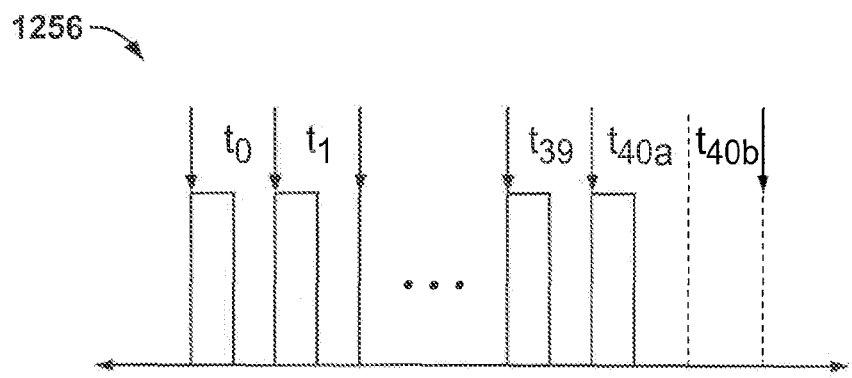
FIG. 16 illustrates a gated physical layer interface (PHY) clock signal according to an exemplary embodiment of the present invention.

FIG. 16 illustrates a gated PHY clock signal according to an exemplary embodiment of the present invention. The gated PHY clock signal 1256 includes time intervals $t_0$ through $t_{40}$. The time intervals to through $t_{40A}$ represent a first state of the gated PHY clock signal and the time interval $t_{40B}$ represents a second state of the gated PHY clock signal. A time interval $t_0$ corresponds to the duration of sample $S_0$ of the corresponding resampled digital communication signal 1252.1 through 1252.N. Likewise, a time interval $t_1$ corresponds to the duration of sample $S_1$ of the corresponding resampled digital communication signal 1252.1 through 1252.N. Similarly, a time interval $t_{39}$ corresponds to the duration of sample $S_{39}$ of the corresponding resampled digital communication signal 1252.1 through 1252.N. A time interval $t_{40a}$ corresponds to the duration of sample $S_{40}$ of the corresponding oversampled digital communication signal 1250.1 through 1250.N. From the discussion above, the resampler module 1204 may hold sample $S_{40}$ of the corresponding resampled digital communication signal 1252.1 through 1252.N for the duration of sample $S_{41}$ of the corresponding oversampled digital communication signal 1250.1 through 1250.N. A time interval $t_{40b}$ corresponds to the duration of holding sample $S_{40}$ of the corresponding resampled digital communication signal 1252.1 through 1252.N. During the time interval $t_{40b}$, the gated PHY clock signal 1256 disables the processing of the resampled digital communication signals 1252.1 through 1252.N by the baseband processing module 1004. In an exemplary embodiment, the gated PHY clock signal 1256 remains at a logic low level throughout the time interval $t_{40b}$.

Figure 17A:
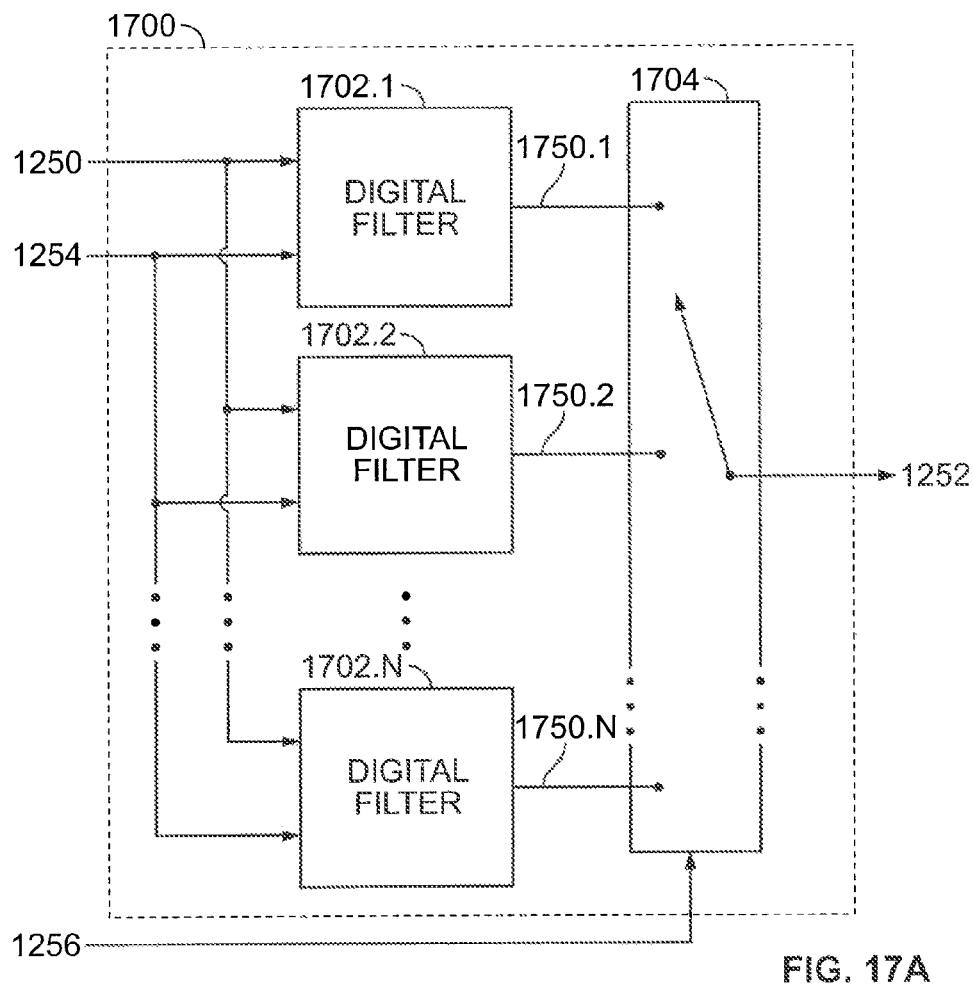
FIG. 17A illustrates a block diagram of a resampler module according to an exemplary embodiment of the present invention.

FIG. 17A illustrates a block diagram of a resampler module according to an exemplary embodiment of the present invention. A resampler module 1700 resamples the corresponding oversampled digital communication signal 1250.1 through 1250.N, wherein the corresponding oversampled digital communication signal 1250.1 through 1250.N includes $f_{new}$ samples, to produce the corresponding resampled digital communication signal 1252.1 through 1252.N, wherein the corresponding resampled digital communication signal 1252.1 through 1252.N includes $f_{nom}$ samples per second. The resampler module 1700 may represent an exemplary embodiment of the resampler module 1204.

As shown in FIG. 17A, the resampler module 1700 includes digital filters 1702.1 through 1702.N and a switch module 1704. The digital filters 1702.1 through 1702.N produce a corresponding filtered oversampled digital communication signal 1750.1 through 1750.N by filtering the corresponding oversampled digital communication signal 1250.1 through 1250.N according to a mathematical function using the new PHY clock 1254 operating at a frequency of $f_{new}$. For example, the digital filter 1702.1 produces the filtered oversampled digital communication signal 1750.1 by filtering the corresponding oversampled digital communication signal 1250.1 through 1250.N. In an exemplary embodiment, the digital filters 1702.1 through 1702.N produce the corresponding filtered oversampled digital communication signal 1750.1 through 1750.N in a parallel manner. In other word, the digital filters 1702.1 through 1702.N produce their respective corresponding filtered oversampled digital communication signal 1750.1 through 1750.N for each clock cycle. The digital filters 1702.1 through 1702.N may be implemented as, but not limited to, a finite impulse response (FIR) filter, an infinite impulse response (IIR) filter, or a recursive filter to provide some examples. The digital filters 1702.1 through 1702.N may be implemented using a similar architecture as each other or a different architecture from each other.

The switch module 1704 produces the corresponding resampled digital communication signal 1252.1 through 1252.N based on the filtered oversampled digital communication signal 1750.1 through 1750.N according to the gated PHY clock 1256. During the first state of the gated PHY clock, the switch module 1704 selects the filtered oversampled digital communication signal 1750.1 for a duration of a sample of the filtered oversampled digital communication signal 1750.1 through 1750.N. The switch module 1704 then selects the filtered oversampled digital communication signal 1750.2 for the duration of a sample of the filtered oversampled digital communication signal 1750.1 through 1750.N. The switch module 1704 selects the filtered oversampled digital communication signal 1750.3 through 1750.N in a similar manner. During the second state of the gated PHY clock, the switch module 1704 holds the filtered oversampled digital communication signal 1750.N for duration of a sample of the filtered oversampled digital communication signal 1750.1 through 1750.N to reduce a number of samples of the corresponding resampled digital communication signal 1252.1 through 1252.N from $f_{new}$ samples per second to $f_{nom}$ samples per second.

Figure 17B:
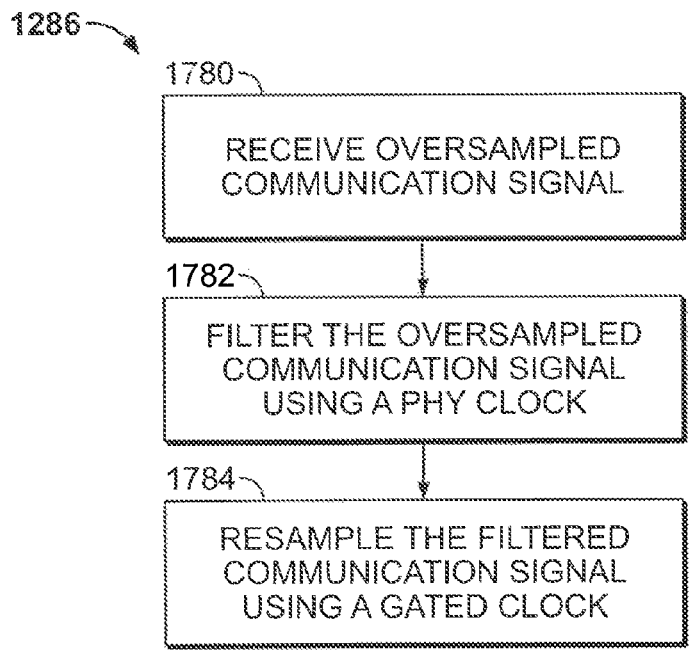
FIG. 17B is a flowchart of exemplary operational steps of a resampler module according to an aspect of the present invention.

FIG. 17B is a flowchart of exemplary operational steps of a resampler module according to an aspect of the present invention. The invention is not limited to this operational description. Rather, it will be apparent to persons skilled in the relevant art(s) from the teachings herein that other operational control flows are within the scope and spirit of the present invention. FIG. 17B further defines the step 1288 as previously discussed in FIG. 12B. The following discussion describes the steps in FIG. 17B.

At step 1780, an oversampled communication signal, such as one of the oversampled digital communication signals 1250.1 through 1250.N to provide an example, is received. The oversampled communication signal includes $f_{new}$ samples per second. In an exemplary embodiment, the oversampled communication signal includes 41 samples per microsecond.

At step 1782, the oversampled communication from step 1780 is filtered. One or more digital filters, such as the digital filters 1702.1 through 1702.N to provide an example, filter the oversampled communication from step 1780 according to one or more mathematical functions using a PHY clock, such as the new PHY clock 1254 to provide an example, operating at a frequency of $f_{new}$.

At step 1784, the filtered communication signal from step 1782 is resampled using a gated PHY clock, such as the gated PHY clock 1256. From the discussion above, a gating function produces the gated PHY clock having a first state whereby step 1784 selects a first group of samples from the filtered communication signal from step 1782 and a second state whereby step 1784 holds one or more samples from the filtered communication signal from step 1782 to reduced a number of samples in the filtered communication signal from step 1782 from $f_{new}$ samples per second to $f_{nom}$ samples per second.

More specifically, step 1784 selects a $f_{nom}$ number of samples per microsecond for the filtered communication signal from step 1782 during the first state of the gated PHY clock. During the second state of the gated PHY clock, step 1784 holds the $f_{nom}$ sample for the $f_{new}$ sample of the filtered communication signal from step 1782 to reduce a number of samples from $f_{new}$ samples per second to $f_{nom}$ samples per second. For example, the filtered communication signal from step 1782 may be reduced from 41 samples per microsecond to 40 samples per microsecond by selecting 40 samples from the filtered communication signal from step 1782 and holding sample 40 of the resampled communication signal for a duration of one sample of the filtered communication signal from step 1782.

Figure 18:
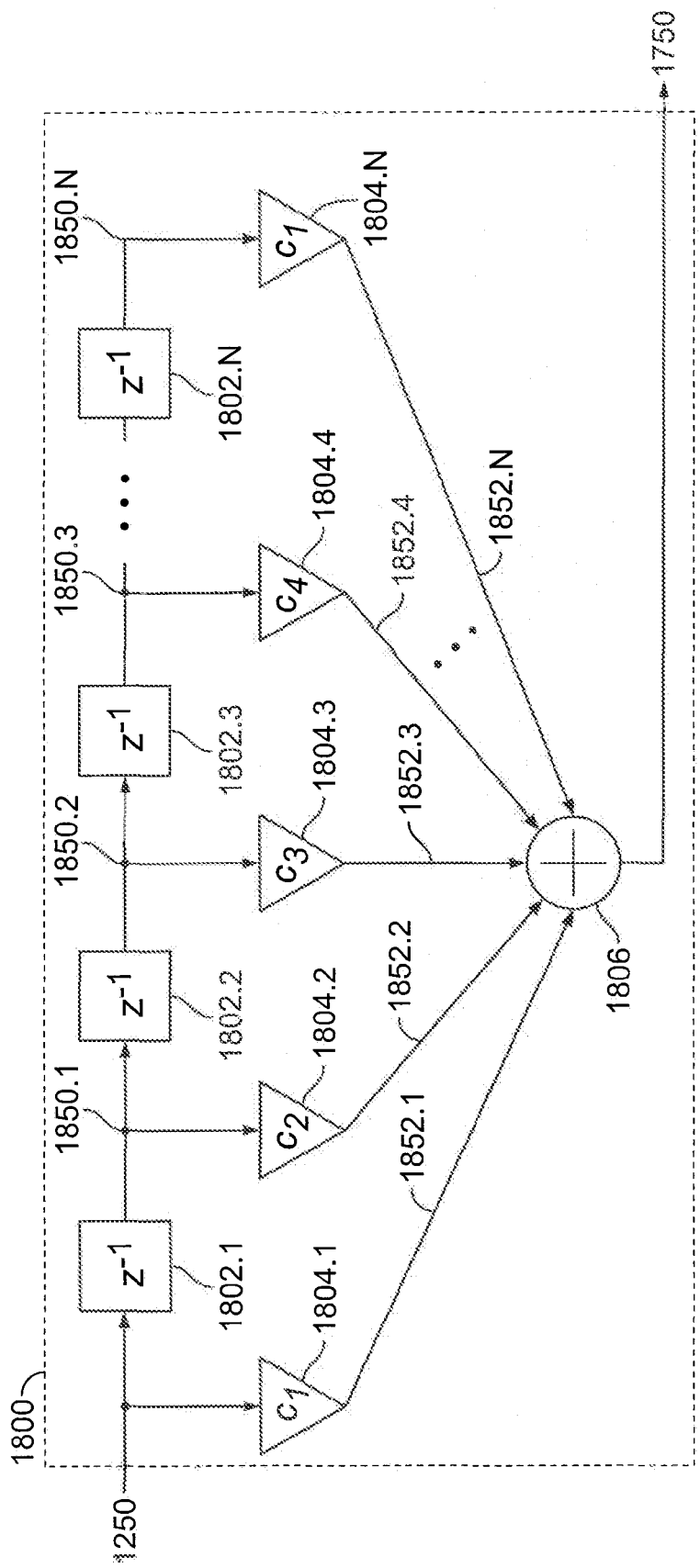
FIG. 18 illustrates a digital filter according to an exemplary embodiment of the present invention.

FIG. 18 illustrates a digital filter according to an exemplary embodiment of the present invention. The digital filter 1800 represents an exemplary embodiment of at least one of the digital filters 1702.1 through 1702.N as shown in FIG. 17A or the digital filter 1802 as shown in FIG. 18. The digital filter 1800 includes a delay module 1802.1 through 1802.N, a scalar module 1804.1 through 1804.N, and a summing module 1806.

The delay modules 1802.1 through 1802.N delay the corresponding oversampled digital communication signal 1250.1 through 1250.N and/or a corresponding delayed oversampled digital communication signals 1850.1 through 1850.N by one or more samples. For example, the delay module 1802.1 delays the corresponding oversampled digital communication signal 1250.1 through 1250.N by one sample to produce the delayed oversampled digital communication signal 1850.1. Likewise, the delay module 1802.2 delays the delayed oversampled digital communication signal 1850.1 by one sample to produce the delayed oversampled digital communication signal 1850.2. The quantity N may also be referred to as the number of filter taps or taps in the digital filter 1800.

The scalar module 1804.1 through 1804.N scales the corresponding oversampled digital communication signal 1250.1 through 1250.N and/or the delayed oversampled digital communication signals 1850.1 through 1850.N based upon a corresponding filter coefficient $c_1$ through $c_i$ to produce weighted oversampled digital communication signals 1852.1 through 1852.N. The filter coefficients $c_1$ through $c_i$ adaptively adjust an impulse response of the digital filter 1800 by updating through, for example, a least-squares algorithm, such as the widely known Least Mean Squared (LMS), Recursive Least Squares (RLS), Minimum Mean Squared Error (MMSE) algorithms or any suitable equivalent algorithm.

The summing module 1806 combines the weighted oversampled digital communication signals 1852.1 through 1852.N to produce corresponding filtered oversampled digital communication signals 1750.1 through 1750.N.

Figure 19A:
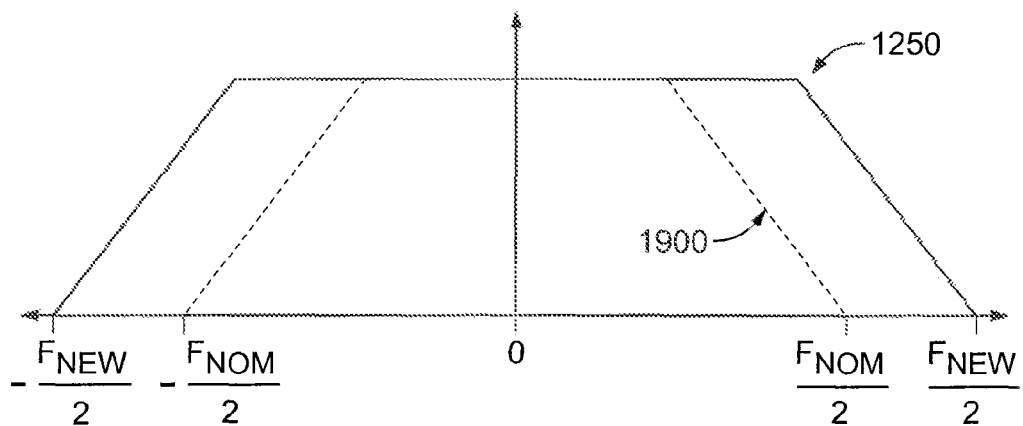
FIG. 19A illustrates a frequency domain representation of an oversampled communication channel of the multi-channel communication signal according to an exemplary embodiment of the present invention.

FIG. 19A illustrates a frequency domain representation of an oversampled communication channel of the multi-channel communication signal according to an exemplary embodiment of the present invention. The ADC 1902 samples the downconverted communication signals 252.1 through 252.N at the frequency of $f_{new}$ to produce the oversampled digital communication signals 1250.1 through 1250.N. The downconverted communication signals 252.1 through 252.N may include an information signal 1900. The information signal 1900 may represent an exemplary embodiment of the information signals 150.1 through 150.K and/or the information signals 160.1 through 160.K. As shown in FIG. 19A, the information signal 1900 includes a signal bandwidth of $f_{nom}$ MHz corresponding $$\text{from } -\frac{f_{nom}}{2} \text{ MHz to } \frac{f_{nom}}{2} \text{ MHz.}$$

Likewise, the oversampled digital communication signals 1250.1 through 1250.N includes an oversampled representation of the information signal 1900 sampled at the frequency of $f_{new}$ corresponding to a signal bandwidth $$\text{from } -\frac{f_{new}}{2} \text{ MHz to } \frac{f_{new}}{2} \text{ MHz.}$$

Figure 19B:
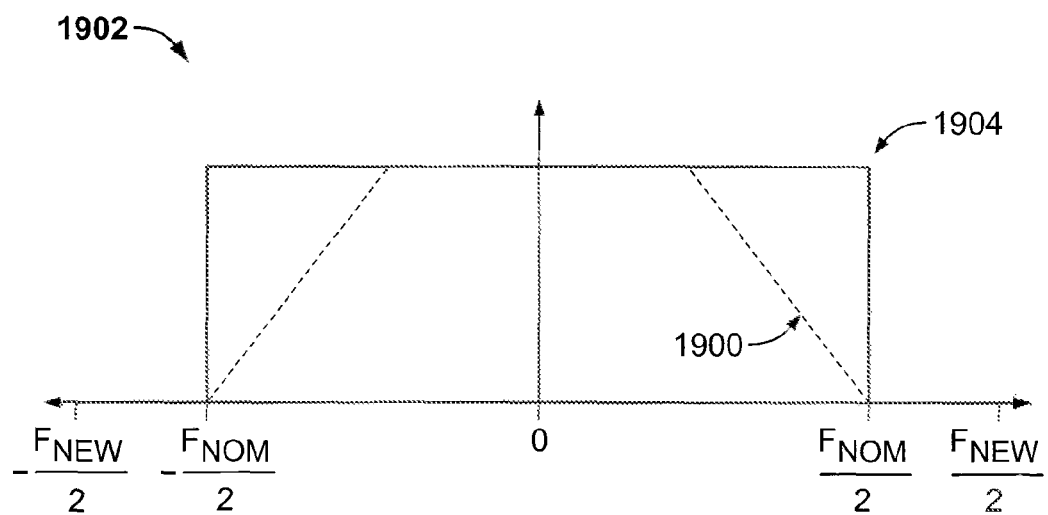
FIG. 19B illustrates a frequency domain representation of the digital filter according to an exemplary embodiment of the present invention.

FIG. 19B illustrates a frequency domain representation 1902 of the digital filter according to an exemplary embodiment of the present invention. From the discussion above, the digital filter, such as the digital filter 1800 to provide an example, produces the corresponding filtered oversampled digital communication signal 1750.1 through 1750.N by filtering the corresponding oversampled digital communication signal 1250.1 through 1250.N according to a mathematical function.

As shown in FIG. 19B, the mathematical function of the digital filter may be chosen such that a frequency response 1904 of the digital filter approximates an ideal filter. In other words, spectral components of information signal 1900 having a frequency less than $$\frac{f_{nom}}{2}$$

pass through the digital filter substantially unattenuated while spectral components of the information signal 1900 having a frequency greater than $$\frac{f_{nom}}{2}$$

pass through the digital filter substantially attenuated.

However, implementation of the digital filter according to the frequency response 1904 may require a large number of filter taps. For example, implementation of the digital filter according to the frequency response 1904 may require in excess of fifty taps.

Figure 20A:
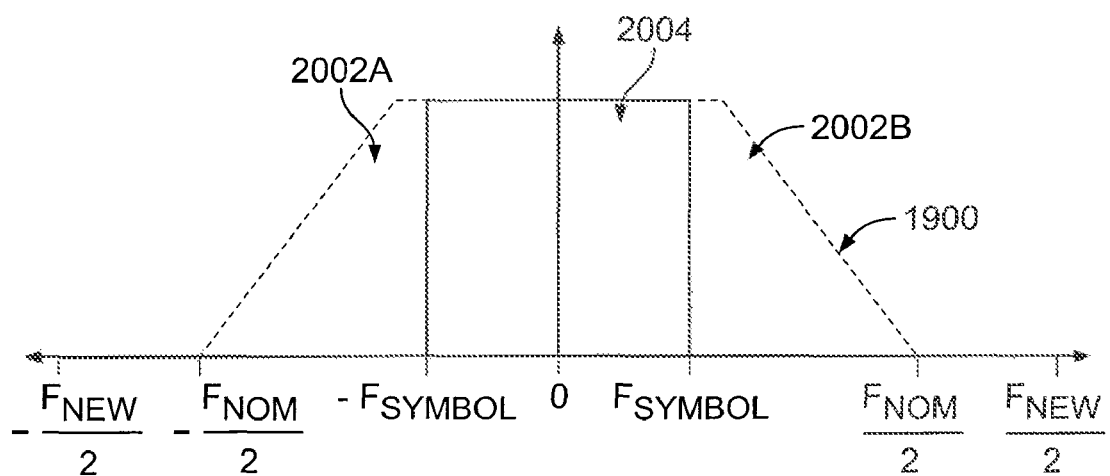
FIG. 20A illustrates a frequency domain representation of an information signal according to an exemplary embodiment of the present invention.

FIG. 20A illustrates a frequency domain representation of an information signal according to an exemplary embodiment of the present invention. The known single stream communications standard and/or the known multiple stream communications standard may provide for the use of a guard interval or guard band. The guard band is an unused portion of the frequency spectrum between one or more communication channels, for the purpose of preventing interference. For example, the IEEE 802.11n™ standard provides for a default guard band of 800 nanoseconds corresponding to 1.25 MHz and a reduced guard band of 400 nanoseconds corresponding to 625 kHz under certain conditions.

As shown in FIG. 20A, the information signal 1900 may include a first guard band 2002A, a second guard band 2002B, and information content 2004. The information content 2004 represents information content of the information signal 1900, such as information content of the information signals 150.1 through 150.K and/or information content of the information signals 160.1 through 160.K. The first guard band 2002A represents unused portion of the frequency spectrum from a lower bound of the information signal 1900 to a lower bound of the information content 2004, denoted as $-f_{symbol}$. Likewise, the second guard band 2002B represents unused portion of the frequency spectrum from an upper bound of the information signal 1900 to an upper bound of the information content 2004, denoted as $f_{symbol}$.

Figure 20B:
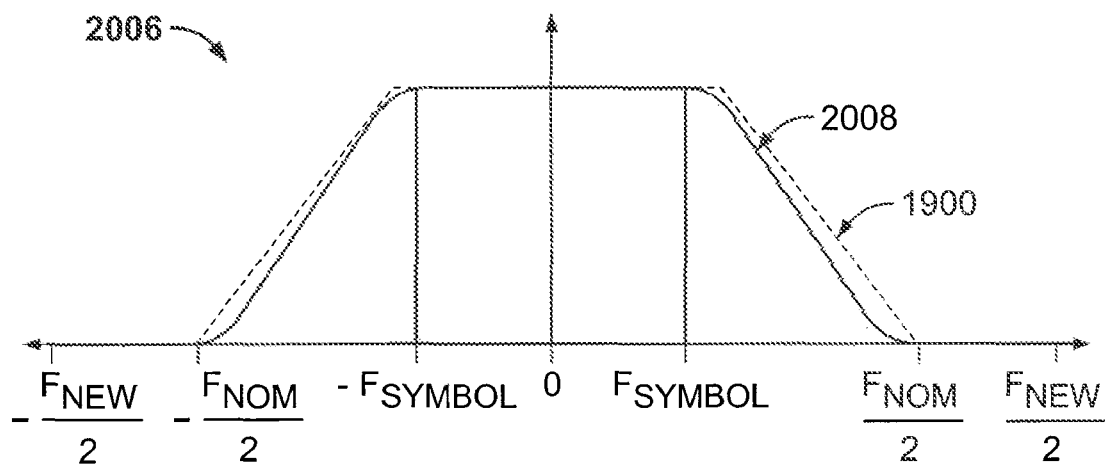
FIG. 20B illustrates a frequency domain representation of the digital filter according to another exemplary embodiment of the present invention.

FIG. 20B illustrates a frequency domain representation 2006 of the digital filter according to another exemplary embodiment of the present invention. From the discussion above, the digital filter, such as the digital filter 1800 to provide an example, produces the corresponding filtered oversampled digital communication signal 1750.1 through 1750.N by filtering the corresponding oversampled digital communication signal 1250.1 through 1250.N according to a mathematical function.

As shown in FIG. 20B, the mathematical function of the digital filter may be chosen such that a frequency response 2008 of the digital filter approximates a non-ideal filter. In an exemplary embodiment, the frequency response 2008 approximates a raised-cosine frequency response. However, this example is not limiting, those skilled in the relevant art(s) will recognize that the frequency response 2008 may approximate any suitable well known non-ideal filter without departing from the spirit and scope of the present invention. The frequency response 2008 may be chosen such that the spectral components of information signal 1900 having a frequency less than $$\frac{f_{nom}}{2}$$

pass through the digital filter substantially unattenuated, some spectral components of the information signal 1900 having a frequency greater than $f_{symbol}$ but less than $$\frac{f_{nom}}{2}$$

pass through the digital filter attenuated, and spectral components of the information signal 1900 having a frequency less than $f_{symbol}$ pass through the digital filter substantially attenuated.

Implementation of the digital filter according to the frequency response 2008 reduces the number of filter taps in comparison to implementing the digital filter according to the frequency response 1904. For example, implementation of the digital filter according to the frequency response 2008 using a raised cosine implementation reduces the number of filter taps to thirteen.

Figure 21A:
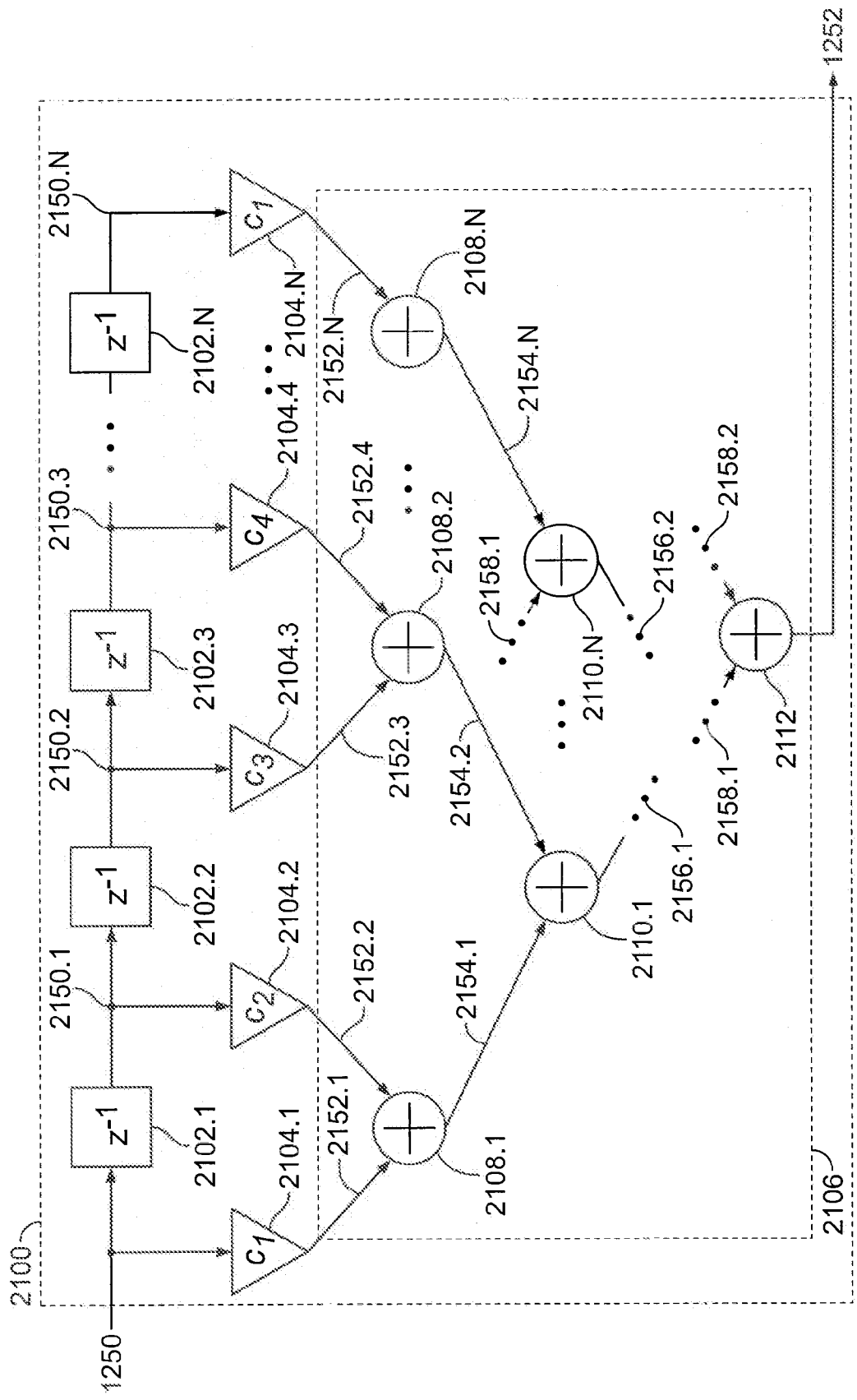
FIG. 21A illustrates a block diagram of a resampler module according to another exemplary embodiment of the present invention.

FIG. 21A illustrates a block diagram of a resampler module according to another exemplary embodiment of the present invention. A resampler module 2100 resamples the corresponding oversampled digital communication signal 1250.1 through 1250.N, wherein the corresponding oversampled digital communication signal 1250.1 through 1250.N includes $f_{new}$ samples, to produce the corresponding resampled digital communication signal 1252.1 through 1252.N, wherein the corresponding resampled digital communication signal 1252.1 through 1252.N includes $f_{nom}$ samples per second. The resampler module 2100 may represent an exemplary embodiment of the resampler module 1700.

The resampler module 2100 includes a delay module 2102.1 through 2102.N, a scalar module 2104.1 through 2104.N, and a summation network 2106. The delay modules 2102.1 through 2102.N delay the corresponding oversampled digital communication signal 1250.1 through 1250.N and/or a corresponding delayed oversampled digital communication signals 2150.1 through 2150.N by one or more samples. For example, the delay module 2102.1 delays the corresponding oversampled digital communication signal 1250.1 through 1250.N by one sample to produce the delayed oversampled digital communication signal 2150.1. Likewise, the delay module 2102.2 delays the delayed oversampled digital communication signal 2150.1 by one sample to produce the delayed oversampled digital communication signal 2150.2. The quantity N may also be referred to as the number of filter taps or taps in the digital filter 1800. The number of taps may be chosen as discussed in FIG. 19A through FIG. 20B.

The scalar module 2104.1 through 2104.N scales the corresponding oversampled digital communication signal 1250.1 through 1250.N and/or the delayed oversampled digital communication signals 2150.1 through 2150.N based upon a corresponding filter coefficient $c_1$ through $c_i$ to produce weighted oversampled digital communication signals 2152.1 through 2152.N. The filter coefficients $c_1$ through $c_i$ adaptively adjust an impulse response of the resampler module 2100 by updating through, for example, a least-squares algorithm, such as the widely known Least Mean Squared (LMS), Recursive Least Squares (RLS), Minimum Mean Squared Error (MMSE) algorithms or any suitable equivalent algorithm.

During the first state of a gated PHY clock, such as the gated PHY clock 1256, the resampler module 2100 selects a corresponding set of filter coefficients $c_1$ through $c_i$ for every sample of the corresponding oversampled digital communication signal 1250.1 through 1250.N. For example, the resampler module 2100 selects a first set of filter coefficients $c_1$ through $c_i$ for a first sample of the corresponding oversampled digital communication signal 1250.1 through 1250.N. Likewise, the resampler module 2100 selects a second set of filter coefficients $c_1$ through $c_i$ for a second sample of the corresponding oversampled digital communication signal 1250.1 through 1250.N. Similarly, the resampler module 2100 selects a $f_{nom}$ set of filter coefficients $c_1$ through $c_i$ for a $f_{nom}$ sample of the corresponding oversampled digital communication signal 1250.1 through 1250.N. During the second state of the gated PHY clock, the resampler module 2100 holds the $f_{nom}$ set of filter coefficients $c_1$ through $c_i$ the $f_{new}$ sample to reduce a number of samples of the corresponding resampled digital communication signal 1252.1 through 1252.N from $f_{new}$ samples per second to $f_{nom}$ samples per second.

Referring back to FIG. 21A, the summation network 2106 combines the weighted oversampled digital communication signals 2152.1 through 2152.N to produce the corresponding resampled digital communication signal 1252.1 through 1252.N. The summation network 2106 includes summing modules 2108.1 through 2108.N, summing modules 2110.1 through 2110.N and a summing module 2112.

The summing modules 2108.1 through 2108.N combine a first corresponding weighted oversampled digital communication signal 2152.1 through 2152.N with a second corresponding weighted oversampled digital communication signal 2152.1 through 2152.N to produce weighted oversampled digital communication signal 2154.1 through 2154.N. For example, the summing module 2108.1 combines the weighted oversampled digital communication signal 2152.1 with the weighted oversampled digital communication signal 2152.2 to produce the weighted oversampled digital communication signal 2154.1.

Likewise, the summing modules 2110.1 through 2110.N combine a first corresponding weighted oversampled digital communication signal 2154.1 through 2154.N with a second corresponding weighted oversampled digital communication signal 2154.1 through 2154.N to produce weighted oversampled digital communication signal 2156.1 through 2156.N. For example, the summing module 2110.1 combines the weighted oversampled digital communication signal 2154.1 with the weighted oversampled digital communication signal 2154.2 to produce the weighted oversampled digital communication signal 2156.1. This process of combination continues until a summing module 2112 combines a weighted oversampled digital communication signal 2158.1 with a weighted oversampled digital communication signal 2158.2 to produce the corresponding resampled digital communication signal 1252.1 through 1252.N

However, this example is not limiting, those skilled in the relevant art(s) will recognize that the summation network 2106 may be implemented using any suitable means to combine the weighted oversampled digital communication signals 2152.1 through 2152.N without departing from the spirit and scope of the present invention.

FIG. 21B is a flowchart of exemplary operational steps of a resampler module according to an aspect of the present invention. The invention is not limited to this operational description. Rather, it will be apparent to persons skilled in the relevant art(s) from the teachings herein that other operational control flows are within the scope and spirit of the present invention. FIG. 21B further defines the step 1288 as previously discussed in FIG. 19B. The following discussion describes the steps in FIG. 21B.

At step 2180, an oversampled communication signal, such as a corresponding oversampled digital communication signal 1250.1 through 1250.N to provide an example, is received. The oversampled communication signal includes $f_{new}$ samples per second. In an exemplary embodiment, the oversampled communication signal includes 41 samples per microsecond.

At step 2182, the oversampled communication from step 2180 is filtered. One or more digital filters, such as the digital filter disclosed in FIG. 21A to provide example, filter the oversampled communication from step 2180 according to one or more mathematical functions using a PHY clock, such as the new PHY clock 1254 to provide an example, operating at a frequency of $f_{new}$.

At step 2184, filter coefficients $c_1$ through $c_i$ for the filtered communication signal from step 2182 are updated based on a gated PHY clock, such as the gated PHY clock 1256. More specifically, during a first state of the gated PHY clock, step 2184 selects a corresponding set of filter coefficients $c_1$ through $c_i$ for every sample of the filtered communication signal from step 2182. For example, step 2184 selects a first set of filter coefficients $c_1$ through $c_i$ for a first sample of the filtered communication signal from step 2182. Likewise, step 2184 selects a second set of filter coefficients $c_1$ through $c_i$ for a second sample of the filtered communication signal from step 2182. Similarly, step 2184 selects a $f_{nom}$ set of filter coefficients $c_1$ through $c_i$ for a $f_{nom}$ sample the filtered communication signal from step 2182. During the second state of the gated PHY clock, step 2184 holds the $f_{nom}$ set of filter coefficients $c_1$ through $c_i$ for the $f_{new}$ sample of the filtered communication signal from step 2182 to reduce a number of samples from $f_{new}$ samples per second to $f_{nom}$ samples per second.

Frequency Estimation Based on Gain

A MIMO communications link exploits the redundancy of multiple transmission paths provided by the additional antennas located at either or both the transmitter and the receiver. FIG. 22 indicates a typical MIMO system 2200.

In FIG. 22, a data stream is input to a transmitter 2210, from which signals are output and fed for transmission to M antennas, for example, antennas 2220A through 2220M. As a design objective, the transmitted signals may be related in some fashion to each other such that the resulting correlation may be exploited by a MIMO receiver. A MIMO receiver 2240 utilizes the redundancy provided by the receipt of multiple versions of the transmitted signals via N antennas, for example, antennas 2230A through 2230N. By application of processing techniques within the MIMO receiver 2240, the MIMO receiver 2240 capitalizes on these multiple received versions of the transmitted signals to enhance the quality of the communications link. Moreover, the inherent spatial diversity expands the capacity of the system. Accordingly, the quality and capacity of the wireless link are improved, albeit at the expense of multiple antennae and additional receiver circuitry.

Figure 23:
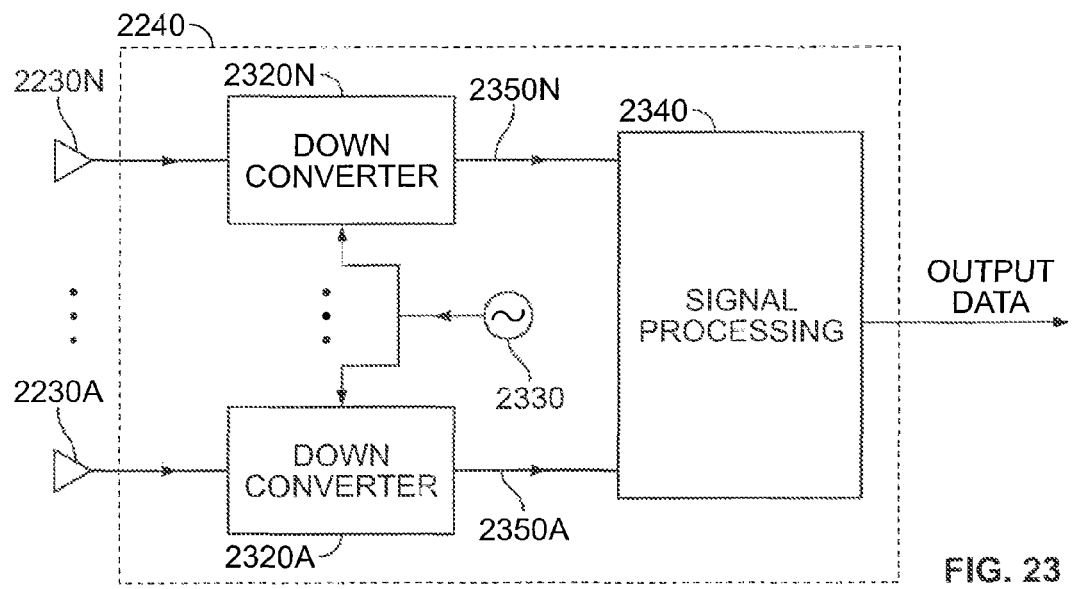
FIG. 23 is a block diagram of a MIMO receiver in the conventional communications system of FIG. 22.

FIG. 23 is a diagram of a typical MIMO receiver 2240. Each received signal from the antennas 2230A through 2230N is input into a separate downconverter 2320A through 2320N, each of which outputs a downconverted baseband signal (2350A through 2350N) that is fed into a signal processor 2340. As an alternative, the downconverters 2320A through 2320N may output an intermediate frequency (IF) signal, that is then subsequently downconverted to a baseband signal (2350A through 2350N) by an additional stage of downconversion. The output of a local oscillator 2330 is split and fed to each of the downconverters 2320A through 2320N. The signal processor 2340 combines the information provided by each of the downconverted signals 2350A through 2350N. By capitalizing on the extra measurements resulting from the multiple downconverted signals 2350A through 2350N, the signal processor 2340 outputs an improved reconstruction of the original transmitted data signal.

Ideally, the frequency of the local oscillator 2330 would be locked or synchronized to the carrier frequency of the transmitter 2210. Such locking would avoid the frequency offset errors generated while processing the received signal, and that result in degradation and loss of fidelity in the wireless link. However, in many applications, direct synchronization between the transmitter 2210 and the receiver 2240 is not feasible. Instead, the receiver local oscillator is tuned to the frequency of the incoming signal, often by processing a known preamble of training symbols in the received signal.

Figure 24:
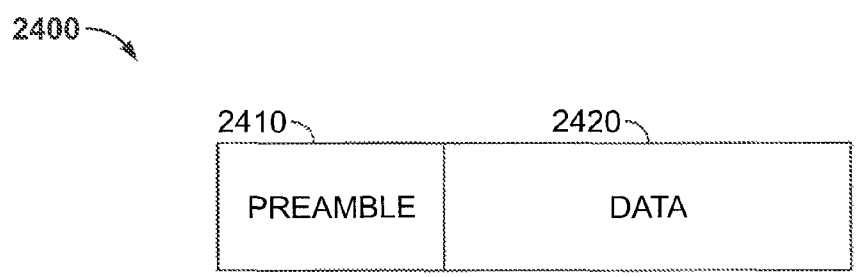
FIG. 24 shows a preamble in a data signal used in the communications system of FIG. 22.

FIG. 24 illustrates a typical preamble 2410 in a received signal 2400 used in the MIMO system 2200. The preamble 2410 is composed of a series of symbols that are known a priori to the receiver. The preamble 2410 is followed by a data stream 2420. By processing the preamble 2410, the receiver can reduce the frequency offset errors associated with relative drift between the receiver and transmitter oscillators, as well as frequency differences associated with Doppler shifts when either or both of the transmitters and receivers are in relative motion to each other.

Figure 25:
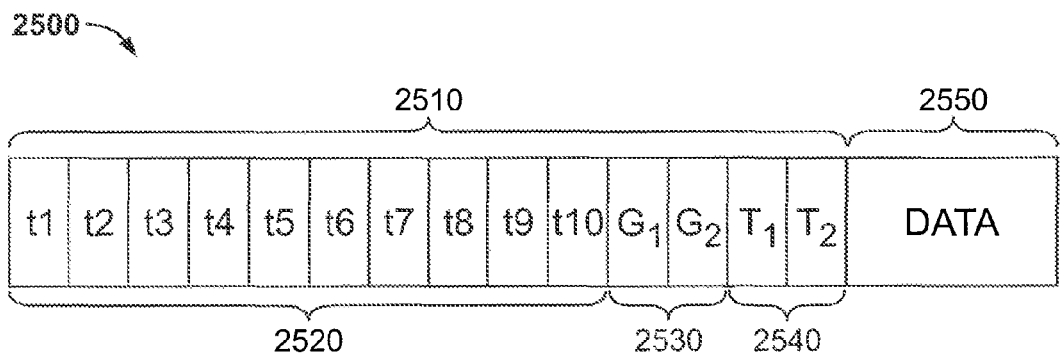
FIG. 25 shows a preamble for an Institute of Electrical and Electronics Engineers (IEEE) 802.11 compliant signal.

As an example of such a preamble, FIG. 25 illustrates a signal 2500 having a preamble 2510 that complies with the set of Institute of Electrical and Electronics Engineers (IEEE) 802.11 protocols. In the United States, the 802.11 protocols operate in the frequency ranges 2.4 GHz to 2.5 GHz, and 5.15 GHz to 5.875 GHz. As in the generic case shown above in FIG. 24, the preamble 2510 is followed by a data stream 2550.

For the 802.11 protocol, the preamble 2510 is broken into two parts. The first symbol sequence 2520 is a short training sequence consisting of ten symbols of 800 nanoseconds (ns) each, for a total of 8 microseconds (μs). The purpose for this sequence is to provide a coarse tuning of the local oscillator in the receiver. A second symbol sequence 2540 is a training sequence consisting of two longer symbols, each of 3.2 μs duration. In its traditional application, this second symbol sequence 2540 is used for channel estimation. Separating the two symbol sequences is a guard band 2530.

Figure 26:
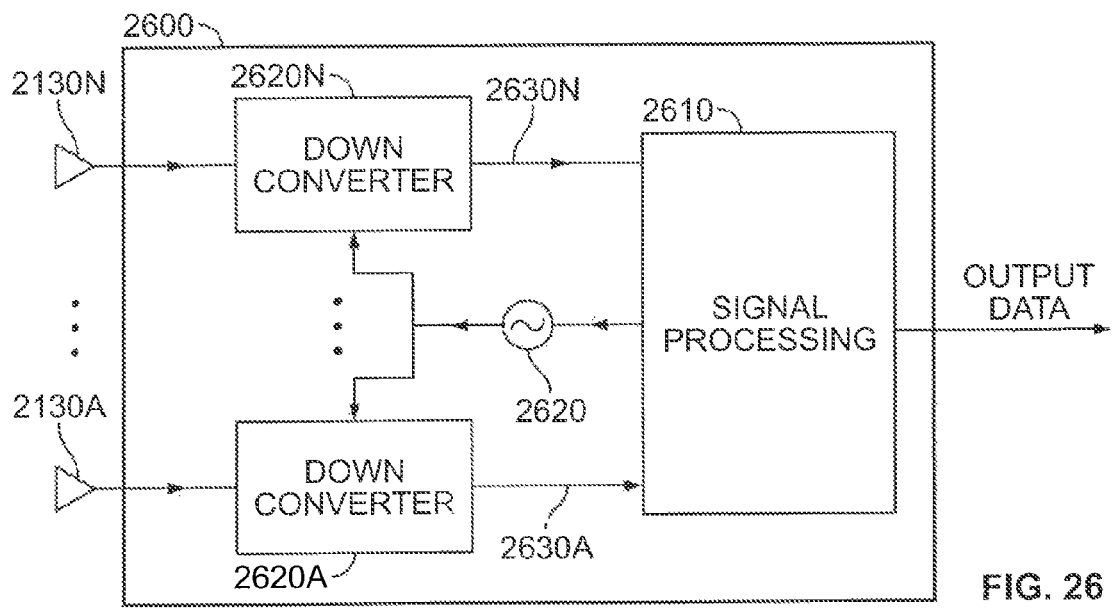
FIG. 26 is a block diagram of a frequency estimation system in a MIMO receiver, according to an embodiment of the invention.

FIG. 26 illustrates an embodiment of the current invention where the redundancy associated with the multiple transmission paths is exploited to reduce the errors in frequency estimation in the receiver. Each received signal path from the antennas 2130A through 2130N is input into a separate downconverter 2620A through 2620N, each of which outputs a downconverted signal (2630A through 2630N) that is fed into a signal processor 2610. Also, as before, the output of a local oscillator 2620 is split and fed to each of the downconverters 2620A through 2620N.

In the embodiment of FIG. 26, the signal processor 2610 determines the correlation of the downconverted signals 2630A through 2630N. Based on the phase of that correlation, a frequency correction signal is generated and used to adjust the frequency of the local oscillator 2620. In an alternate embodiment, instead of using the correlation to generate a frequency correction signal to adjust the frequency of the receiver local oscillator 2620, the correlation can be used to provide a correction signal to directly adjust the baseband signals to compensate for the estimated frequency offset.

Figure 27:
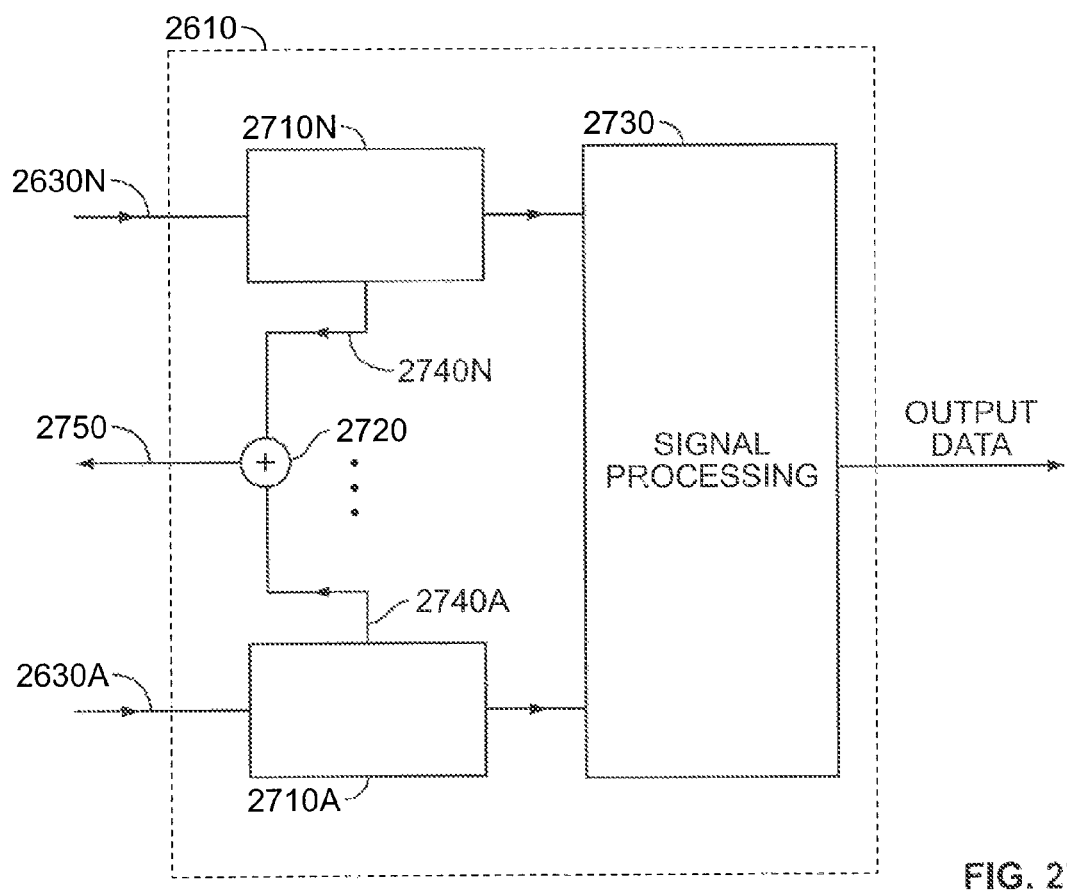
FIG. 27 is a block diagram of a preamble correlator in a frequency estimation system in a MIMO receiver as illustrated in FIG. 26.

FIG. 27 is an illustration of a further embodiment of the current invention. In FIG. 27, the signal processor 22710 capitalizes on data communication protocols in which a known preamble precedes the data stream. In such circumstances, for each downconverted signal 22730A through 22730N, preamble correlators 2710A through 2710N respond to the known preamble symbol sequence and each generate a correlator output signal 2740A through 2740N in response to the preamble symbol sequence. Each correlator output signal 2740A through 2740N represents an estimate of the frequency offset, based on the information available from its corresponding downconverted signal 22730A through 22730N. To achieve an improved estimate of frequency offset, these correlator output signals 2740A through 2740N are combined using a weighting function within the combiner module 2720.

The output of the combiner module 2720 is a frequency adjustment signal 2750 that is fed as an input to the local oscillator 2330. As noted earlier, in an alternate embodiment, instead of using the correlation to generate a frequency correction signal to adjust the frequency of the receiver local oscillator 22720, the correlation can be used to provide a correction signal to directly adjust the baseband signals for the estimated frequency offset. In either approach, the weighting function within the combiner module 2720 provides greater weight to those received signals that have a greater perceived reliability. For example, in one particular embodiment, the amplitude of each of the received signals is a basis for weighting since a stronger signal is typically more reliable.

Alternatively, in implementations where received signals are amplified to an appropriate level prior to an analog-to-digital converter (ADC), the weighting function may be based on the gain used for each signal. In other embodiments, the weighting algorithm in the combiner module 2720 could be based on a logarithmic scale of amplitude (i.e. dB), instead of a linear scale of amplitude. Other means of weighting the respective signals are also within the scope of the present invention, e.g. use of the largest signal only, use of other signal characteristics, such as time delay, that may shed light on the reliability of the particular signal.

In one particular embodiment, if the signals are large, equal weighting is used. In such a case, the received signals are not noise limited, but rather limited by the effects of quantization noise. In such cases, the ADC bit widths are a primary source of unreliability. Under such circumstances, equal weighting is a suitable choice of weighting function.

Figure 28:
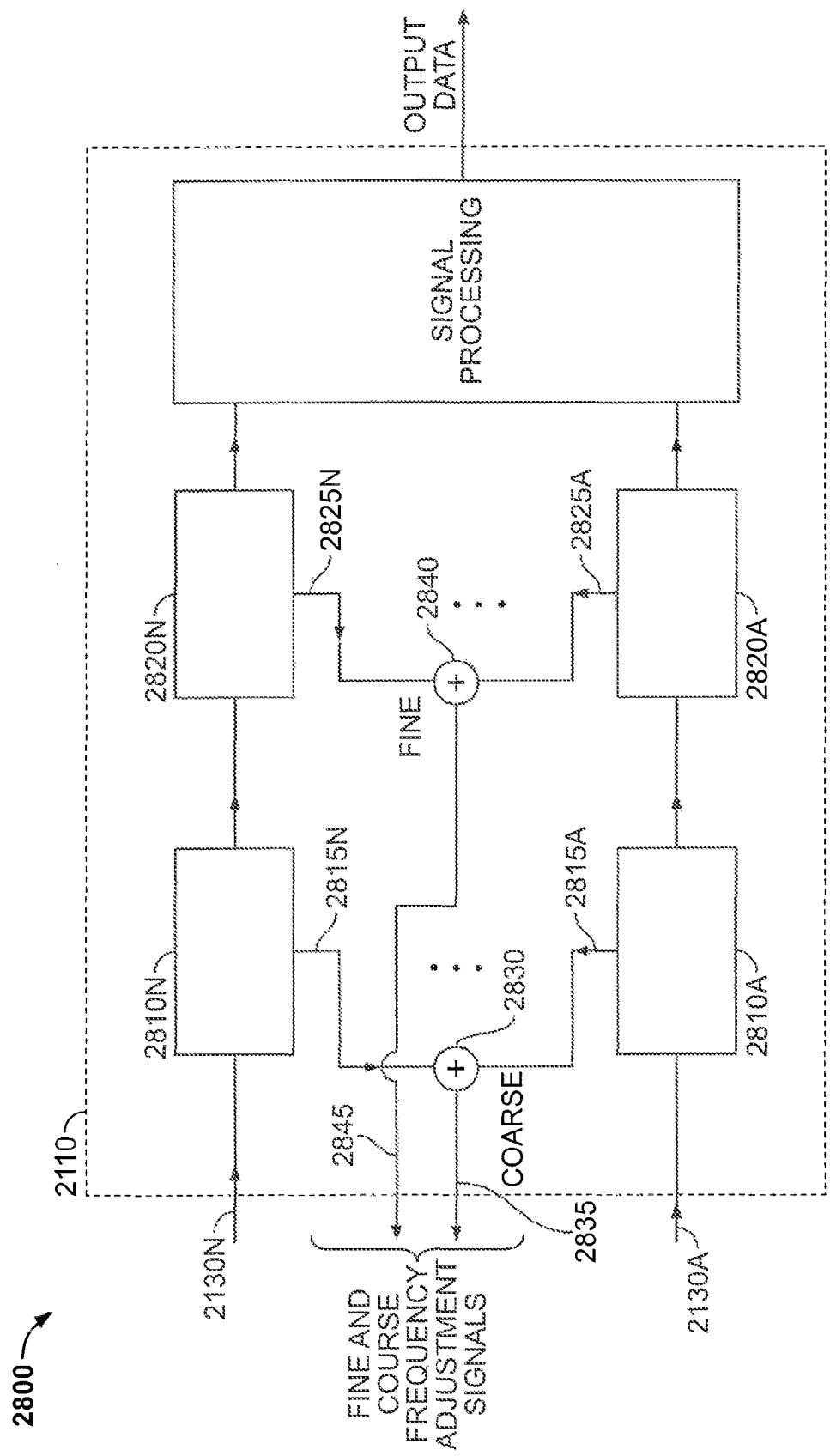
FIG. 28 is a block diagram of a correlator for a 2-part preamble in a frequency estimation system in a MIMO receiver, according to another embodiment of the present invention.

FIG. 28 illustrates yet another embodiment of the current invention. In FIG. 28, the frequency estimator is a two-part process that is matched to a two-part known preamble in the protocol used by the transmitted signals. Such a protocol is used by the set of IEEE 802.11 protocols, as illustrated earlier in FIG. 25. In the embodiment 2800, for each downconverted signal 2830A through 2830N, preamble correlators 2810A through 2810N respond to the first symbol sequence in the preamble and each generate a coarse frequency offset estimate signal 2815A through 2815N in response to this sequence of short symbols.

The coarse frequency offset estimate signals 2815A through 2815N are weighted in a coarse combiner module 2830. The output of the coarse combiner module 2830 is a coarse frequency adjustment signal 2835 that is fed as an input to the local oscillator 2330. Next, preamble correlators 2820A through 2820N respond to the second symbol sequence in the preamble and each generate a fine frequency offset estimate signal 2825A through 2825N in response to this sequence of long symbols. These fine frequency offset estimate signals 2825A through 2825N are weighted in a fine combiner module 2840. The output of the fine combiner module 2840 is a fine frequency adjustment signal 2845 that is fed as an input to the local oscillator 2330.

In an alternate embodiment of the current invention, the coarse frequency adjustment signal 2835 and the fine frequency adjustment signal 2845 are used to directly adjust the baseband signals for the estimated coarse and fine frequency offset.

As noted earlier, greater weight in the combiner modules is given to those received signals that have a greater perceived reliability. Accordingly, weighting algorithms such as linear amplitude, logarithmic amplitude, largest amplitude are within the scope of this invention. Equivalently, in implementations where received signals are amplified to an appropriate level before an analog-to-digital converter (ADC), the weighting may be based on the gain used for each signal.

In communication protocols that are absent a preamble containing a pre-defined symbol sequence or its equivalent, user-defined extensions to such protocols can be employed to provide the basis for frequency estimation opportunities in a MIMO communications receiver environment. Such user-defined extensions to these protocols are within the scope of the present invention.

Figure 29:
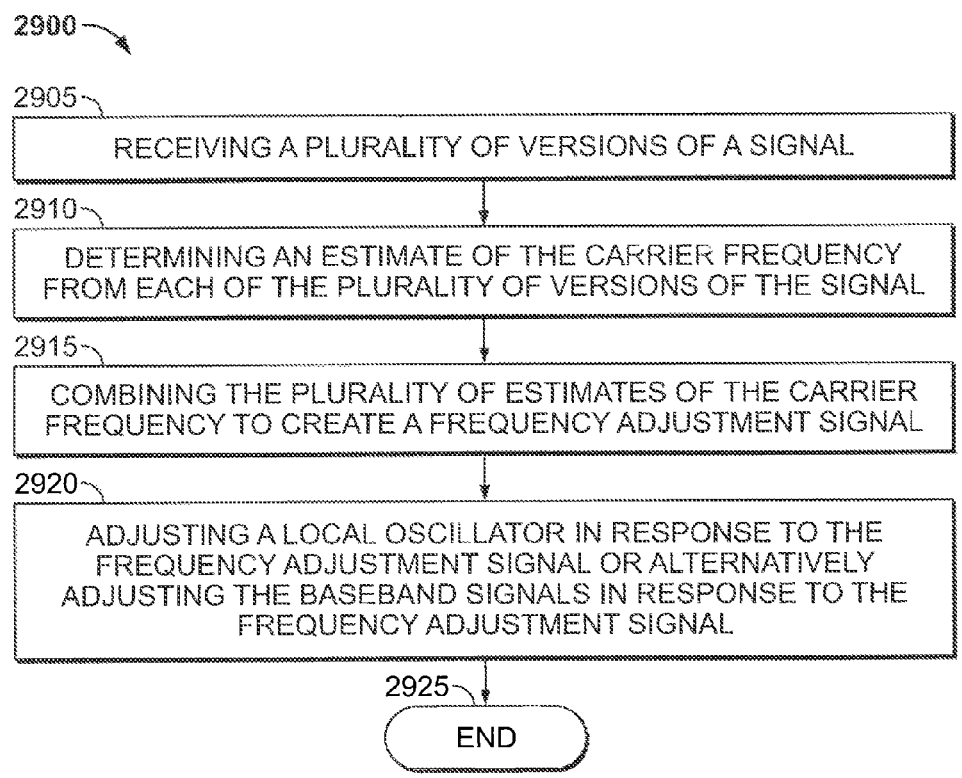
FIG. 29 is a flowchart of an exemplary method of generating a frequency estimate in a MIMO environment in accordance with the embodiment of FIG. 27.

FIG. 29 illustrates a flowchart 2900 that further describes frequency estimation in a MIMO receiver system. Multiple versions of a signal are examined in the MIMO receiver and a correlation is used to provide an improved frequency estimate over that which could be achieved by examination of a single signal.

In step 2905, a plurality of versions of a signal are received. In step 2910, an estimate of the carrier frequency from each of the plurality of versions of the signal is determined. In step 2915, the plurality of estimates of the carrier frequency are correlated to create a frequency adjustment signal. In step 2920, a local oscillator is adjusted in response to the frequency adjustment signal. In an alternate embodiment, the baseband signals are adjusted directly in response to the frequency adjustment signal.

Figure 30:
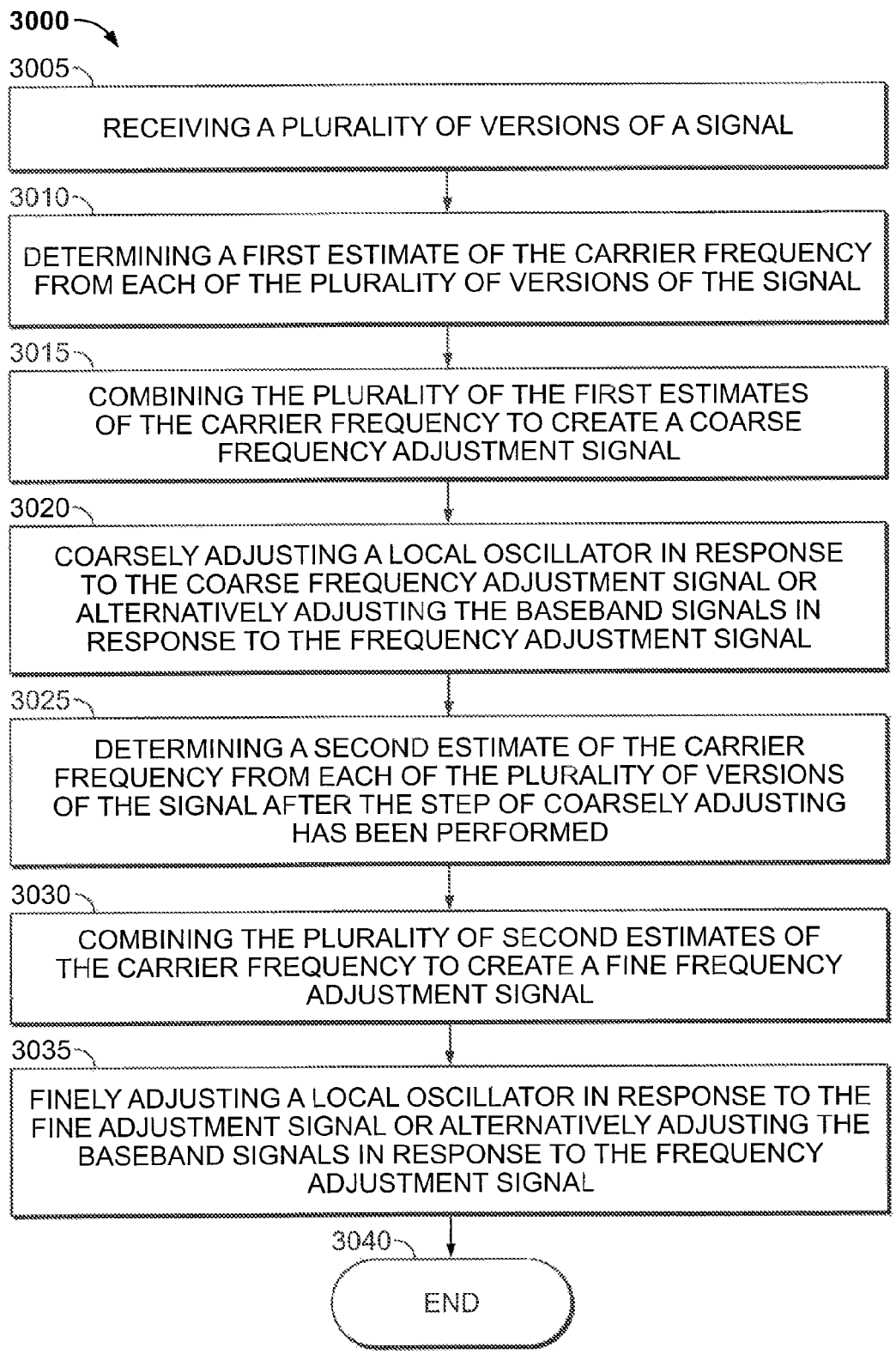
FIG. 30 is a flowchart of an exemplary method of generating a frequency estimate in a MIMO environment in accordance with the embodiment of FIG. 28, where the signal provides a 2-part preamble.

FIG. 30 illustrates a flowchart 3000 that further describes frequency estimation in a MIMO receiver system, where a coarse frequency adjustment and a fine frequency adjustment signal are determined. In step 3005, a plurality of versions of a signal are received. In step 3010, a first estimate of the carrier frequency from each of the plurality of versions of the signal is determined. In step 3015, the plurality of the first estimates of the carrier frequency are correlated to create a coarse frequency adjustment signal. In step 3020, a local oscillator is coarsely adjusted in response to the coarse frequency adjustment signal. In an alternate embodiment, the baseband signals are adjusted directly in response to the coarse frequency adjustment signal.

In step 3025, a second estimate of the carrier frequency from each of the plurality of versions of the signal is determined, after step 3020 has been performed. In step 3030, the plurality of the second estimates of the carrier frequency are correlated to create a fine frequency adjustment signal. In step 3035, a local oscillator is finely adjusted in response to the finely frequency adjustment signal. In an alternate embodiment, the baseband signals are adjusted directly in response to the fine frequency adjustment signal.

Finally, it should be noted that the invention described herein is not limited to 802.11 MIMO applications. As noted above, any MIMO applications wherein the particular communications protocol provides an opportunity to correlate the receipt of multiple copies of portions of the same transmitted signal to generate a frequency estimate are covered. Also, as noted earlier, all types of weighting algorithms are covered, including amplitude weighting (including linear, logarithmic, largest signal), and use of other signal characteristics that shed light on the reliability of that signal, e.g. time delay and the like.

CONCLUSION

While various embodiments of the present invention have been described above, it should be understood that they have been presented by way of example and not limitation. It will be apparent to one skilled in the pertinent art that various changes in form and detail can be made therein without departing from the spirit and scope of the invention. Therefore, the present invention should only be defined in accordance with the following claims and their equivalents.

What is claimed is:

1. A communications receiver configured to receive a plurality of communication signals from a plurality of antennas, wherein the plurality of communication signals represents a single stream communication signal or a multiple stream communication signal, comprising:
   a multiple stream carrier detection module configured to determine if the plurality of communication signals received from the plurality of antennas includes the multiple stream communication signal and to provide a multiple stream indication signal indicative thereof;
   a single stream carrier detection module configured to determine if the plurality of communication signals received from the plurality of antennas includes the single stream communication signal and to provide a single stream indication signal indicative thereof;
   a switch module configured to select a corresponding one of the plurality of communication signals based on one or more signal metrics of one or more of the plurality of communication signals;
   a multiple stream decoder module configured to decode the plurality of communication signals when the multiple stream indication signal indicates that the multiple stream communication signal is present; and
   a single stream decoder module configured to decode the corresponding one of the plurality of communication signals when the single stream indication signal indicates that the single stream communication signal is present.

2. The communications receiver of claim 1, further comprising:
   a radio receiver configured to downconvert the plurality of communication signals to produce a plurality of downconverted communication signals,
   wherein the multiple stream carrier detection module is further configured to determine if the plurality of downconverted communication signals includes the multiple stream communication signal, and
   wherein the single stream carrier detection module is further configured to determine if the plurality of downconverted communication signals includes the single stream communication signal.

3. The communications receiver of claim 2, wherein the radio receiver is further configured to calculate the one or more signal metrics.

4. The communications receiver of claim 2, wherein the one or more signal metrics include one or more receive signal strength indicators (RSSI).

5. The communications receiver of claim 1, wherein the one or more signal metrics include relative power levels of the plurality of communication signals.

6. The communications receiver of claim 5, wherein the switch module is configured to select the corresponding one of the one or more communication signals having a largest power level among the plurality of communication signals.

7. The communications receiver of claim 1, further comprising:
a single stream selection signal generator configured to calculate the one or more signal metrics based on the plurality of communication signals.

8. The communications receiver of claim 1, wherein the single stream communication signal is encoded according to at least one of:
an Institute of Electrical and Electronics Engineers (IEEE) 802.11a™ standard;
an IEEE 802.11b™ standard; and
an IEEE 802.11g™ standard.

9. The communications receiver of claim 1, wherein the multiple stream communication signal is encoded according an Institute of Electrical and Electronics Engineers (IEEE) 802.11n™ standard.

10. The communications receiver of claim 1, further comprising:
an analog to digital converter (ADC) configured to convert the plurality of communication signals from an analog representation to a digital representation to produce a plurality of digital communication signals,
wherein the multiple stream carrier detection module is further configured to determine if the plurality of digital communication signals includes the multiple stream communication signal, and
wherein the single stream carrier detection module is further configured to determine if the plurality of digital communication signals includes the single stream communication signal.

11. The communications receiver of claim 10, further comprising:
a receive filter configured to filter the plurality of digital communication signals to produce a plurality of filtered communication signals,
wherein the multiple stream carrier detection module is further configured to determine if the plurality of filtered communication signals includes the multiple stream communication signal, and
wherein the single stream carrier detection module is further configured to determine if the plurality of filtered communication signals includes the single stream communication signal.

12. The communications receiver of claim 1, further comprising:
a gain control module configured to measure a power level of each of the plurality of communication signals,
wherein the switch module is configured to select the corresponding one of the plurality of communication signals based on the power level of each of the plurality of communication signals.

13. The communications receiver of claim 12, wherein the switch module is configured to select the corresponding one of the plurality of communication signals having a largest power level from among the plurality of communication signals.

14. The communications receiver of claim 1, wherein the single stream decoder module is further configured to decode the corresponding one of the plurality of communication signals according to at least one of:
an Institute of Electrical and Electronics Engineers (IEEE) 802.11a™ standard;
an IEEE 802.11b™ standard; and
an IEEE 802.11g™ standard.

15. The communications receiver of claim 1, wherein the multiple stream decoder module is further configured to decode the plurality of communication signals according an Institute of Electrical and Electronics Engineers (IEEE) 802.11n™ standard.

16. The communications receiver of claim 1, further comprising:
a stream classifier module configured to receive the multiple stream indication signal and the single stream indication signal.

17. The communications receiver of claim 16, wherein the multiple stream decoder module is further configured to decode the plurality of communication signals when the stream classifier module indicates that the multiple stream communication signal is present, and
wherein the single stream decoder module is further configured to decode the corresponding one of the plurality of communication signals when the stream classifier module indicates that the single stream communication signal is present.

18. The communications receiver of claim 17, wherein the stream classifier module is configured to indicate that the multiple stream communication signal is present when the single stream carrier detection module determines the plurality of communication signals includes the single stream communication signal and the multiple stream carrier detection module determines the plurality of communication signals includes the multiple stream communication signal.

19. The communications receiver of claim 17, wherein the stream classifier module is configured to indicate that the single stream communication signal is present when the single stream carrier detection module determines the plurality of communication signals includes the single stream communication signal and the multiple stream carrier detection module determines the plurality of communication signals includes the multiple stream communication signal.

20. A method to receive a plurality of communication signals from a plurality of antennas, wherein the plurality of communication signals represents a single stream communication signal or a multiple stream communication signal, comprising:
(A) determining if the plurality of communication signals received from the plurality of antennas includes the multiple stream communication signal and to provide a multiple stream indication signal indicative thereof;
(B) determining if the plurality of communication signals received from the plurality of antennas includes the single stream communication signal and to provide a single stream indication signal indicative thereof;
(C) selecting a corresponding one of the plurality of communication signals based on one or more signal metrics of one or more of the plurality of communication signals;
(D) decoding the plurality of communication signals when the multiple stream indication signal indicates that the multiple stream communication signal is present; and
(E) decoding the corresponding one of the plurality of communication signals when the single stream indication signal indicates that the single stream communication signal is present.

21. The method of claim 20, prior to step (A), further comprising:
(1) downconverting the plurality of communication signals to produce a plurality of downconverted communication signals.

22. The method of claim 21, wherein step (A) comprises:
(A)(i) determining if the plurality of downconverted communication signals includes the multiple stream communication signal.

23. The method of claim 21, wherein step (B) comprises:
(B)(i) determining if the plurality of downconverted communication signals includes the single stream communication signal.

24. The method of claim 21, wherein step (C) comprises:
(C)(i) selecting the corresponding one of the plurality of communication signals based on receive signal strength indicators (RSSI).

25. The method of claim 20, wherein step (C) comprises:
(C)(i) selecting the corresponding one of the plurality of communication signals based on relative power levels of the one or more plurality of communication signals.

26. The method of claim 25, wherein step (C)(i) further comprises:
(C)(i)(1) selecting the corresponding one of the plurality of communication signals having a largest power level among the plurality of communication signals.

27. The method of claim 20, wherein step (A) comprises:
(A)(i) determining if the plurality of communication signals includes the multiple stream communication signal according to an Institute of Electrical and Electronics Engineers (IEEE) 802.11n™ standard.

28. The method of claim 20, wherein step (B) comprises:
(B)(i) determining if the plurality of communication signals includes the single stream communication signal according to at least one of:
an Institute of Electrical and Electronics Engineers (IEEE) 802.11a™ standard;
an IEEE 802.11b™ standard; and
an IEEE 802.11g™ standard.

29. The method of claim 20, prior to step (A), further comprising:
(1) converting the plurality of communication signals from an analog representation to a digital representation to produce a plurality of digital communication signals.

30. The method of claim 29, wherein step (A) comprises:
(A)(i) determining if the plurality of digital communication signals includes the multiple stream communication signal.

31. The method of claim 29, wherein step (B) comprises:
(B)(i) determining if the plurality of digital communication signals includes the single stream communication signal.

32. The method of claim 29, after step (1) and prior to step (A), further comprising:
(2) filtering the plurality of digital communication signals to produce a plurality of filtered communication signals.

33. The method of claim 32, wherein step (A) comprises:
(A)(i) determining if the plurality of filtered communication signals includes the multiple stream communication signal.

34. The method of claim 32, wherein step (B) comprises:
(B)(i) determining if the plurality of filtered communication signals includes the single stream communication signal.

35. The method of claim 20, wherein step (D) comprises:
(D) decoding the plurality of communication signals according to an Institute of Electrical and Electronics Engineers (IEEE) 802.11n™ standard.

36. The method of claim 20, wherein step (E) comprises:
(E) decoding the plurality of communication signals according to at least one of:
an Institute of Electrical anal Electronics Engineers (IEEE) 802.11a™ standard;
an IEEE 802.11b™ standard; and
an IEEE 802.11g™ standard.

37. The method of claim 20, wherein step (D), comprises:
(D)(i) decoding the plurality of communication signals when the plurality of communication signals are classified as including the multiple stream communication signal.

38. The method of claim 20, wherein step (E), comprises:
(E)(i) decoding the plurality of communication signals when the plurality of communication signals are classified as including the single stream communication signal.

39. The method of claim 20, wherein step (D), comprises:
(D)(i) decoding the plurality of communication signals when the plurality of communication signals are classified as including the multiple stream communication signal and the single stream communication signal.

40. The method of claim 20, wherein step (E), comprises:
(E)(i) decoding the plurality of communication signals when the plurality of communication signals are classified as including the multiple stream communication signal and the single stream communication signal.

* * * * *

UNITED STATES PATENT AND TRADEMARK OFFICE
CERTIFICATE OF CORRECTION

| | | |
|---|---|---|
| PATENT NO. | : 8,194,808 B2 | Page 1 of 1 |
| APPLICATION NO. | : 12/213172 | |
| DATED | : June 5, 2012 | |
| INVENTOR(S) | : Rohit V. Gaikwad | |

It is certified that error appears in the above-identified patent and that said Letters Patent is hereby corrected as shown below:

Column 44, line 7, "according an" please replace with --according to an--.

Column 45, line 21, "the one or more plurality" please replace with --the plurality--.

Column 46, line 24, "an Institute of Electrical anal Electronics Engineers" please replace with --an Institute of Electrical and Electronics Engineers--.

Signed and Sealed this
Twenty-fourth Day of July, 2012

David J. Kappos
*Director of the United States Patent and Trademark Office*